US012626046B2

(12) United States Patent
Fujimura

(10) Patent No.: US 12,626,046 B2
(45) Date of Patent: May 12, 2026

(54) GENERATING ROUTES FOR AN INTEGRATED CIRCUIT DESIGN WITH NON-PREFERRED DIRECTION CURVILINEAR WIRING

(71) Applicant: D2S, Inc., San Jose, CA (US)

(72) Inventor: Akira Fujimura, Saratoga, CA (US)

(73) Assignee: D2S, INC., San Jose, CA (US)

( * ) Notice: Subject to any disclaimer, the term of this patent is extended or adjusted under 35 U.S.C. 154(b) by 488 days.

(21) Appl. No.: 18/110,335

(22) Filed: Feb. 15, 2023

(65) Prior Publication Data

US 2023/0274070 A1      Aug. 31, 2023

Related U.S. Application Data

(60) Provisional application No. 63/444,553, filed on Feb. 9, 2023, provisional application No. 63/337,545, filed
(Continued)

(51) Int. Cl.
*G06F 30/394* (2020.01)
*G06F 30/3947* (2020.01)
(Continued)

(52) U.S. Cl.
CPC ........ *G06F 30/394* (2020.01); *G06F 30/3947* (2020.01); *G06F 30/3953* (2020.01); *G06N 3/08* (2013.01)

(58) Field of Classification Search
CPC ................................................... G06F 30/394
(Continued)

(56) References Cited

U.S. PATENT DOCUMENTS

| | | | |
|---|---|---|---|
| 5,187,671 A | 2/1993 | Cobb | |
| 5,808,330 A | 9/1998 | Rostoker et al. | |

(Continued)

FOREIGN PATENT DOCUMENTS

| | | | |
|---|---|---|---|
| CN | 107438842 A | 12/2017 | |
| CN | 111758072 A | 10/2020 | |

(Continued)

OTHER PUBLICATIONS

Ajayi, Tutu, et al., "OpenROAD: Toward a Self-Driving, Open-Source Digital Layout Implementation Tool Chain," Proceedings of Government Microcircuit Applications and Critical Technology Conference, Jan. 1, 2019, 6 pages, National Science Foundation, retrieved from https://vlsicad.ucsd.edu/Publications/Conferences/370/c370.pdf.

(Continued)

*Primary Examiner* — Eric D Lee
(74) *Attorney, Agent, or Firm* — ADELI LLP

(57) ABSTRACT
Some embodiments of the invention provide an integrated circuit (IC) that has a novel non-preferred direction (NPD) wiring architecture. In some embodiments, the IC includes a substrate and multiple wiring layers, which include a first set of one or more wiring layers with no preferred wiring directions, and a second set of one or more wiring layers with preferred wiring directions. In some embodiments, the first set of wiring layers includes the third and fourth wiring layers, while the second set of wiring layers includes the fifth and higher metal layers with successive neighboring layers having different (e.g., alternating) preferred wiring directions. The first set of wiring layers in other embodiments includes the third wiring layer but not the fourth wiring layer, which in these embodiments has a preferred wiring direction.

19 Claims, 28 Drawing Sheets

Related U.S. Application Data on May 2, 2022, provisional application No. 63/313,269, filed on Feb. 23, 2022.

(51) Int. Cl.
   *G06F 30/3953*      (2020.01)
   *G06N 3/08*          (2023.01)

(58) Field of Classification Search
   USPC ........................................................ 716/126
   See application file for complete search history.

(56) References Cited

U.S. PATENT DOCUMENTS

| | | | |
|---|---|---|---|
| 6,407,434 | B1 | 6/2002 | Rostoker et al. |
| 6,480,990 | B1 | 11/2002 | Sharp et al. |
| 6,829,757 | B1 | 12/2004 | Teig et al. |
| 6,877,146 | B1 | 4/2005 | Teig et al. |
| 6,928,633 | B1 | 8/2005 | Teig et al. |
| 6,973,634 | B1 | 12/2005 | Teig et al. |
| 7,096,449 | B1 | 8/2006 | Teig et al. |
| 7,107,564 | B1 | 9/2006 | Teig et al. |
| 7,117,468 | B1 | 10/2006 | Teig et al. |
| 7,269,817 | B2 | 9/2007 | Heng et al. |
| 7,310,793 | B1 | 12/2007 | Teig et al. |
| 7,441,220 | B2 | 10/2008 | Hetzel et al. |
| 7,754,401 | B2 | 7/2010 | Fujimura et al. |
| 7,784,010 | B1 | 8/2010 | Balsdon et al. |
| 8,473,875 | B2 | 6/2013 | Fujimura et al. |
| 8,818,072 | B2 | 8/2014 | Ong et al. |
| 8,898,606 | B1 | 11/2014 | Abou Ghaida et al. |
| 9,257,367 | B2 | 2/2016 | Okada et al. |
| 10,012,900 | B2 | 7/2018 | Kim et al. |
| 10,444,629 | B2 | 10/2019 | Zable |
| 10,520,830 | B2 | 12/2019 | Kicken et al. |
| 10,628,546 | B1 | 4/2020 | Colwell et al. |
| 10,670,973 | B2 | 6/2020 | Zou et al. |
| 10,678,142 | B2 | 6/2020 | Jheng et al. |
| 10,783,292 | B1 | 9/2020 | Clewes et al. |
| 10,923,318 | B2 | 2/2021 | Gledhill et al. |
| 10,949,595 | B2 | 3/2021 | Tsutsui et al. |
| 11,043,359 | B2 | 6/2021 | Nakamura et al. |
| 11,132,489 | B1 | 9/2021 | Liu et al. |
| 2005/0132306 | A1 | 6/2005 | Smith et al. |
| 2005/0138593 | A1 | 6/2005 | Okumura |
| 2005/0229134 | A1 | 10/2005 | Hetzel et al. |
| 2005/0251771 | A1 | 11/2005 | Robles |
| 2006/0066417 | A1 | 3/2006 | Yamanaga et al. |
| 2006/0190911 | A1 | 8/2006 | Stivers |
| 2007/0245286 | A1 | 10/2007 | Ueda |
| 2008/0028352 | A1 | 1/2008 | Birch et al. |
| 2008/0109766 | A1 | 5/2008 | Song et al. |
| 2008/0115099 | A1 | 5/2008 | Patra |
| 2011/0089345 | A1 | 4/2011 | Komagata et al. |
| 2011/0239181 | A1 | 9/2011 | Uchino |
| 2012/0094219 | A1 | 4/2012 | Fujimura et al. |
| 2012/0151422 | A1 | 6/2012 | White et al. |
| 2013/0022929 | A1 | 1/2013 | Komagata et al. |
| 2013/0031524 | A1 | 1/2013 | He et al. |
| 2013/0159943 | A1 | 6/2013 | Agarwal et al. |
| 2013/0283216 | A1 | 10/2013 | Pearman et al. |
| 2013/0283218 | A1 | 10/2013 | Fujimura et al. |
| 2016/0125120 | A1 | 5/2016 | Yu et al. |
| 2016/0328511 | A1 | 11/2016 | Ning et al. |
| 2017/0185711 | A1 | 6/2017 | Fujiwara |
| 2017/0194126 | A1 | 7/2017 | Bhaskar et al. |
| 2017/0357911 | A1 | 12/2017 | Liu et al. |
| 2018/0067900 | A1 | 3/2018 | Mos et al. |
| 2019/0146355 | A1 | 5/2019 | Jheng et al. |
| 2019/0197213 | A1 | 6/2019 | Ungar |
| 2019/0206041 | A1 | 7/2019 | Fang et al. |
| 2019/0377849 | A1 | 12/2019 | Sha et al. |
| 2019/0385300 | A1 | 12/2019 | Baidya et al. |
| 2020/0051781 | A1 | 2/2020 | Fujimura et al. |
| 2020/0065453 | A1 | 2/2020 | Kim et al. |
| 2020/0134131 | A1 | 4/2020 | Tien et al. |
| 2020/0159884 | A1 | 5/2020 | Kim et al. |
| 2020/0184137 | A1 | 6/2020 | Tsutsui et al. |
| 2020/0364394 | A1 | 11/2020 | Yu et al. |
| 2020/0380089 | A1 | 12/2020 | Gheith et al. |
| 2020/0387660 | A1 | 12/2020 | Cecil |
| 2021/0048741 | A1 | 2/2021 | Lugg et al. |
| 2021/0181620 | A1 | 6/2021 | Poonawala et al. |
| 2021/0216697 | A1 | 7/2021 | Brink et al. |
| 2021/0279878 | A1 | 9/2021 | Adler et al. |
| 2021/0397172 | A1 | 12/2021 | Slachter et al. |
| 2022/0035237 | A1 | 2/2022 | Lee et al. |
| 2022/0050381 | A1 | 2/2022 | Biswas et al. |
| 2022/0128899 | A1 | 4/2022 | Fujimura et al. |
| 2022/0138381 | A1 | 5/2022 | Yamane et al. |
| 2022/0147682 | A1 | 5/2022 | Koumura |
| 2022/0187713 | A1 | 6/2022 | Middlebrooks et al. |
| 2022/0299881 | A1 | 9/2022 | Zheng et al. |
| 2023/0024684 | A1 | 1/2023 | Fujimura et al. |
| 2023/0027655 | A1 | 1/2023 | Fujimura et al. |
| 2023/0032510 | A1 | 2/2023 | Fujimura et al. |
| 2023/0092665 | A1 | 3/2023 | Fujimura et al. |
| 2023/0107556 | A1 | 4/2023 | Tao et al. |
| 2023/0153505 | A1 | 5/2023 | Chang et al. |
| 2023/0168660 | A1 | 6/2023 | Oriordan et al. |
| 2023/0169245 | A1 | 6/2023 | Oriordan et al. |
| 2023/0169246 | A1 | 6/2023 | Oriordan et al. |
| 2023/0169247 | A1 | 6/2023 | Oriordan et al. |
| 2023/0186009 | A1 | 6/2023 | Fujimura et al. |
| 2023/0205972 | A1 | 6/2023 | Oriordan et al. |
| 2023/0214571 | A1 | 7/2023 | Apte et al. |
| 2023/0229836 | A1 | 7/2023 | Oriordan et al. |
| 2023/0229840 | A1 | 7/2023 | Oriordan et al. |
| 2023/0229844 | A1 | 7/2023 | Oriordan et al. |
| 2023/0267265 | A1 | 8/2023 | Oriordan |
| 2023/0274065 | A1 | 8/2023 | Fujimura |
| 2023/0274066 | A1 | 8/2023 | Fujimura |
| 2023/0274067 | A1 | 8/2023 | Fujimura |
| 2023/0274068 | A1 | 8/2023 | Fujimura |
| 2023/0274069 | A1 | 8/2023 | Fujimura |
| 2023/0274071 | A1 | 8/2023 | Fujimura |
| 2023/0281374 | A1 | 9/2023 | Fujimura |
| 2023/0282635 | A1 | 9/2023 | Fujimura |
| 2023/0297756 | A1* | 9/2023 | Ruic .................... G06F 30/394 716/100 |
| 2023/0306177 | A1 | 9/2023 | Fujimura |
| 2023/0351087 | A1 | 11/2023 | Oriordan et al. |
| 2023/0351088 | A1 | 11/2023 | Oriordan et al. |
| 2023/0351089 | A1 | 11/2023 | Oriordan et al. |
| 2023/0359804 | A1 | 11/2023 | Oriordan |
| 2024/0119214 | A1 | 4/2024 | Oriordan et al. |

FOREIGN PATENT DOCUMENTS

| | | |
|---|---|---|
| CN | 113168085 A | 7/2021 |
| CN | 113168115 A | 7/2021 |
| EP | 3951496 A1 | 2/2022 |
| JP | 2005141679 A | 6/2005 |
| JP | 2007536581 A | 12/2007 |
| JP | 2011204000 A | 10/2011 |
| JP | 2013077844 A | 4/2013 |
| JP | 2014174288 A | 9/2014 |
| JP | 2019114295 A | 7/2019 |
| JP | 2021509208 A | 3/2021 |
| KR | 102170578 B1 | 10/2020 |
| KR | 20210010897 A | 1/2021 |
| KR | 102377411 B1 | 3/2022 |
| TW | I710763 B | 11/2020 |
| TW | 202113501 A | 4/2021 |
| TW | 202121050 A | 6/2021 |
| WO | 2021043936 A1 | 3/2021 |
| WO | 2022086825 A1 | 4/2022 |
| WO | 2023163910 A2 | 8/2023 |

OTHER PUBLICATIONS

Ao, Jianchang, et. al., "Delay-Driven Layer Assignment in Global Routing under Multi-tier Interconnect Structure," ISPD '13: Pro-

(56) References Cited

OTHER PUBLICATIONS ceedings of the 2013 ACM International Symposium on Physical Design, Mar. 2013, 7 pages, ACM, retrieved from https://dl.acm.org/doi/10.1145/2451916.2451942.

Author Unknown, "D2S Enables "Stitchless" Full-Chip Inverse Lithography Technology in a Single Day for the Multi-Beam Era," Press Release, Sep. 16, 2019, 3 pages, D2S, Inc., San Jose, California, USA.

Author Unknown, "D2S Unveils Industry's First Mask-Wafer Double Simulation Platform," Press Release, Sep. 20, 2011, 3 pages, D2S, Inc., San Jose, California, USA.

Author Unknown, "Deep reinforcement learning," Wikipedia, Sep. 21, 2020, 2 pages, Wikipedia.com.

Author Unknown, "Design rule checking," Wikipedia, May 27, 2020, 4 pages, Wikipedia.com.

Author Unknown, "Marching squares," Wikipedia, Dec. 30, 2019, 9 pages, Wikipedia.com.

Author Unknown, "Multiple patterning," Wikipedia, Oct. 10, 2020, 22 pages, Wikipedia.com.

Author Unknown, "Optical proximity correction," Wikipedia, Apr. 28, 2019, 5 pages, Wikipedia.com.

Author Unknown, "Rasterisation," Wikipedia, Aug. 21, 2020, 4 pages, Wikipedia.com.

Author Unknown, "TrueMask® DS," Exact Date Unknown but Before May 2020, 3 pages, D2S, Inc., retrieved from https://design2silicon.com/products/truemask-ds/.

Author Unknown, "TrueMask® ILT Backgrounder Stitchless Full-Chip ILT in a Day," Backgrounder, Sep. 2019, 6 pages, D2S, Inc., San Jose, California, USA.

Author Unknown, "TrueMask® ILT," Exact Date Unknown but Before May 2020, 7 pages, D2S, Inc., retrieved from https://design2silicon.com/products/truemask-ilt/.

Cecil, Thomas, et al., "Establishing Fast, Practical, Full-Chip ILT Flows Using Machine Learning," SPIE Proceedings 11327, Optical Microlithography XXXIII, Mar. 23, 2020, 19 pages, vol. 1132706, SPIE, San Jose, California, USA.

Chen, Kun-Yuan, et al., "Full-Chip Application of Machine Learning SRAFs on DRAM Case Using Auto Pattern Selection," SPIE Proceedings 10961, Optical Microlithography XXXII, Oct. 10, 2019, 13 pages, vol. 1096108, SPIE, San Jose, California, USA.

Chen, Tai-Chen, "Multilevel Full-Chip Gridless Routing With Applications to Optical-Proximity Correction," Jun. 2007, 13 pages, IEEE, retrieved from http://cc.ee.ntu.edu.tw/~ywchang/Papers/tcad07-mgr.pdf.

Ibtehaz, Nabil, et. al., "MultiResUNet: Rethinking the U-Net Architecture for Multimodal Biomedical Image Segmentation," Feb. 11, 2019, 25 pages, retrieved from https://arxiv.org/pdf/1902.04049.pdf.

Jia, Ningning, et al., "Machine Learning for Inverse Lithography: using stochastic gradient descent for robust photomask synthesis," Journal of Optics, Apr. 1, 2010, 9 pages, vol. 12, IOP Publishing, retrieved from https://www.eee.hku.hk/optima/pub/journal/1004_JO.pdf.

Kwan, Joe, et al., "Applying Machine Learning Techniques to Accelerate Advanced Process Yield Ramp," Jan. 5, 2021, 29 pages, Siemens Digital Industries Software, Munich, Germany.

Lin, Yibo, et al., "Machine Learning for Yield Learning and Optimization," 2018 IEEE International Test Conference (ITC), Oct. 29-Nov. 1, 2018, 10 pages, IEEE, Phoenix, AZ, USA.

Liu, Peng, "Mask Synthesis Using Machine Learning Software and Hardware Platforms," SPIE Proceedings 11327, Optical Microlithography XXXIII, Mar. 23, 2020, 17 pages, vol. 1132707, SPIE, San Jose, California, USA.

Mitchell, Robin, "IMEC Demonstrates Buried Power Rails in FinFET CMOS," Mar. 17, 2021, 6 pages, EPM, retrieved from https://www.electropages.com/blog/2021/03/imec-demonstrates-buried-power-rails-finfet-cmos.

Mitra, Joydeep, et al., "RADAR: RET-Aware Detailed Routing Using Fast Lithography Simulations," DAC '05: 42nd annual Design Automation Conference, Jun. 13-17, 2005, 6 pages, IEEE, retrieved from https://citeseerx.ist.psu.edu/viewdoc/download?doi=10.1.1.103.2367&rep=rep1&type=pdf.

Naik, Mehul, "Challenges to Interconnect Scaling at 3nm and Beyond," Applied Materials, Jun. 14, 2021, 9 pages, Applied Materials, Inc., retrieved from https://www.appliedmaterials.com/us/en/blog/blog-posts/challenges-to-interconnect-scaling-at-3nm-and-beyond.html.

Pang, Linyong (Leo), et al., "Study of Mask and Wafer Co-design That Utilizes a New Extreme SIMD Approach to Computing in Memory Manufacturing: Full-Chip Curvilinear ILT in a Day," SPIE Proceedings 11148, Photomask Technology 2019, Oct. 3, 2019, 16 pages, vol. 111480U, SPIE, retrieved from https://design2silicon.com/wp-content/uploads/2019/11/2019-BACUS-Full-Chip-Curvilinear-ILT-091219s-003.pdf.

Pang, Linyong, "Inverse Lithography Technology: 30 years from concept to practical, full-chip reality," Journal of Micro/Nanopatterning, Materials, and Metrology, Aug. 31, 2021, 49 pages, vol. 20(3), SPIE, retrieved from https://www.spiedigitallibrary.org/journals/journal-of-micro-nanopatterning-materials-and-metrology/volume20/issue-03/030901/Inverse-lithography-technology--30-years-from-concept-to-practical/10.1117/1.JMM.20.3.030901.full.

Pang, Linyong, et al., "How GPU-Accelerated Simulation Enables Applied Deep Learning for Masks and Wafers," Photomask Japan 2019: XXVI Symposium on Photomask and Next-Generation Lithography Mask Technology, Apr. 16-18, 2019, 10 pages, SPIE, Yokohama, Japan.

Pang, Linyong, et al., "Making Digital Twins using the Deep Learning Kit (DLK)," Photomask Technology 2019, Sep. 15-19, 2019, 13 pages, SPIE, Monterey, California, USA.

PCT International Search Report and Written Opinion of Commonly Owned International Patent Application PCT/US2023/013357, mailing date Aug. 15, 2023, 10 pages, International Searching Authority (US).

Pradipta, Geraldo, et al., "A Machine Learning Based Parasitic Extraction Tool," Oct. 31, 2019, 3 pages, University of Minnesota, Minneapolis, Minnesota, USA.

Prasad, Divya, "Can we Bury our Scaling Problems with Buried Power Rails and Back-side Power Delivery?," Mar. 5, 2020, 8 pages, Arm Limited, retrieved from https://community.arm.com/arm-research/b/articles/posts/can-we-bury-our-scaling-problems-with-buried-power-rails-and-back-side-power-delivery.

Ren, Haoxing (Mark), "Machine Learning and Deep Learning Applications in Design Automation and Practical Issues," DAC '19: 56th Annual Design Automation Conference 2019, Jun. 2-6, 2019, 55 pages, Association for Computing Machinery, Las Vegas, Nevada, USA.

Ronneberger, Olaf, et. al., "U-Net: Convolutional Networks for Biomedical Image Segmentation," May 18, 2015, 8 pages, retrieved from https://arxiv.org/pdf/1505.04597.pdf.

Shi, Xuelong, et al., "Physics based feature Vector Design: a Critical Step Towards Machine Learning based Inverse Lithography," SPIE Proceedings 11327, Optical Microlithography XXXIII, Mar. 23, 2020, 8 pages, vol. 113270A, SPIE, San Jose, California, USA.

Sole, Marc Pons, "Layout Regularity for Design and Manufacturability," Doctoral Thesis, Jul. 8, 2012, 185 pages, Technical University of Catalonia, Barcelona, Spain.

Sperling, Ed, "Design Rule Complexity Rising," Semiconductor Engineering—Deep Insights for the Tech Industry, Apr. 19, 2018, 16 pages, SMG, retrieved from https://semiengineering.com/design-rule-complexity-rising/.

Teig, Steven L., "The X architecture: not your father's diagonal wiring," SLIP '02: Proceedings of the 2002 international workshop on System-level interconnect prediction, Apr. 6, 2002, 5 pages, ACM, retrieved from https://dl.acm.org/doi/10.1145/505348.505355.

Wang, Shibing, et al., "Efficient Full-Chip SRAF Placement Using Machine Learning for Best Accuracy and Improved Consistency," SPIE Proceedings 10587, Optical Microlithography XXXI, Mar. 20, 2018, 10 pages, vol. 105870N, SPIE, San Jose, California, USA.

(56)     References Cited

OTHER PUBLICATIONS

Wang, Shibing, et al., "Machine Learning Assisted SRAF Placement for Full Chip," SPIE Proceedings 10451, Photomask Technology 2017, Oct. 16, 2017, 8 pages, vol. 104510D, SPIE, Monterey, California, USA.

Yang, Dingcheng, et al., "CNN-Cap: Effective Convolutional Neural Network Based Capacitance Models for Full-Chip Parasitic Extraction," Jul. 14, 2021, 9 pages, retrieved from https://arxiv.org/pdf/2107.06511.pdf.

Dai, Wayne Wei-Ming, "Rubber band routing and dynamic data representation," 1990 IEEE International Conference on Computer-Aided Design, Nov. 11-15, 1990, 4 pages, IEEE, Santa Clara, California, USA.

Staepelaere, David Joseph, "Geometric Transformations for a Rubber-band Sketch," Master's Thesis, Sep. 1992, 71 pages, University of California at Santa Cruz, Santa Cruz, CA.

Shao, Hao-Chiang, et. al., "From IC Layout to Die Photograph: A CNN-Based Data-Driven Approach" IEEE Transactions on Computer-Aided Design of Integrated Circuits and Systems, vol. 40, No. 5, May 2021, pp. 957-970, IEEE.

Dounde, Amit, et al., "A Study of Curvilinear Routing in IN5 Standard Cells: Challenges and Opportunities," Photomask Technology 2019, Sep. 26, 2019, p. 48, SPIE.

* cited by examiner

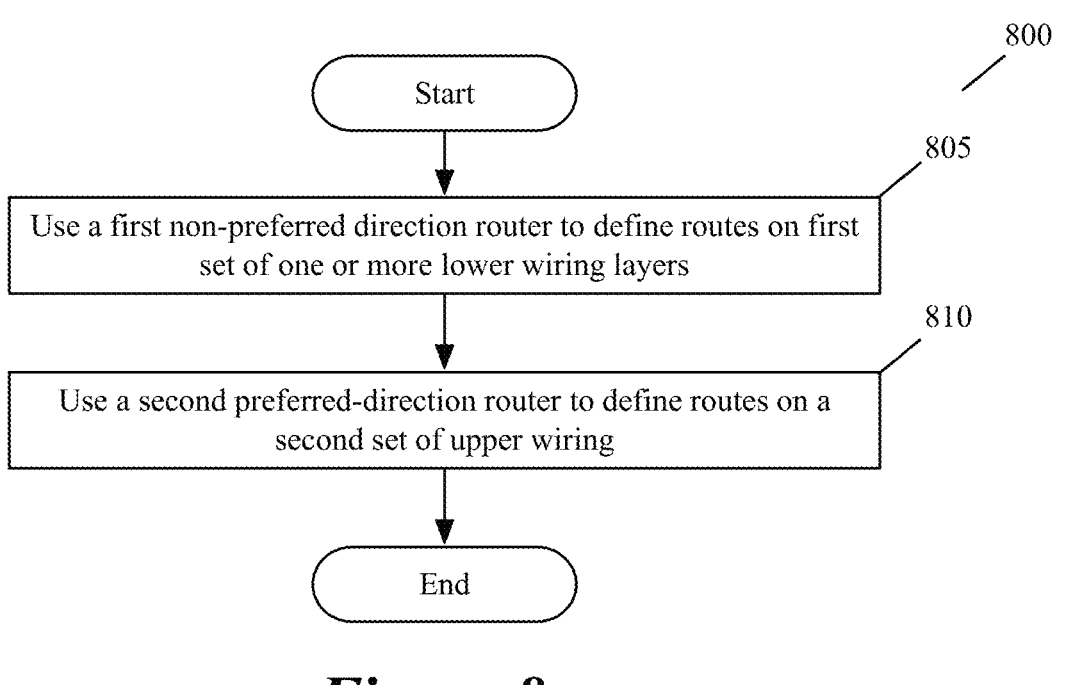

800

Start

805

Use a first non-preferred direction router to define routes on first set of one or more lower wiring layers

810

Use a second preferred-direction router to define routes on a second set of upper wiring End

Start

905

Use a NPD detailed router to define NPD routes for several nets on a set of lower wiring layers without performing global routing

910

Use PD global router to define PD global routes for the remaining nets in the IC design

915

Use PD detailed router that to defines PD detailed routes for remaining nets on the lower and higher wiring layers End

Figure 9

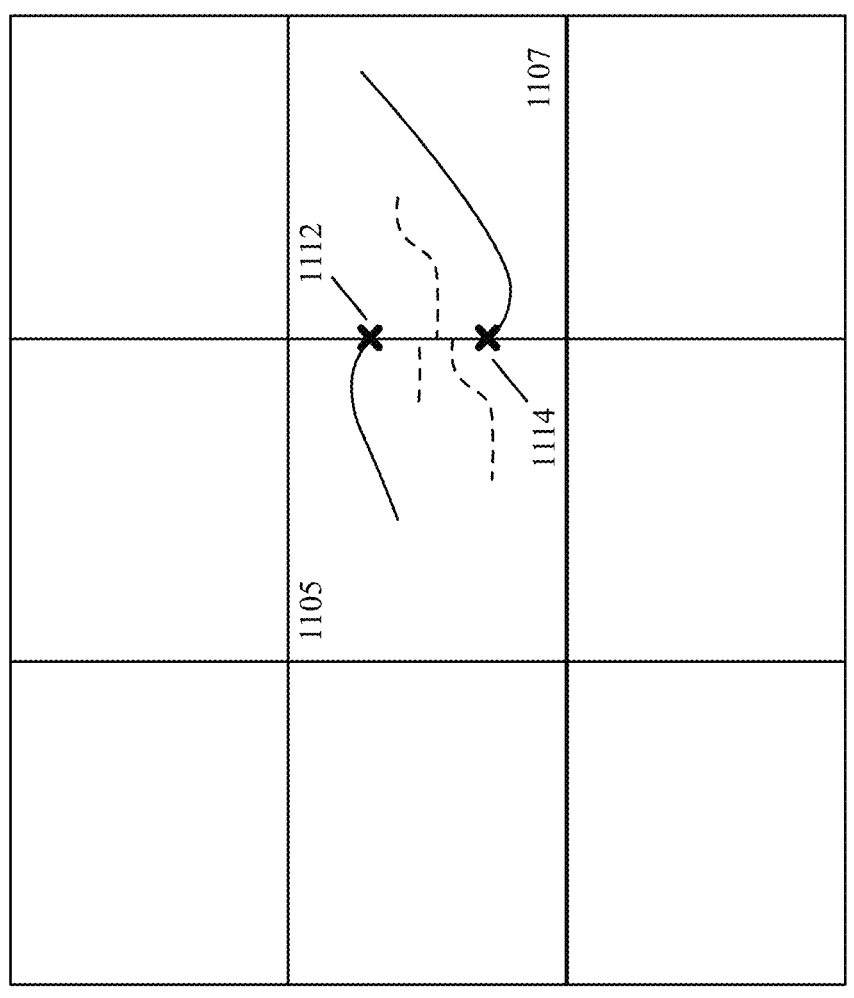
*Figure 11*

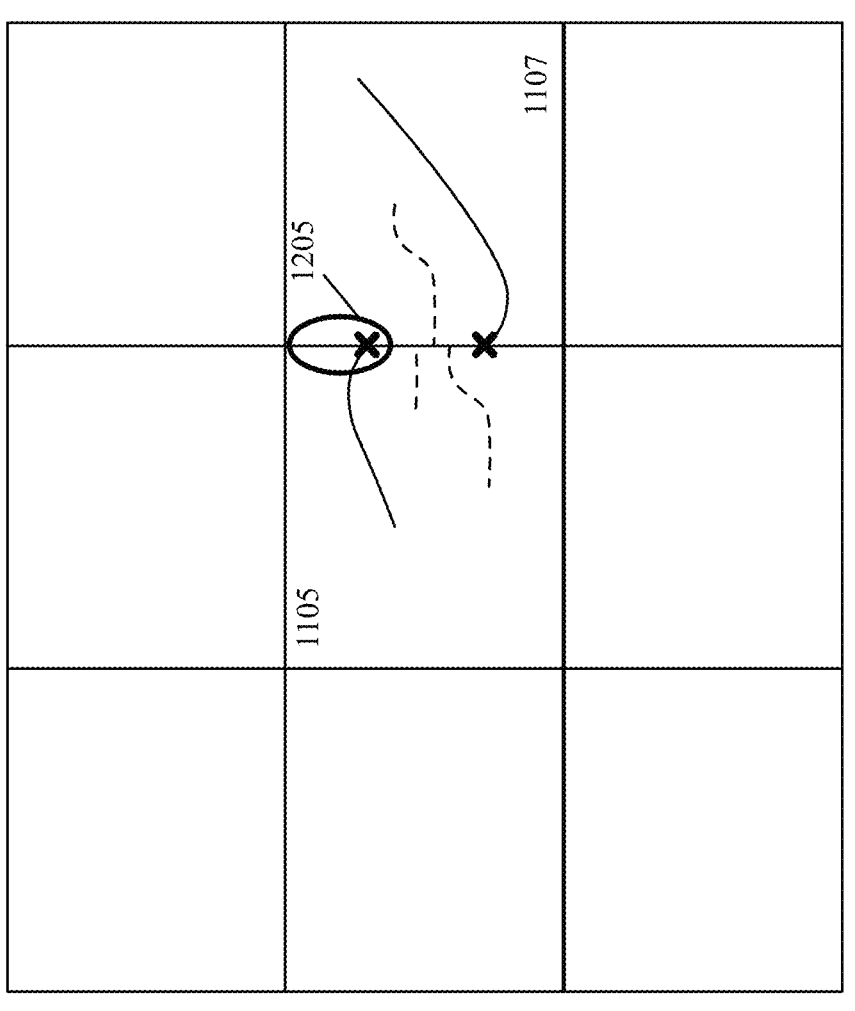
*Figure 12*

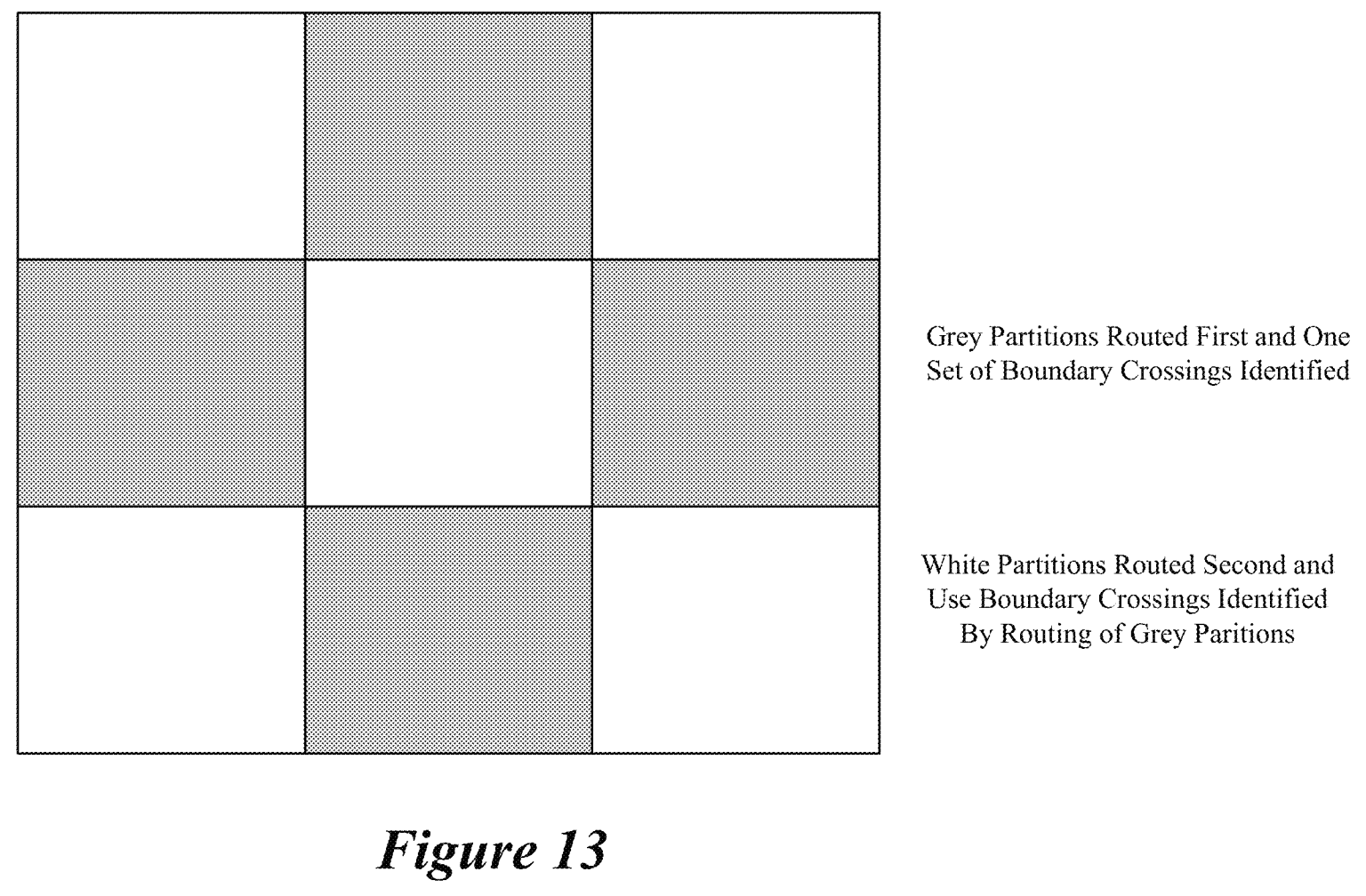

Grey Partitions Routed First and One Set of Boundary Crossings Identified

White Partitions Routed Second and Use Boundary Crossings Identified By Routing of Grey Paritions

*Figure 13*

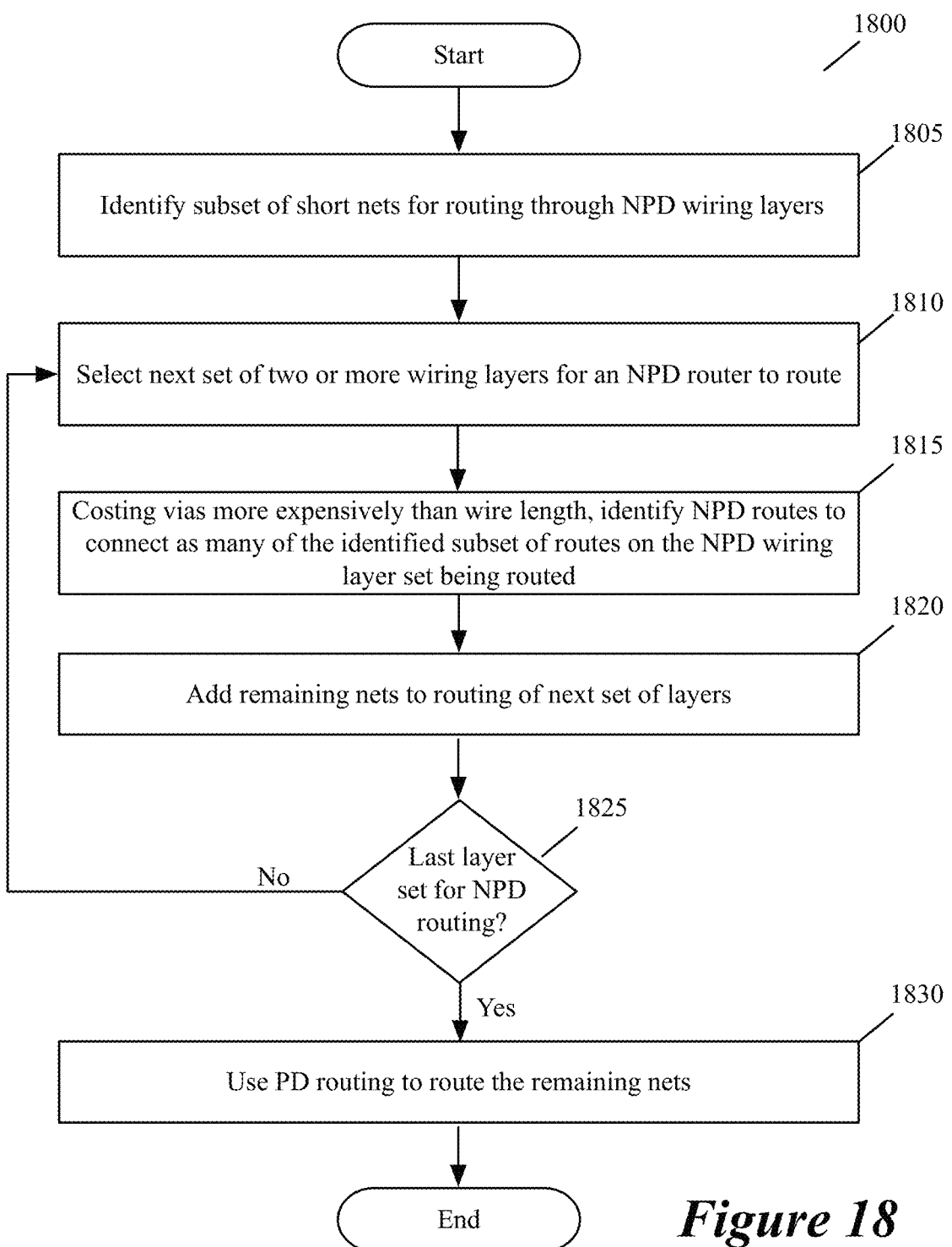

1800

1805

Start

Identify subset of short nets for routing through NPD wiring layers

1810

Select next set of two or more wiring layers for an NPD router to route

1815

Costing vias more expensively than wire length, identify NPD routes to connect as many of the identified subset of routes on the NPD wiring layer set being routed

1820

Add remaining nets to routing of next set of layers

1825

Last layer set for NPD routing?

No

Yes

1830

Use PD routing to route the remaining nets

End

*Figure 18*

GENERATING ROUTES FOR AN INTEGRATED CIRCUIT DESIGN WITH NON-PREFERRED DIRECTION CURVILINEAR WIRING

CROSS REFERENCE TO RELATED APPLICATIONS

The present application is related to the following applications having a similar specification and figures: U.S. patent application Ser. No. 18/110,332, filed Feb. 15, 2023; U.S. patent application Ser. No. 18/110,334, filed Feb. 15, 2023; U.S. patent application Ser. No. 18/110,336, filed Feb. 15, 2023; U.S. patent application Ser. No. 18/110,338, filed Feb. 15, 2023; U.S. patent application Ser. No. 18/110,343, filed Feb. 15, 2023; U.S. patent application Ser. No. 18/110, 344, filed Feb. 15, 2023; U.S. patent application Ser. No. 18/110,345, filed Feb. 15, 2023; U.S. patent application Ser. No. 18/110,346, filed Feb. 15, 2023; and U.S. patent application Ser. No. 18/110,348, filed Feb. 15, 2023.

BACKGROUND

An integrated circuit ("IC") is a device that includes many electronic components, such as transistors, resistors, diodes, etc. These components are often defined on a semiconductor substrate and interconnected with metal wiring and vias to form multiple circuit components, such as gates, cells, memory units, arithmetic units, controllers, decoders, etc. An IC typically includes multiple layers of wiring and vias that interconnect its electronic and circuit components.

SUMMARY

Some embodiments of the invention provide an integrated circuit (IC) that has a novel non-preferred direction (NPD) wiring architecture. In some embodiments, the IC includes a substrate and multiple wiring layers, which include a first set of one or more wiring layers with no preferred wiring directions, and a second set of one or more wiring layers with preferred wiring directions. In some embodiments, the first set of wiring layers includes the third and fourth wiring layers, while the second set of wiring layers includes the fifth and higher metal layers with successive neighboring layers having different (e.g., alternating) preferred wiring directions. The first set of wiring layers in other embodiments includes the third wiring layer but not the fourth wiring layer, which in these embodiments has a preferred wiring direction. Also, the first and second wiring layers in some embodiments belong to the first set, while in other embodiments the first and second wiring layers belong to the second set.

Each preferred wiring direction in some embodiments is a Manhattan direction (i.e., a horizontal direction or a vertical direction), with the preferred wiring directions of different adjacent layers alternating between horizontal and vertical directions. The preferred wiring directions in other embodiments include other wiring directions (e.g., 45 or 60 degree wiring directions), with successive neighboring layers having different preferred wiring directions. In some embodiments, the preferred wiring direction on each layer is the direction that includes at least a certain threshold amount (e.g., 90% or 95%) of the wiring on that layer. In some embodiments, the non-preferred direction wiring on each layer of the first set of wiring layers includes interconnect wiring (also called wiring connection) that traverses in more than eight directions.

In some embodiments, each layer of the first set of wiring layers includes rectilinear wires (i.e., wires with only straight segments) and curvilinear wires (i.e., wires with at least one curved segment). In some embodiments, the first set of wiring layers of the IC is used for wire connections that are shorter than the wire connections defined on the second set of wiring layers. In some embodiments, the first set of wiring layers in some embodiments is used for short local connections, while the second set of wiring layers is used for longer connections.

The electronic design automation (EDA) tools (e.g., the router and compactor) that define the design of the IC in some embodiments account for the preferred and non-preferred directions on each wiring layer while defining the routes that result in the metal wiring on these layers. In some embodiments, when the first set of wiring layers includes the third wiring layer and/or the fourth wiring layer, the EDA tools define NPD curvilinear routes for the third and/or fourth wiring layers, but also define NPD curvilinear routes for the first and second wiring layers. However, in some of these embodiments, the first and second wiring layers have preferred direction wiring in some of their regions, such as the regions that are used for connections that are needed to form the electronic components (e.g., the transistors) and circuit blocks (e.g., IP blocks) that are defined on the IC's substrate at locations below these regions. In some embodiments, the EDA tools use the unused spaces on the first and second wiring layers to define NPD rectilinear and/or curvilinear routes, which result in NPD rectilinear/curvilinear wiring on the corresponding layers of the manufactured IC. The NPD rectilinear/curvilinear wiring on the first and second layers augments the NPD rectilinear/curvilinear wiring on the third and/or fourth wiring layers.

In some embodiments, the first set of wiring layers of the IC is used to connect any net that can be connected through wires on the first set of wiring layers, while the second set of wiring layers is used to connect any nets that cannot be completely connected through wires on the first set of wiring layers. In some of these embodiments, the design of the IC is based on rectilinear and curvilinear routes that are defined on the first N layers, where N is an integer greater than two, but only rectilinear routes on the next M layers of the IC, where M is any integer. Some embodiments allow rectilinear and curvilinear routes in the IC design for not only some of the lower wiring layers but also for some of the higher wiring layers (e.g., for all of the wiring layers, or for the first few lower wiring layers and one or two of the top wiring layers). In some embodiments, a rectilinear route is a route that only has one or more straight line segments, while a curvilinear route is a route with at least one curved segment.

In some embodiments, the interconnect connections on the first set of wiring layers are defined with a NPD, curvilinear first router, while the interconnect connections on the second set of wiring layers are defined by a preferred direction (PD) second router (e.g., a Manhattan router). The NPD first router produces routes on each layer in the first set of wiring layers that traverse more than eight different directions on the layer. The first router in some embodiments also produces curvilinear routes on the first set of wiring layers. The PD second router produces routes that on each layer in the second set of wiring layers are predominantly along the preferred routing direction of that layer.

In some embodiments, the NPD first router defines a first set of rectilinear and curvilinear routes traversing the first set of wiring layers to connect a first set of node pairs that are within a threshold distance of each other, while the PD second router defines a second set of rectilinear routes traversing the second set of wiring layers to connect a second set of node pairs that are more than the threshold distance from each other. Even though the first router in some embodiments can define both rectilinear and curvilinear routes, the second router in these embodiments does not produce any curvilinear route, e.g., any route that has at least one curvilinear edge (i.e., a curved edge that is not a straight line).

Some embodiments first define the routes for the first set of wiring layers of the IC design and then define the routes for the higher, second set of wiring layers of the IC design. For instance, some embodiments perform NPD detailed routing for the first set of wiring layers without first performing global routing for these layers. These embodiments then perform global routing for the second set of wiring layers, and after the global routing, perform detailed routing for the second set of wiring layers.

The NPD detailed routing of the first set of wiring layers in some embodiments does not use any preferred wiring directions. This NPD detailed routing produces curvilinear routes as it allows all angle of directions to be explored during the path search operations of the routing, and then allows curvilinear edges to be used to define the routes that are based on the completed path searches. In other embodiments, the NPD detailed routing only produces rectilinear routes in a large, finite number of wiring direction, such as nine or more wiring directions, and does not produce designs with curvilinear route segments. This is because in these embodiments, the path searches of the routing operation only explore expanding paths along the finite number of wiring directions, and then use only rectilinear edges that are along these wiring directions to define the routes that are based on the completed path searches.

Also, in some embodiments, the NPD detailed router produces curvilinear routes on a subset of layers in the first set of wiring layers (e.g., on the first and second wiring layers) in between areas on these layers that have PD rectilinear wiring that has been previously defined (e.g., in regions on layers 1 and 2 that are used for the wiring of IP blocks). Accordingly, in these embodiments, these subset of lower wiring layers have regions with predefined PD rectilinear wiring, and areas between these regions with NPD rectilinear and curvilinear wiring.

In some embodiments, the global and detailed routing for the PD wiring layers uses Manhattan preferred directions, while in other embodiments the global and detailed routing for the PD wiring layers uses other preferred wiring directions (e.g., 45 or 60 degree wiring) conjunctively or alternatively with horizontal and vertical wiring direction. In some embodiments, the NPD wiring layers are the first set of wiring layers of the IC design, and the PD wiring layers are the second set of wiring layers of the IC design. In other embodiments, the NPD wiring layers include the first two metal layers, the first three metal layers, or the first four metal layers of the IC design. In still other embodiments, the NPD wiring layers include additional metal layers as explained above.

In some embodiments, the NPD first set of wiring layers include first and second subset of layers. In these embodiments, the method first performs a first detailed routing operation for the first subset of layers (e.g., for the first or third wiring layer), and then after completing the first detailed routing operation, performs a second detailed routing operation for the second subset of layers (e.g., for the second or fourth wiring layer). The method in some embodiments performs the first and second detailed routing operations by using an NPD detailed router to perform the first detailed routing operation, and then recursively calling the NPD detailed router to perform the second detailed routing operation.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed. Moreover, the claimed subject matters are not to be limited by the illustrative details in the Summary, Detailed Description and the Drawings.

BRIEF DESCRIPTION OF FIGURES

The novel features of the invention are set forth in the appended claims. However, for purposes of explanation, several embodiments of the invention are set forth in the following figures.

FIG. 8 illustrates a routing process that defines routes to connect a net list associated with a design of an IC.

FIG. 9 illustrates a routing process of some embodiments that only uses detailed routing to define routes for NPD wiring layers, and then uses global routing and detailed routing to define routes for the PD wiring layers.

FIG. 11 illustrates two boundary crossings for the same net that are defined by two different detailed router instances that define NPD routes for the two neighboring partitions.

FIG. 12 illustrates an example of a constraint defined.

FIG. 13 illustrates an example of another approach used by some embodiments to use route crossing data specified by one detailed router of one partition with the detailed router of a neighboring partition.

FIGS. 18 and 19 illustrate examples of two routing processes that define curvilinear, NPD routers in a way that reduces the number of vias.

DETAILED DESCRIPTION

Figure 1:
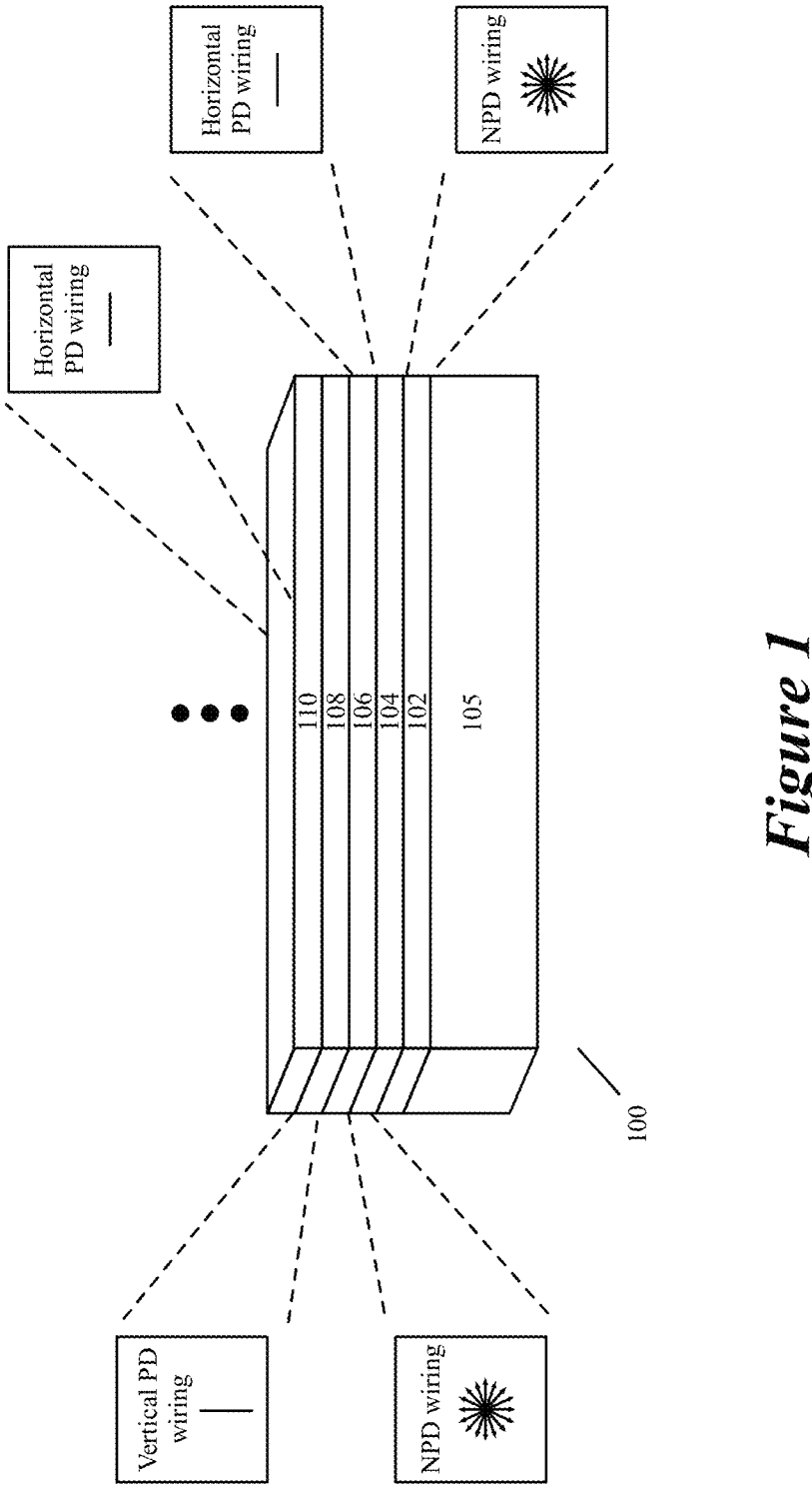
FIG. 1 illustrates an IC with a novel non-preferred direction wiring architecture of some embodiments.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide an integrated circuit (IC) that has a novel non-preferred direction (NPD) wiring architecture. In some embodiments, the IC includes a substrate and multiple wiring layers, which include a first set of one or more wiring layers with no preferred wiring directions, and a second set of one or more wiring layers with preferred wiring directions. In some embodiments, the first set of wiring layers includes the third and fourth wiring layers, while the second set of wiring layers includes the fifth and higher metal layers with successive neighboring layers having different (e.g., alternating) preferred wiring directions. The first set of wiring layers in other embodiments includes the third wiring layer but not the fourth wiring layer, which in these embodiments has a preferred wiring direction. Also, the first and second wiring layers in some embodiments belong to the first set, while in other embodiments the first and second wiring layers belong to the second set.

Each preferred wiring direction in some embodiments is a Manhattan direction (i.e., a horizontal direction or a vertical direction), with the preferred directions (PDs) of different adjacent layers alternating between horizontal and vertical directions. The preferred wiring directions in other embodiments include other wiring directions (e.g., 45 or 60 degree wiring directions), with successive neighboring layers having different preferred wiring directions.

In some embodiments, the preferred wiring direction on each layer is the direction that includes at least a certain threshold amount (e.g., 90% or 95%) of the wiring on that layer. In some embodiments, the non-preferred direction wiring on each layer of the first set of wiring layers includes wiring (also called interconnects, interconnect lines, wires or wire segments below) that traverses along more than eight directions. In some embodiments, each layer of the first set of wiring layers includes curvilinear wires, i.e., wires with at least one curved segment. A curved segment is a segment that is not a straight line but rather is curved.

The electronic design automation (EDA) tools (e.g., the router and compactor) that define the design of the IC in some embodiments account for the preferred and non-preferred directions on each wiring layer while defining the routes that result in the metal wiring on these layers. Some embodiments employ both PD and NPD EDA routers. The PD EDA routers in some embodiments penalize route segments that traverse along the non-preferred wiring directions on particular wiring layers while not penalizing route segments that traverse along the preferred wiring directions on the particular wiring layers (e.g., assesses a wirelength cost for route segments traversing along the preferred wiring direction, while assessing a wirelength cost and a penalty cost for route segments traversing along the non-preferred wiring directions). By penalizing route segments traversing along non-preferred directions, the EDA routers ensure that more than a threshold amount (e.g., 90% or 95%) of the routes on a PD wiring layer are along the preferred wiring direction of that layer.

In some embodiments, the NPD routers define routes on the first set of wiring layers of the IC design. Unlike the PD routers, the NPD routers in some embodiments do not penalize routing in any particular direction on a wiring layer in the first set, and hence do not produce designs in which more than a threshold amount (e.g., 90% or 95%) of the routes on the NPD wiring layer are along any preferred wiring direction. In other words, the NPD routers in some embodiments do not penalize routes that are along any rectilinear or curvilinear directions, in order to create a bias towards eight or fewer preferred wiring directions on a layer.

In some embodiments, the NPD routers do not penalize routing along a set of nine or more specific wiring directions but do penalize routing along one or more wiring directions that are not in the set of non-penalized wiring directions. In some embodiments, an NPD router (or an NPD routing operation) defines curvilinear routes and/or rectilinear routes that traverse in more than eight wiring directions on a wiring layer, while a PD router (or a PD routing operation) does not define any curvilinear routes and only defines rectilinear routes. Several examples of such PD and NPD routers and routing operations are further described below.

In some embodiments, a rectilinear route is a route that only has one or more straight line segments (also referred to as straight line edges), while a curvilinear route is a route with at least one curved segment (also referred to as a curved edge). A preferred direction (PD) rectilinear route in some embodiments is a route that has its straight-line segments on each layer traverse along the PD of that layer. In other embodiments, a PD rectilinear route is a route that has the majority of its straight line segments on each layer traverse along the PD of that layer.

FIG. 1 illustrates an IC 100 with a novel non-preferred direction wiring architecture of some embodiments. As shown, the IC 100 includes a substrate 105 and multiple wiring layers (also called metal layers). The wiring layers include first and second wiring layers 102 and 104 that have no preferred wiring directions, and third, fourth and fifth wiring layers 106, 108 and 110 that have first, second and third preferred directions (PDs) respectively. As such, the first and second layers do not have wire segments that predominantly traverse along one direction (e.g., do not have more than 90% of the wire segments traverse along one direction), while the third, fourth and fifth layers have their wire segments predominantly traverse (i.e., have more than 90% or 95% of their wires traverse) along the respective preferred wiring direction of these layers.

In FIG. 1, the preferred wiring directions of different adjacent PD wiring layers alternate between horizontal and vertical directions, i.e., the third wiring layer 106 has a horizontal preferred direction, the fourth wiring layer 108 has a vertical preferred direction and the fifth wiring layer 110 has a horizontal preferred direction wiring. The IC 100 in some embodiments further includes metal layer 0, as well as multiple other metal layers (e.g., sixth, seventh, and eighth metal layers). Metal layer 0 is the substrate layer in some embodiments or the first layer above the substrate layer in other embodiments.

Figure 2:
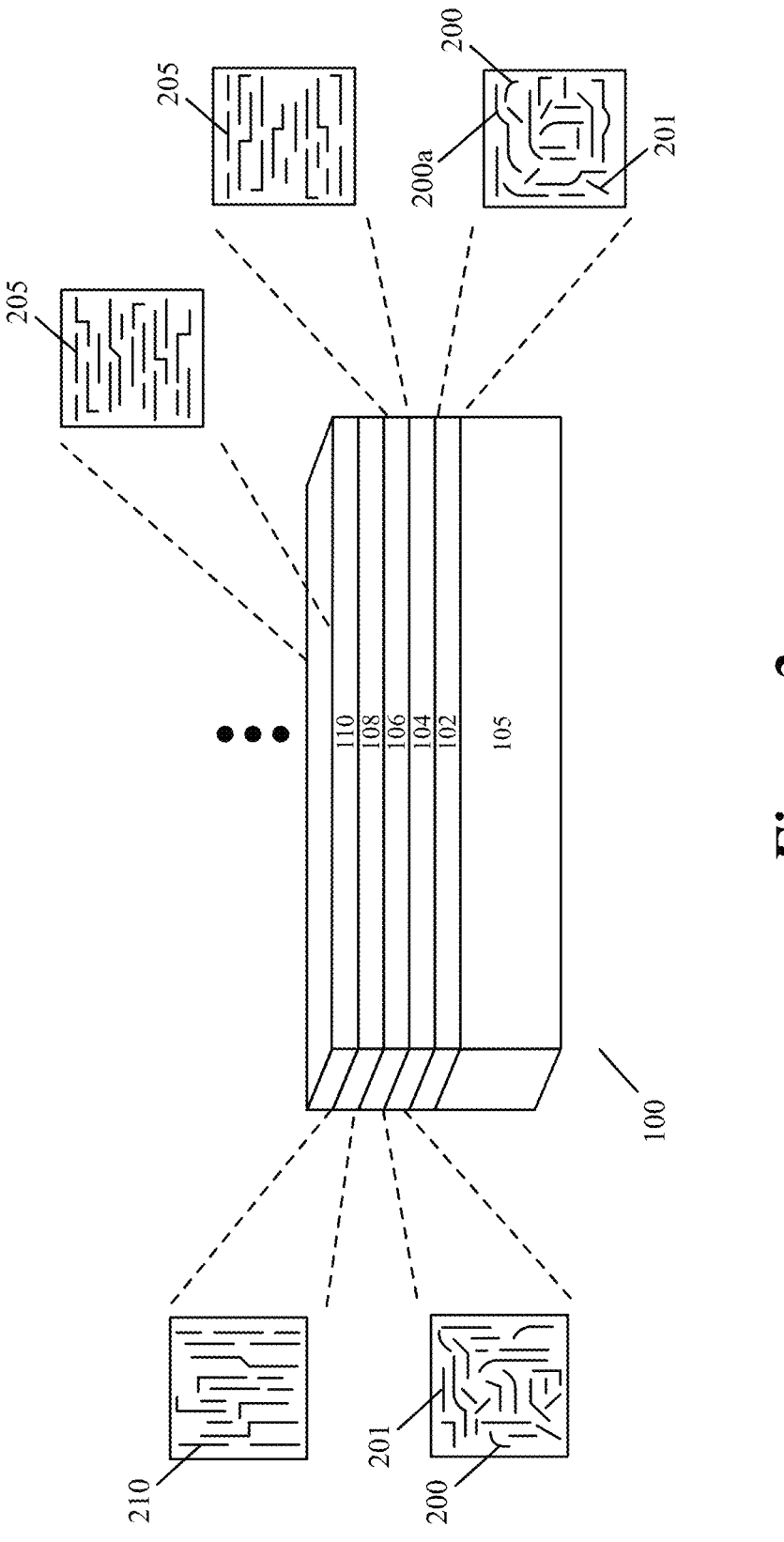
FIG. 2 illustrates example of curvilinear wires that are defined on the first and second layers of the IC, and horizontal and vertical wires that are defined on the third, fourth and fifth wiring layers of this IC in some embodiments.

FIG. 2 illustrates examples of curvilinear wires 200 that are defined on the first and second layers 102 and 104 of the IC 100, and horizontal and vertical wires 205 and 210 that are defined on the third, fourth and fifth wiring layers 106, 108 and 110 of this IC. In some embodiments, numerous electronic components (e.g., active components, like transistors and diodes, or passive components, like resistors and capacitors) are defined on the IC substrate, and these electronic components are connected to each other through interconnect wiring (e.g., wires 200, 205, and 210) on the wiring layers (e.g., layers 102-110 of IC 100) to form numerous microcircuits (e.g., Boolean gates) and/or larger circuits (e.g., functional blocks).

As such, the wires 200, 205, and 210 on the metal layers 102-110 are defined to electrically connect circuit nodes (e.g., points, contacts, terminals or regions of a circuit element or between two circuit elements of circuits) in order to form electrical components (e.g., transistors, diodes, etc.) and circuits. Wires on different metal layers are connected through one or more vias (not shown) in order to establish a contiguous electrical connection to connect two different nodes through wires that traverse different metal layers. Such a contiguous electrical connection can be viewed as a multi-layer wire or interconnect that traverses multiple wiring layers to connect two different electrical nodes of the IC.

As shown in FIG. 2, the first and second metal layers 102 and 104 have straight wire 201 and curved wire 200 that traverse in any possible direction. In some embodiments, the wires on these layers can traverse in any possible angle as these layers have no preferred wiring directions. Also, as depicted by curvilinear wire 200a on the first metal layer, one curvilinear wire can be formed by one or more straight wire segments and one or more curved wire segments on the metal layer. A curved wire segment in some embodiments is a segment that has a shape defined by a nonlinear equation. Also, in some embodiments, a curved wire segment is a continuously smooth wire segment that bends without the use of sharp angles.

Unlike the first and second metal layers 102 and 104, the third, fourth and fifth metal layers 106, 108 and 110 have preferred wiring directions and have wiring interconnects that traverse mostly in their preferred wiring directions, e.g., the third metal layer has mostly horizontal wires, the fourth metal layer has mostly vertical wires, and the fifth metal layer has mostly horizontal wires. A PD wiring layer can have wires that traverse in non-preferred directions. Accordingly, as shown in FIG. 2 and other figures described below, each PD wiring layer is shown to have a small amount of wires that traverse in non-preferred directions. These NPD wire segments on PD wiring layers are depicted in FIG. 2 and other figures as occasional small diagonal or Manhattan jogs on these layers in the non-preferred directions. These jogs can occur at the wire ends on a metal layer, or can occur in between two other wire segments on a metal layer. The Manhattan jogs that are defined in an IC design can result in curvilinear segments on the PD wiring layers of the manufactured IC as a result of manufacturing limitations.

Figure 3:
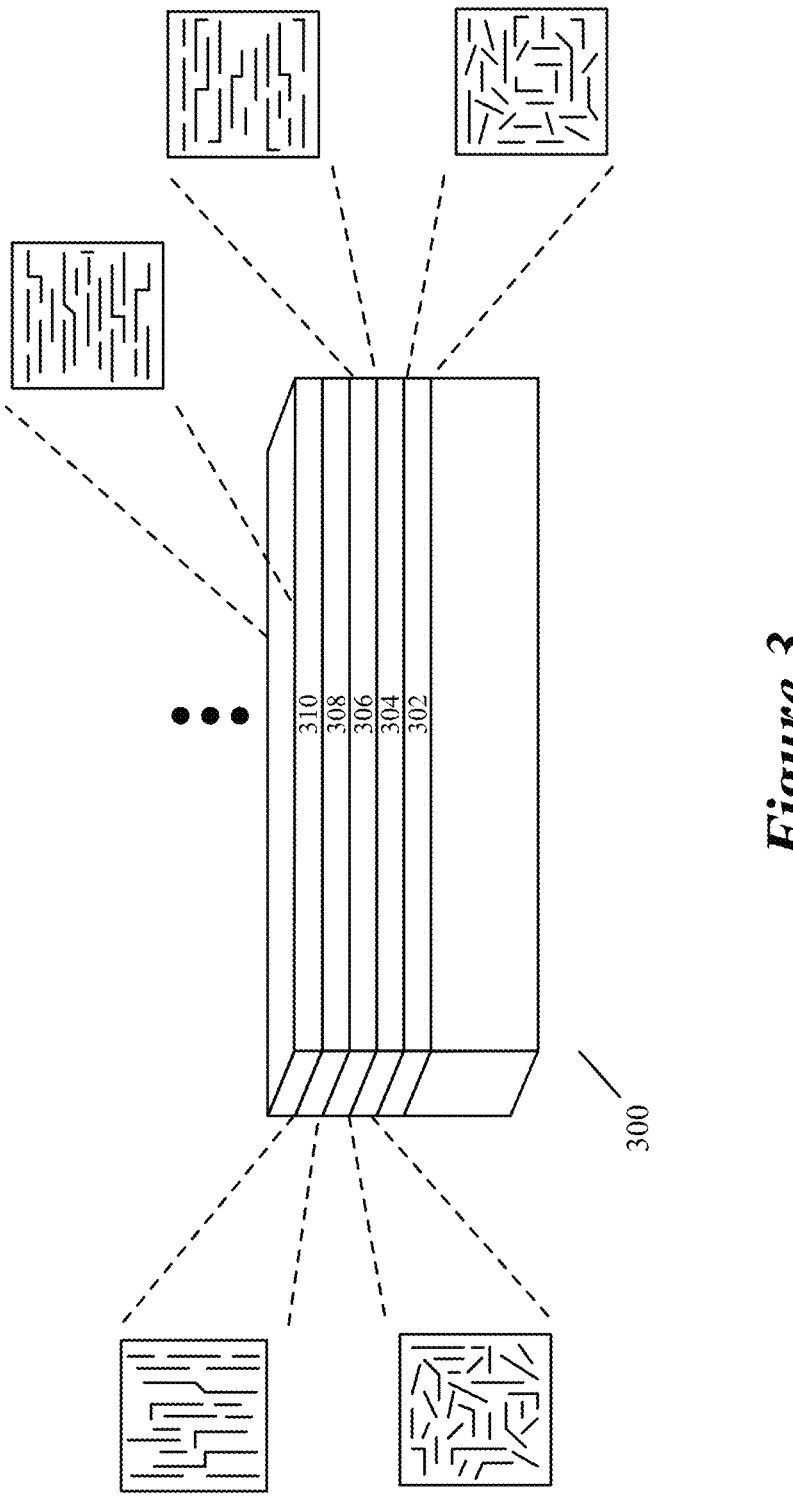
FIG. 3 illustrates another example of an IC that uses the novel NPD wiring architecture of some embodiments.

FIG. 3 illustrates another example of an IC 300 that uses the novel NPD wiring architecture of some embodiments. Like IC 100 of FIG. 1, the IC 300 has NPD wiring on the first and second layers 302 and 304, and traditional Manhattan PD wiring on its third, fourth and fifth layers 306, 308 and 310. However, unlike IC 100, the IC 300 only has straight wires defined on its first two layers 302 and 304. In other words, the EDA tools that define the wiring on these two layers did not define curvilinear wires on these layers and instead define only straight wires to traverse these layers 302 and 304. Manufacturing constraints might result in small curvilinear segments being inadvertently formed at the angled junctions between wire segments, but the EDA tools do not intentionally define such curvilinear segments.

Figure 4:
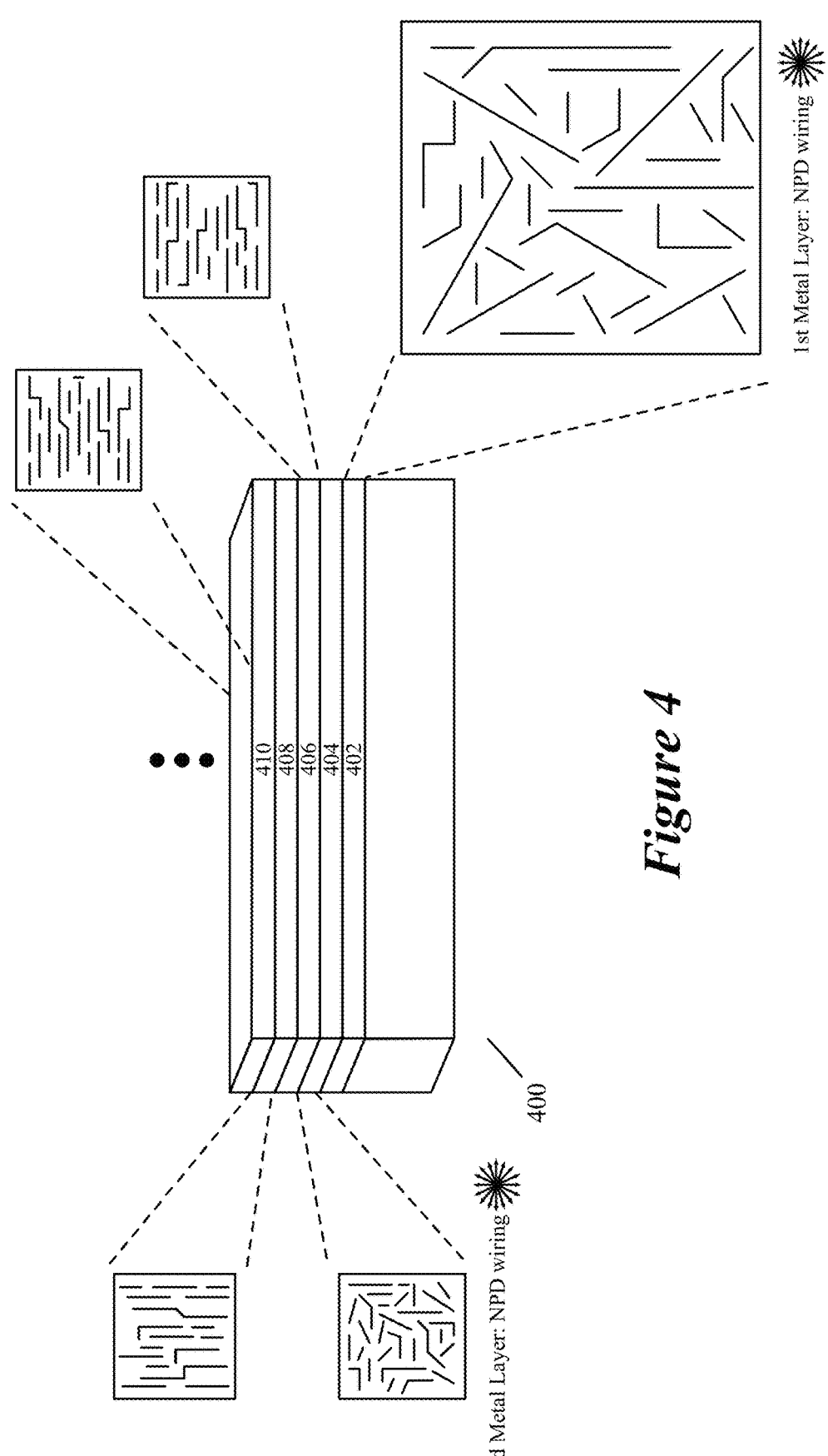
FIG. 4 illustrates an example of wires on the first two layers that can traverse in only 16 possible rectilinear directions.

In this example, the wires on the first two layers 302 and 304 traverse in all possible rectilinear directions (i.e., traverse in any angle between 0 to 360). In other embodiments, the wires on the NPD wiring layers (such as the first and second layers of FIG. 3) do not traverse in all possible rectilinear directions but rather traverse in a large number of rectilinear directions (e.g., ten, sixteen, twenty or larger number of rectilinear directions). For instance, FIG. 4 illustrates an IC 400 that is similar to the IC 300 of FIG. 3, except that the wires on the first two layers 402 and 404 can traverse in only 16 possible rectilinear directions (i.e., 0, 30, 45, 60, 90, 120, 135, 150, 180, 210, 225, 240, 270, 315, 330, and 360 degrees).

Figure 5:
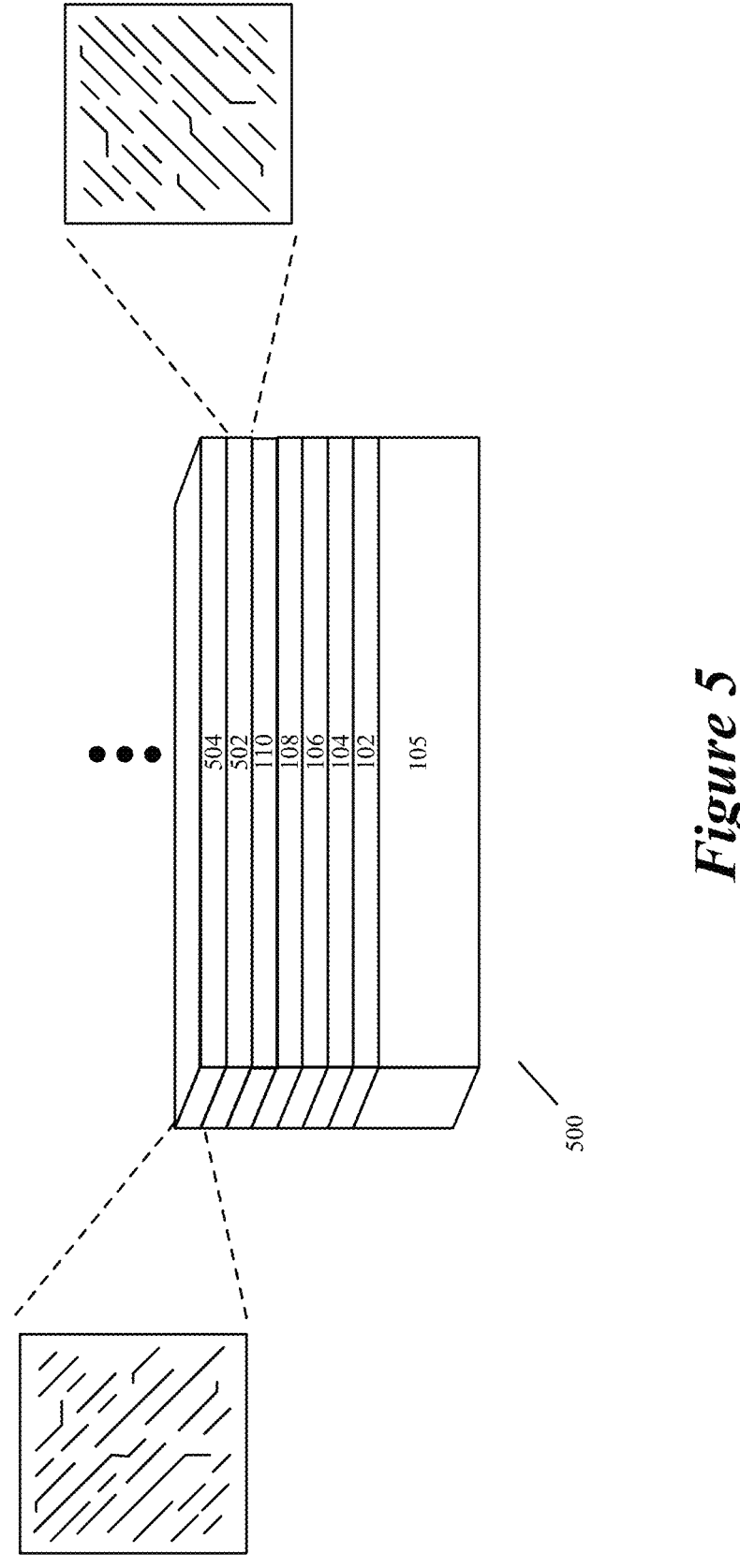
FIG. 5 illustrates an IC that uses 45 degree PD wiring on the sixth and seventh metal layers of the IC.

Other embodiments use other preferred direction wiring for the PD wiring layers, such as the third, fourth and fifth wiring layers of FIGS. 1-4. FIG. 5 illustrates an IC 500 that is like the IC 100 of FIG. 1, except that it uses 45 degree PD wiring on the sixth and seventh metal layers 502 and 504 of the IC. The sixth layer 502 has 45 degree PD wiring, while the seventh layer 504 has −45 degree PD wiring. Still other embodiments use other preferred directions on the metal layers with the PD wiring (e.g., use 60 degree wiring). In some embodiments, the NPD wiring layers of the IC (e.g., first and second wiring layers 102 and 104 of the IC 100) are predominantly used for short local connections, while the PD wiring layers are predominantly used (e.g., the third, fourth and/or fifth wiring layers 106, 108, and 110) are used for longer connections.

Figure 6A:
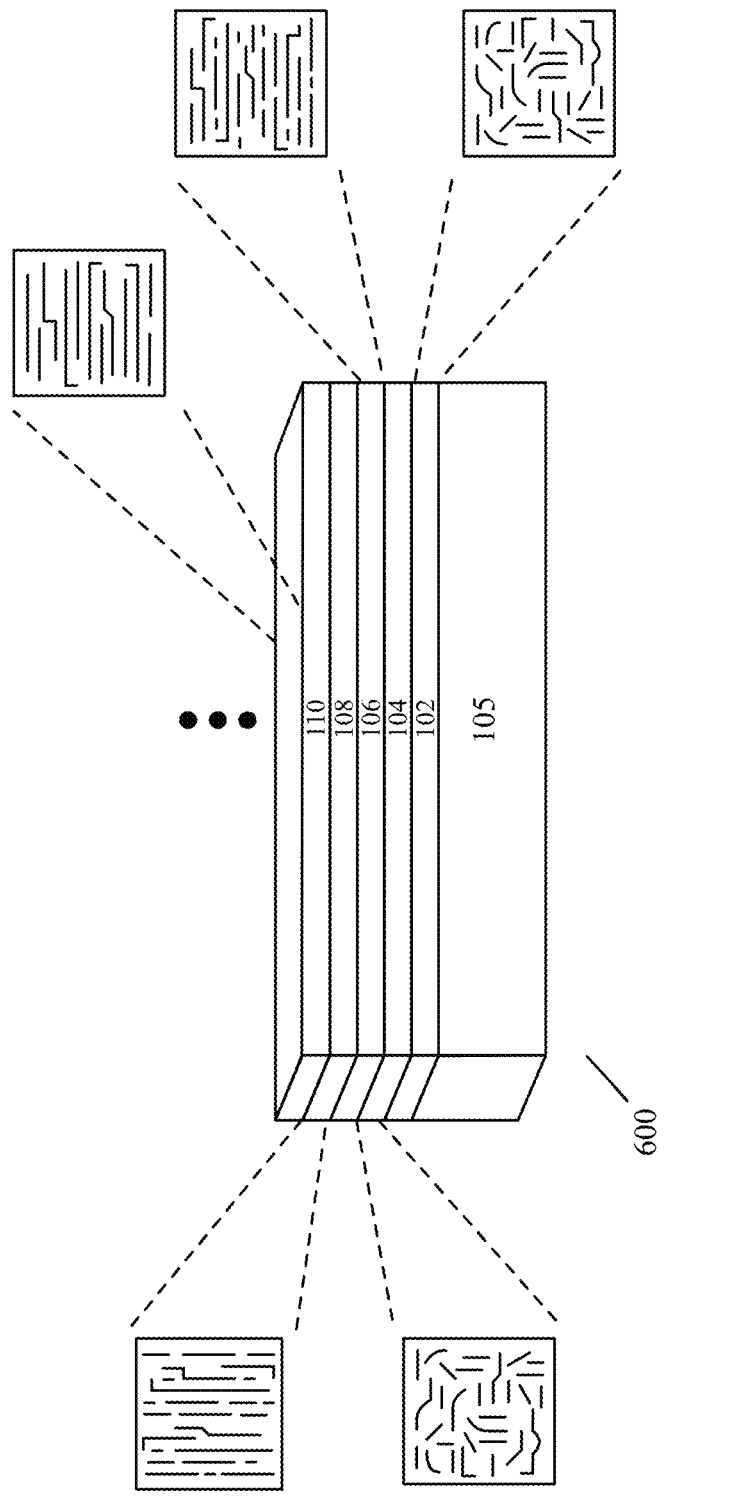
FIG. 6A illustrates an example of an IC that has predominantly shorted wires on the first and second metal layers and predominantly longer wires on the fifth metal layer.

FIG. 6A illustrates an example of an IC 600 that has predominantly shorter wires on the first and second wiring layers 102 and 104 for facilitating local connections between the underlying circuit nodes, and uses predominantly longer wires on the fifth wiring layer 110 for longer connections between the circuit nodes. The third and fourth wiring layers

106 and 108 in this example have a combination of shorter length wires, intermediate length wires and longer wires. The shorter wires on these layers 106 and 108 are used to connect nearby circuit nodes that cannot be connected through wiring on the NPD wiring layers 102 and 104 due to congestion on these layers. The wires on one metal layer (e.g., the shorter wires on the third layer 106) connects to wires on other metal layers (e.g., wires on the first and second layers 102 and 104) through vias to form contiguous electrical connections to connect circuit nodes.

In some embodiments, the router that defines the wiring on the metal layers of the IC 600 defines rectilinear and curvilinear wires for the first and second wiring layers of the EDA design of the IC 600. For all other metal layers, the router only defines rectilinear routes, which may occasionally have Manhattan or diagonal jogs that when manufactured appear as curvilinear jogs. Notwithstanding these occasional, unintentional curvilinear jogs, the IC 600 does not have as many curvilinear wire segments on metal layers 3 and above as it does on metal layers 1 and 2.

Figure 6B:
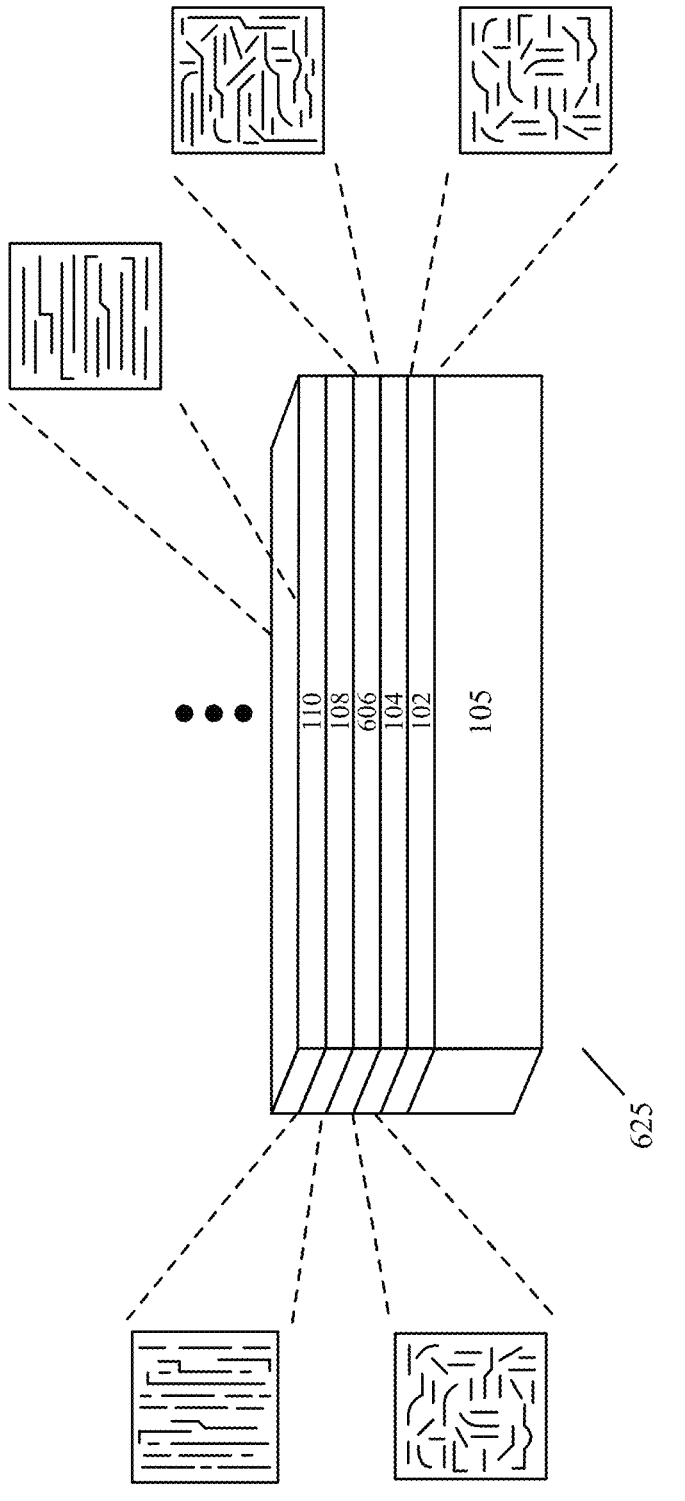
FIG. 6B illustrates an example of an IC that has NPD curvilinear wiring on the first, second and third metal layers and PD wiring on fourth and fifth metal layers.
Figure 6C:
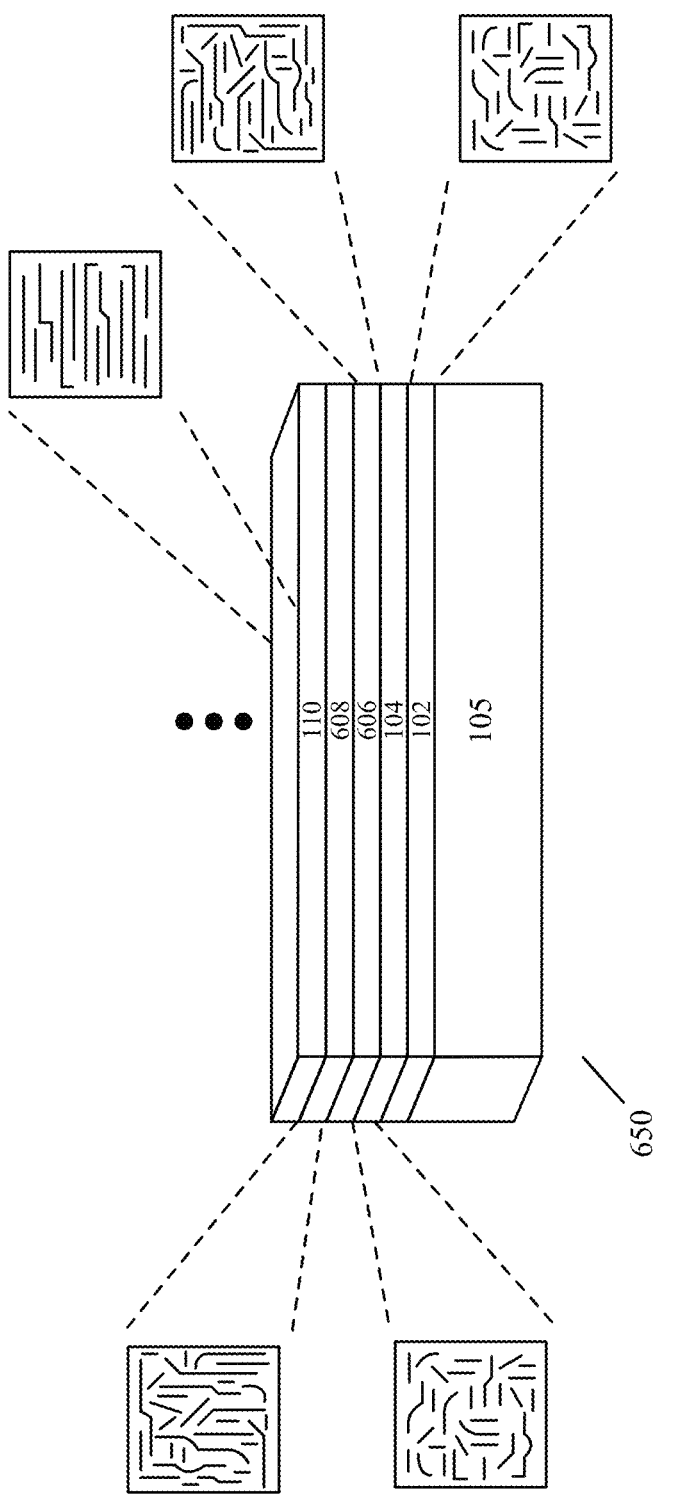
FIG. 6C illustrates an example of an IC that has NPD curvilinear wiring on the first, second, third and fourth metal layers and PD wiring on fifth and higher metal layers.

This is not the case in other embodiments. For instance, in some embodiments, the router employs a wiring model in which the third wiring layer is the wiring layer that predominantly uses NPD curvilinear wiring. FIG. 6B illustrates an example of an IC 625 that had its design defined by EDA tools (e.g., routers) that used NPD curvilinear wiring on the first, second and third wiring layers 102, 104 and 606. In other embodiments, the router employs a wiring model in which the third and fourth wiring layers are the wiring layers that predominantly use NPD curvilinear wiring. FIG. 6C illustrates an example of an IC 650 that had its design defined by EDA tools (e.g., routers) that used NPD curvilinear wiring on the first, second, third, and fourth wiring layers 102, 104, 606 and 608.

For both the scenarios illustrated in FIGS. 6B and 6C, the routers of some embodiments not only define rectilinear and curvilinear NPD routes on the third wiring layer, or the third and fourth wiring layers, but also define rectilinear and curvilinear NPD routes on the first and second wiring layers. However, in some embodiments, the first and second wiring layers are entirely open during routing for rectilinear or curvilinear NPD routes.

In other embodiments, the first and second wiring layers are not entirely open during routing for rectilinear or curvilinear NPD routes. For instance, the first two wiring layers in some embodiments have regions that are used for rectilinear or diagonal PD wiring. These regions, for example, include regions used by wires that connect circuit blocks (e.g., the IP blocks) that are typically defined on the substrate at locations below these regions. Hence, in such embodiments, the NPD routers not only define rectilinear and curvilinear NPD routes on the third wiring layer, or the third and fourth wiring layers, but also opportunistically define rectilinear and curvilinear NPD routes in the unused spaces on the first and second wiring layers that are not used for the PD wiring that is needed to define the circuit blocks (e.g., the IP blocks) of the IC.

In still other embodiments, the first and second wiring layers only have PD wiring as they are only routed by PD routers. In these embodiments, the only wiring layers that are NPD wiring layers are the layers above the first and second wiring layers. For instance, in some embodiments, the third and fourth wiring layers are NPD wiring layers with NPD rectilinear and curvilinear wires, while all other layers are PD wiring layers with PD rectilinear wires. In addition to the third and fourth wiring layers, the IC and IC design of other embodiments have one or more other higher wiring layers as NPD wiring layers with NPD rectilinear and curvilinear wires.

Figure 6D:
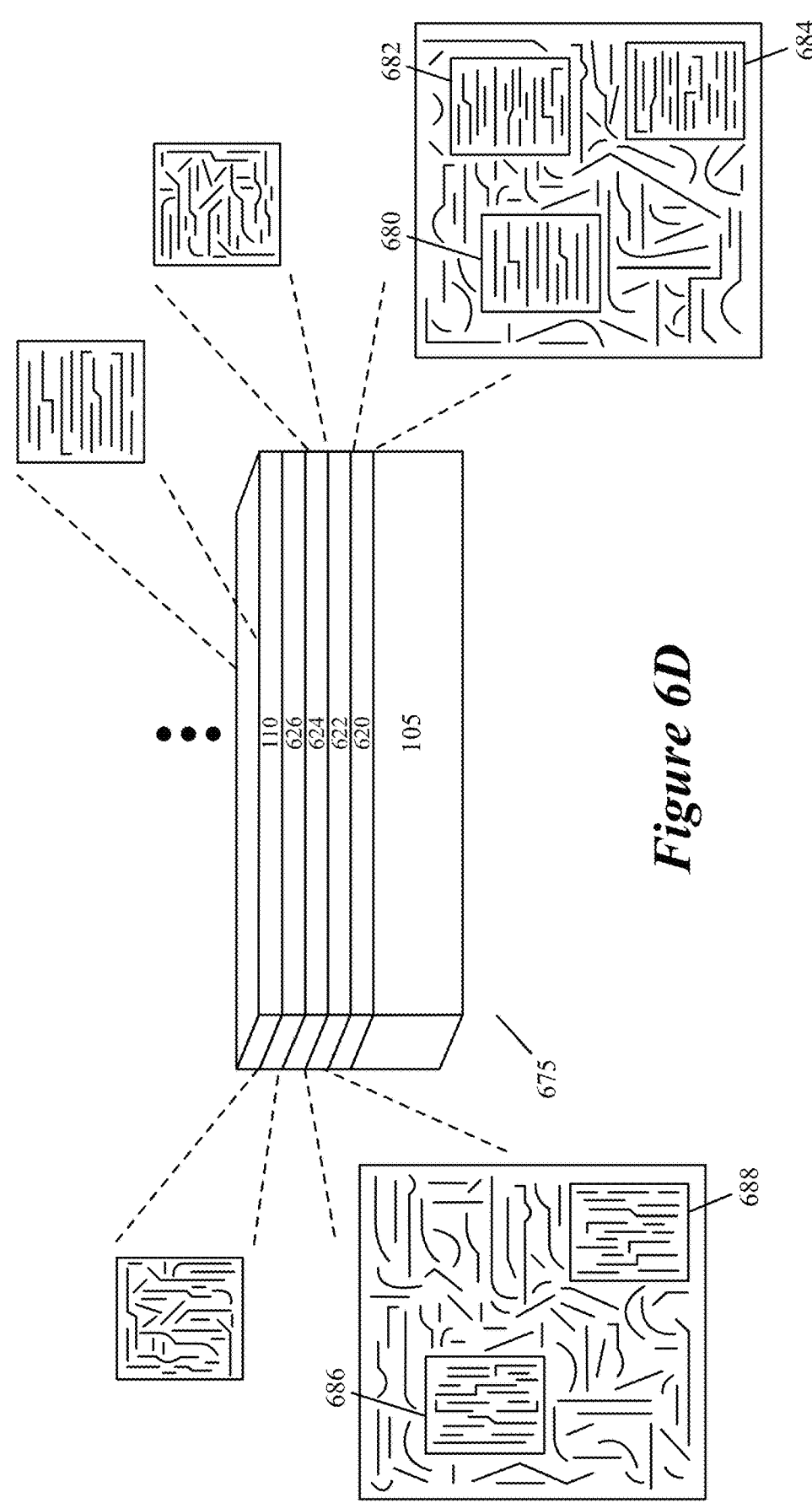
FIG. 6D illustrates an example of an IC that has NPD rectilinear and curvilinear wiring on the third and fourth wiring layers and, in addition, rectilinear and curvilinear wiring on the first and second wiring layers in areas that are not occupied for PD wiring on these layers.

FIG. 6D illustrates one such example. This figure illustrates an IC 675 that has NPD rectilinear and curvilinear wiring on the third and fourth wiring layers 624 and 626 that were designed using NPD routing for the entirety of the third and fourth wiring layers. In addition to these NPD wiring layers, the IC 675 has NPD rectilinear and curvilinear wiring on the first and second wiring layers 620 and 622 in areas that are not occupied for PD wiring on these layers. As shown, the first wiring layer 620 has three regions 680, 682, and 684 with PD wiring, while the second wiring layer 622 has two regions 686 and 688 with PD wiring. As further shown, the IC 675 has NPD rectilinear and curvilinear wiring in the rest of areas on the first and second wiring layers 620 and 622 that fall outside of the regions 680-688. In some embodiments, the NPD router that defines the NPD routes on the third and fourth wiring layers 624 and 626 also opportunistically defines NPD rectilinear and curvilinear routes in the areas on the first and second wiring layers 620 and 622 that are not used for the PD wiring of the IC's circuit blocks.

In some embodiments, the NPD router uses the lower NPD wiring layers (i.e., the first through fourth wiring layers) predominantly for short local connections, while using the higher PD wiring layers (i.e., the fifth and higher wiring layers) predominantly for longer connections. The NPD router in some of these embodiments uses the first and second wiring layers for very short connections that can start and end in one contiguous unused space on one or both of these wiring layers, and then uses the third and fourth wiring layers for short connections that cannot be made by using one contiguous unused space on the first and second wiring layers. In some embodiments, the first and second wiring layers have many more PD wiring regions than those illustrated in FIG. 6D as the IC has many more IP blocks that use such PD wiring on the IC's lower wiring layers. Also, in some embodiments, the IP blocks use PD wiring on other metal layers (e.g., the third and/or fourth metal layers).

In FIGS. 6A-6D, the ICs have PD wiring on the higher metal layers such that after the last NPD metal layer, all subsequent metal layers have PD wiring. This is not the case in other embodiments. For instance, the IC of some embodiments has one or more of its highest metal layers and one or more of its lowest metal layers as NPD metal layers, while having PD metal layers between these highest and lowest NPD metal layers. The NPD metal wiring on these highest and lowest metal layers are manufactured in some embodiments based on NPD rectilinear or curvilinear routes that NPD routers define on the wiring layers (of the EDA design) corresponding to these metal layers. In one such embodiment, the IC has exterior pins defined above its last metal layer, and the top NPD metal layer uses NPD rectilinear and curvilinear wiring (defined based on rectilinear and curvilinear NPD routes) as the most optimal interconnects (e.g., shortest length and/or shortest delay wiring) to connect the exterior pins to via locations on the top layer, to allow signals to quickly traverse down or up the metal layers from or to the pins.

Figure 7:
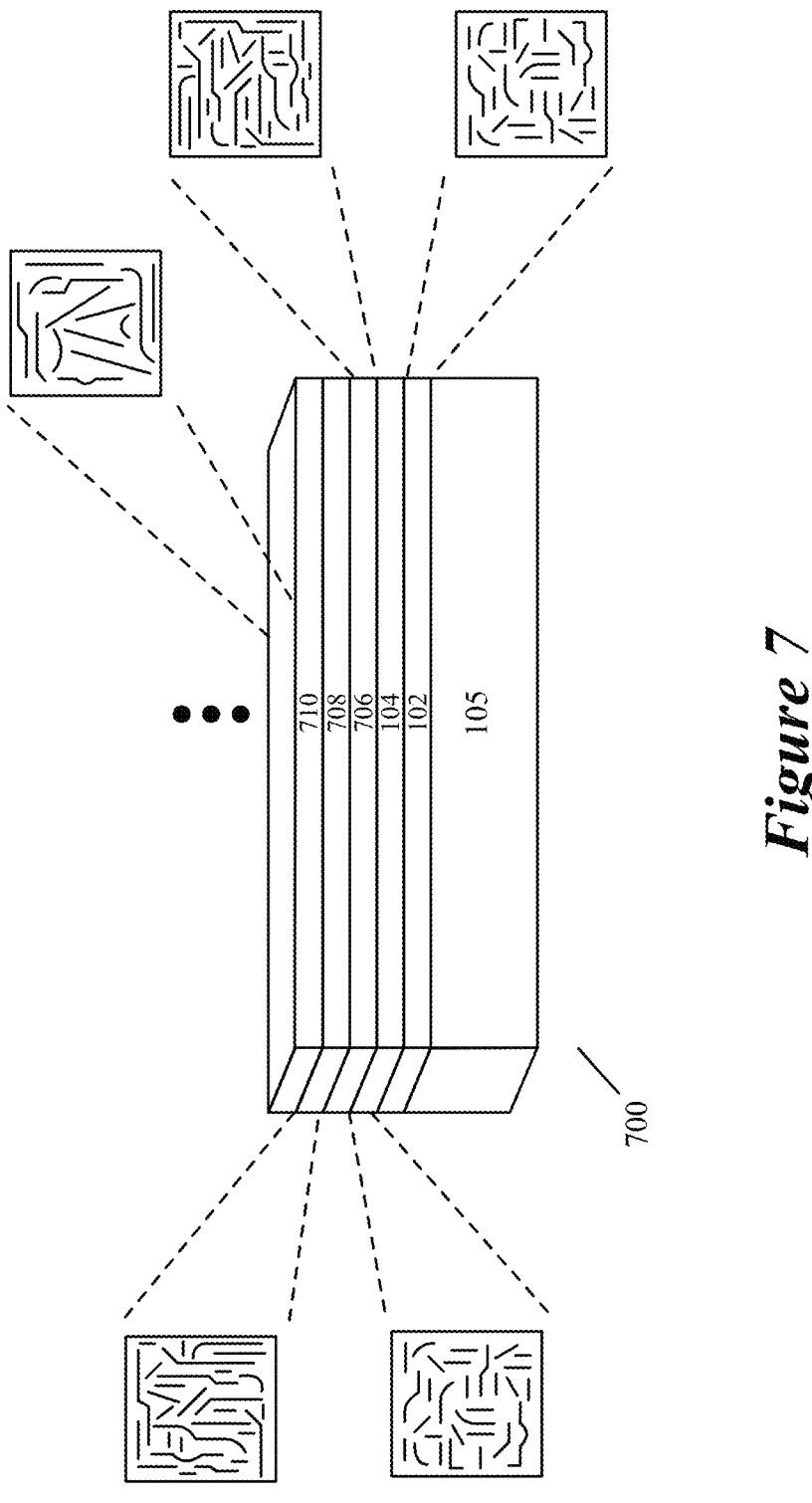
FIG. 7 illustrates an example of an IC where all of its metal layers are NPD metal layers that have all angle rectilinear wiring and curvilinear wiring.

FIG. 7 illustrates another example of an IC with NPD metal layers beyond the first through fourth metal layers. In this figure, the IC 700 is similar to the IC 600 except that all of its metal layers are NPD metal layers that have all angle rectilinear wiring and curvilinear wiring. Like IC 600 of FIG. 6A, the IC 700 has predominantly shorter wires on the first and second wiring layers 102 and 104 for facilitating local connections between the underlying circuit nodes, and has longer wires on its third, fourth and fifth wiring layer 706, 708 and 710. The fifth wiring layer 710 has longer wires, while the third and fourth wiring layers 706 and 708 have a combination of shorter length wires, intermediate length wires and longer wires.

In FIG. 7, the shorter wires on the third and fourth layers are used to connect nearby circuit nodes that cannot be connected through the wiring on the first and second wiring layers 102 and 104 due to congestion on these layers. Also, the wires on one metal layer (e.g., the shorter wires on the third layer 706) connects to wires on other metal layers (e.g., wires on the first and second layers 102 and 104) through vias to form contiguous electrical connections to connect circuit nodes.

As mentioned above, some embodiments use several EDA tools to define the IC designs that when manufactured result in the ICs illustrated in FIGS. 1-7. These EDA tools base their operations on wiring models that define PD and/or NPD rectilinear wiring and/or curvilinear wiring for each wiring layer of the IC design. For some embodiments, the wiring models illustrated for the ICs in FIGS. 1-7 correspond to the wiring models that the EDA tools use when they design the ICs.

The IC in some embodiments includes several multi-layer interconnect junctions to enable interconnect wiring to traverse from the lower curvilinear non-preferred direction wiring layers (e.g., first and second wiring layers) to the higher, preferred direction wiring layers (e.g., third and fourth wiring layers). The multi-layer interconnect junctions in some embodiments are positioned on the IC according to a particular arrangement, such as an array. Each multi-layer interconnect junction in some embodiments includes several vias that connect a curvilinear non-preferred direction wiring layer (e.g., one of the first and second layers) to a preferred direction wiring layer (e.g., one of the third and fourth layers). Each such conjunction in some embodiments also includes vias that connect two curvilinear non-preferred direction wiring layers and/or two preferred direction wiring layers.

The IC in some embodiments includes several buffers that are defined within a threshold distance from each of several multi-layer interconnect junctions. These buffers are used to drive signals on longer interconnect wiring on the preferred direction wiring layers (e.g., the third and fourth wiring layers). The IC in some embodiments also includes several buses on the first wiring layer and/or second wiring layer, with each bus allowing interconnect connections on first and second wiring layers to circumvent at least one multi-layer interconnect junction.

In some embodiments, the wiring connections on lower NPD wiring layers (such as third and fourth layers, or first to fourth layers) are defined with a NPD first router, while the wiring connections on the upper PD wiring layers (such as layer five and higher) are defined by a PD second router (e.g., a Manhattan router). The NPD first router produces routes on each of the lower layers that traverse more than eight different directions on each of these layers. The first router in some embodiments also produces curvilinear routes on the lower wiring layers. The use of such routers is further described below.

FIG. 8 illustrates a routing process 800 that defines routes to connect a net list associated with a design of an IC. A netlist identifies several nets, with each net corresponding to two or more nodes in the IC design that need to be connected by one or more routes. As shown, the process 800 uses (at 805) a first non-preferred direction router to define routes on a lower first set of wiring layers, and uses (at 810) a second preferred-direction router to define routes on a higher second set of wiring layers. In some embodiments, the second router (used at 810) is one of the commercially available routers sold today, e.g., routers sold by Cadence, Inc. or Synopsys, Inc.

In some embodiments, the first set of wiring layers include the first and second wiring layers while the second set of one or more wiring layers include the third to seventh wiring layers. In other embodiments, the first set of wiring layers includes first to third wiring layers while the second set includes fourth to seventh wiring layers. In still other embodiments, the first set of wiring layers includes first through fourth wiring layers while the second set includes fifth to seventh wiring layers.

As mentioned above, the first and second wiring layers in some embodiments include PD wiring (e.g., Manhattan wiring) for circuit blocks (e.g., IP blocks) used on the IC design. In these embodiments, the NPD router uses the space available on the first and second wiring layers to define NPD routes (e.g., rectilinear or curvilinear NPD routes), and also uses the third metal layer, and fourth metal layer when the fourth layer is available for NPD wiring, to define NPD routes.

In other embodiments, the first set of wiring layer includes only the third wiring layer or the third and fourth wiring layers, and do not include the first and second wiring layers. In some embodiments, only one or more of the lower wiring layers are used to define NPD rectilinear or curvilinear routes. Other embodiments, on the other hand, allow one or more of the top wiring layers to be used to define NPD routes, as further mentioned above.

Also, in some embodiments, the first router (used at 805) is formed by two routing components, a topological router and a geometric router. A topological router in some embodiments tessellates each IC design layer into several polygons (also called faces), and then defines topological routes (to connect nets) by reference to the edges of the tessellated layers. A particular topological route has its position defined in terms of its relative position with respect to other topological routes along the edges crossed by the particular topological route. The topological router of some embodiments also uses nodes associated with faces of the polygons to model vias between wiring layers traversed by topological routes. In these embodiments, the topological routes are defined by not only the edge but also the face nodes and their relative position with respect to each other by reference to these edges and face nodes.

In some embodiments, each particular topological route is also defined by the coordinates of a pair of nodes (of the netlist) connected by the topological route, or just by reference to the pair of nodes as the starting and ending point of the topological route. This specific starting and ending points of a topological route differentiates a topological route from a global route. Also, another feature that differentiates a topological route from a global route is that the topological route has segments (defined by references to tessellated edge crossings) that are associated with specific wiring layers (e.g., different segments of a topological route in some embodiments can be on different wiring layers). Global routes, on the other hand, can be defined without reference to particular wiring layers crossed by those routes.

The geometric router in some embodiments then defines a geometric realization for each topological route by snapping the topological route to a grid (imposed on the wiring layers) along the allowed wiring directions for the layer. In the embodiments that allow curvilinear segments, this snapping allows for wire segments to be curvilinear. In some embodiments, a topological route does not have any width or specific coordinates for its segments, other than the coordinates of the two nodes (e.g., two pins) connected by the topological route. Instead of snapping each topological route to a grid, the geometric router in some embodiments defines a width for each topological route, and then leaves it to a subsequent compactor to geometrize fully the route (e.g., to produce a full geometric definition of the route). In some such embodiments, the geometric router defines for each topological route some intermediate coordinates for the route so that the geometric route that it produces for the topological route not only has some width but also has one or more intermediate coordinates that define two or more route segments. One topological route can have many different geometric realizations (i.e., one topological route can be associated with many geometric routes).

In some embodiments, the routes on the non-preferred direction lower wiring layers traverse in more than eight directions (e.g., 20, 90, 180, 360, etc. directions). These routes on some or all of the lower layers are all rectilinear (e.g., the first two wiring layers) in some embodiments, while the routes on all of the lower layers (e.g., the first four wiring layers) include curvilinear and rectilinear routes in other embodiments.

In some embodiments, the routes defined by the first router connect node pairs that are within a threshold distance of each other, while the routes defined by the second router connect node pairs that are more than the threshold distance from each other. To connect the node pairs that are more than a threshold distance from each other, the routing process 800 uses both the first and second routers, e.g., uses the first router to define the route segments that traverse along the lower non-preferred direction wiring layers, and uses the second router to define the route segments that traverse along the upper preferred direction wiring layers. To facilitate the operation of the second router in cases where the second router has to complete a route that is partially completed by the first router, the first router in some embodiments defines one or more of its NPD route segments on the first set of wiring layers up to locations used on these layers to via to the second set of wiring layers. The second router then commences its routing operations from these via locations in order to complete the routes that were only partially completed by the first router.

Some embodiments first define the routes that traverse the lower first set of wiring layers of the IC design and then define the routes that traverse the higher wiring layers of the IC design. For instance, some embodiments perform global routing, and then perform a first NPD detailed routing followed by a second PD detailed routing. Other embodiments perform NPD detailed routing for the lower first set of wiring layers of the IC design without first performing global routing for these layers. These embodiments then perform PD global routing, and after the global routing, perform PD detailed routing to define PD routes that use the higher second set of wiring layers of the IC design.

The NPD detailed routing in some embodiments does not restrict its path search processes to search only one or more preferred wiring directions or penalize the other wiring directions on the first set of wiring layers. On this set of wiring layers, the NPD detailed routing in some embodiments produces curvilinear routes as it allows its path search to explore any angle for its route expansion, and then subsequently geometrized through the use of curvilinear wire segments. In other embodiments, the NPD detailed routing only explores path searches in a large, finite number of wiring direction, such as nine or more wiring directions, and does not produce designs with curvilinear route segments.

In some embodiments, the global and detailed routing for the PD wiring layers uses Manhattan preferred directions, while in other embodiments the global and detailed routing for the PD wiring layers uses other preferred direction wiring (e.g., 45 or 60 degree wiring instead of or in conjunction with horizontal and vertical direction wiring). In some embodiments, the first set of wiring layers include the first two metal layers of the IC design, and the second set of wiring layers are metal layers three and higher of the IC design. In other embodiments, the first set of wiring layers include more than the first two metal layers of the IC design, e.g., include layers 1 to 4.

In some embodiments, the first set of wiring layers include first and second subset of layers (e.g., includes the third wiring layer and the fourth wiring layer). In these embodiments, the method performs the detailed routing for the first set of wiring layers by performing a first detailed routing operations for the first subset of layers (e.g., for the third wiring layer), and after completing the first detailed routing operation, performing a second detailed routing operation for the second subset of layers (e.g., for the fourth wiring layer). The method in some embodiments performs the first and second detailed routing operations by using an NPD detailed router to perform the first detailed routing operation, and then recursively calling the NPD detailed router to perform the second detailed routing operation.

FIG. 9 illustrates a routing process 900 of some embodiments that only uses detailed routing to define NPD routes for a number of nets on a first set of lower wiring layers, and then uses global routing and detailed routing to define PD routes for the remaining nets on the first set of lower wiring layers and a second set of higher wiring layers. As shown, the process 900 starts by performing (at 905) NPD detailed routing for several nets on the lower first set of wiring layers of the IC design without first performing global routing for these nets on the lower first set of wiring layers. As further described below by reference to FIG. 10, the NPD detailed routing operation (at 905) tries to connect as many nets as possible through wire segments on the first set of wiring layers (e.g., the first three metal layers or the first four metal layers).

To do this NPD routing, the process 900 sorts the nets based on the estimated length of routes for connecting each net (i.e., based on the estimated wirelength for connecting each net). Examples of using heuristics to compute estimated wire lengths for the nets are provided below by reference to FIG. 18. The sorted order is an ascending order with the nets having the shorter estimated lengths higher on the order than the nets with longer estimated lengths. Based on this order, the NPD routing process iteratively selects as many nets as possible starting at the top of the order with the shorter nets, and tries to define NPD routes for the selected nets on the lower first set of wiring layers. The NPD detailed routing operation in some embodiments does not explore routes that use wire segments on the second set of higher wiring layers (e.g., the fifth and higher metal layers). In some embodiments, the second set of higher wiring layers is reserved for the PD detailed routing that is performed at 915, as further described below.

In some embodiments, the NPD detailed routing explores all-angle of wiring directions as it does not use any preferred wiring directions. On the first two layers, the NPD detailed routing explores the all-angle wiring in spaces that are not occupied on these layers for the circuit blocks that have predefined wiring, such as IP blocks that come with pre-defined PD wiring in some embodiments.

In some embodiments, the NPD detailed routing produces curvilinear routes as it explores curvilinear directions during its path searches. Alternatively, in some embodiments, the NPD detailed routing produces curvilinear routes because after its topological router identifies a topological route by reference to several tessellated edges and faces, the geometric router embeds the topological route as a geometric route with one or more rectilinear route segments and/or curvilinear route segments, based on whichever is more optimal. In some embodiments, the geometric router only defines an initial geometric route for each topological route, and leaves the final definition of the geometric route for a post-processing operation, such as a compaction operation that follows. As further described below, the post-processing operation in some embodiments defines the geometric routes based on one or more criteria, such as compacting the design to reduce the overall die size, or spreading the routes to reduce the capacitive coupling between nearby wires.

In some embodiments, the NPD detailed routing only explores routes in a finite number of wiring direction, such as nine or more wiring directions, and does not produce designs with curvilinear route segments. In some embodiments, the NPD detailed routing is performed by an NPD detailed router that is formed by a topological router and a geometric router, as described above.

After performing the NPD detailed routing at 905, the process 900 performs (at 910) PD global routing for the remaining unrouted nets in the IC design, and after the global routing, performs (at 915) PD detailed routing for these nets. The purpose of this global routing in some embodiments is to identify routes for nets for which routes were not identified by the NPD routing at 905 (e.g., nets with nodes separated by a threshold distance that would not be appropriate for routing through the first set of wiring layers) or for nets that did not have complete routes defined by the NPD detailed routing at 905.

The PD detailed routing (at 915) in some embodiments performs path searches and identifies route segments (i.e., wire segments) on all the available wiring layers (i.e., on the first and second set of wiring layers) but only along preferred wiring directions that it associates with each wiring layer. In other embodiments, the PD detailed routing (at 915) performs path searches and identifies route segments (i.e., wire segments) on the second set of higher PD wiring layers (e.g., the fifth or higher metal layers) and does not explore route segments on the first set of lower wiring layers. However, the route segments that the detailed routing identifies on the second set of wiring layers often connect to route segments that the NPD detailed routing defined on the first set of wiring layers.

Like the PD detailed routing (at 915) of some embodiments, the PD global routing (at 910) defines global routes that can partially traverse all available wiring layers but only along the preferred wiring direction that the global router associates with each wiring layer. Alternatively, the PD global routing (at 910) in other embodiments defines its global routes with respect to the second set of higher wiring layers that only has PD wiring. As mentioned above, in some embodiments the first set of wiring layers are the first four metal layers of the IC design, and the second set of wiring layers are metal layers five and higher of the IC design. In other embodiments, the first set of wiring layers just include the first two or three metal layers of the IC design, or just include the third and/or fourth metal layers.

In some embodiments, the global routing defines global routes traversing multiple layers as the global routes are defined by reference to a three-dimensional global routing grid. In other embodiments, the global routing uses a two-dimensional grid to define two-dimensional global routes. In some of these embodiments, the different edges of the global route that are along different preferred wiring directions are associated with the wiring layers that are associated with those directions.

In some embodiments, the global and detailed routing operations at 910 and 915 use Manhattan preferred directions. Examples of routers that perform the global and detailed routing operations at 910 and 915 include global and detailed routers sold by Cadence, Inc. or Synopsys, Inc. In other embodiments, the global and detailed routing operations at 910 and 915 use other preferred direction wiring (e.g., 45 or 60 degree wiring instead of or in conjunction with horizontal and vertical direction wiring).

Figure 10:
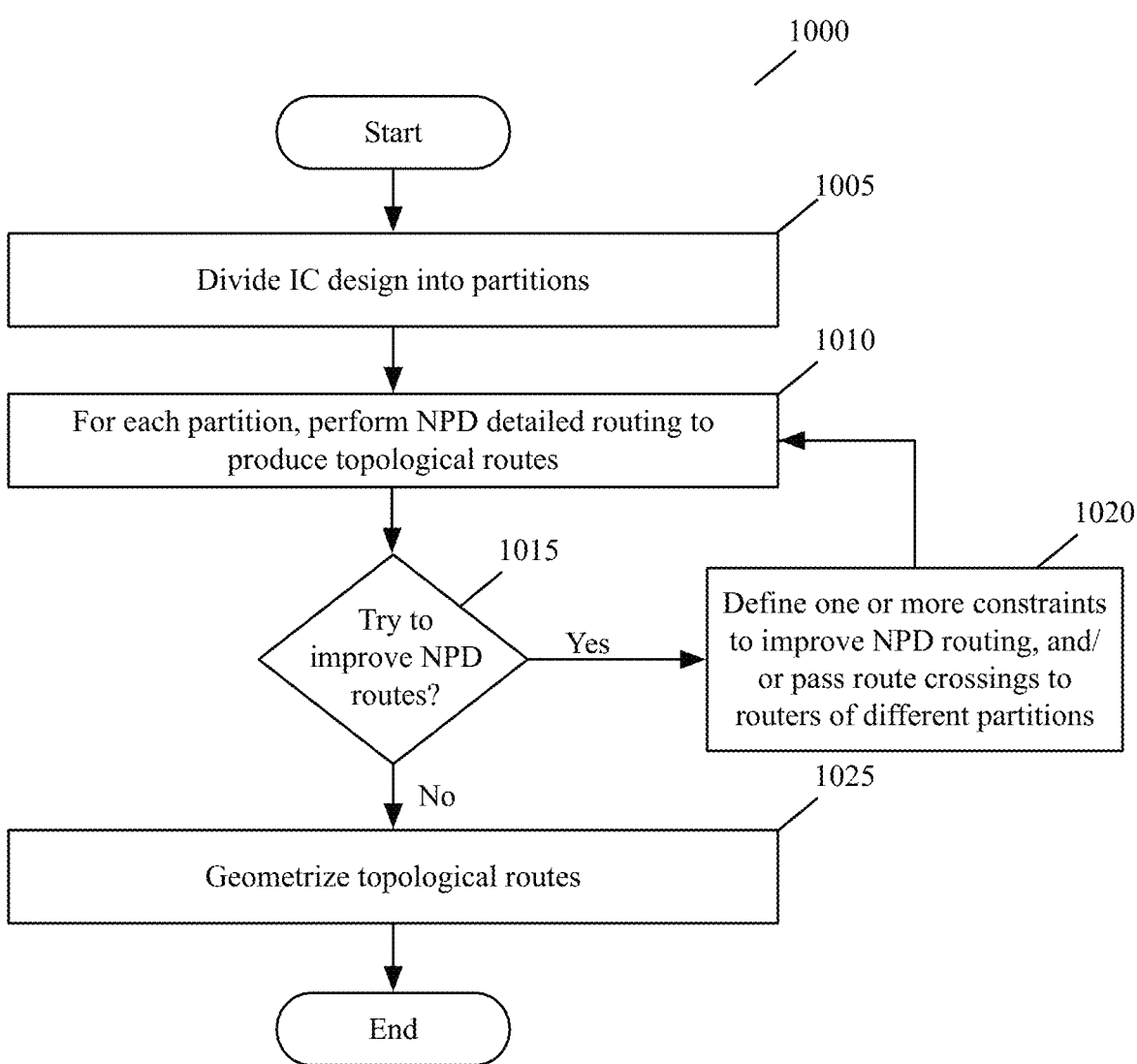
FIG. 10 illustrates an NPD detailed routing process of some embodiments.

FIG. 10 illustrates an NPD detailed routing process 1000 of some embodiments. This process is used (at 905) in some embodiments to define NPD routes on a set of one or more NPD wiring layers. As shown, this process initially divides (at 1005) the IC design into several partitions. FIG. 11 illustrates an example of a portion 1100 of an IC design that is partitioned into nine partitions. Next, for each identified partition, the process calls (at 1010) an instance of an NPD detailed router to identify NPD topological routes to connect each net with nodes that fall in the identified partition.

As mentioned above, the NPD detailed routing of the first set of wiring layers in some embodiments performs a topological routing operation to identify topological routes. For each partition that it has to route, the topological NPD detailed router of some embodiments first tessellates the partition into a plurality of shapes (e.g., polygons such as triangles) and then defines the topological routes with respect to the edges of the tessellated shapes. In some embodiments, the topological router tessellates the partitions into different shaped polygons than the polygons that are used to divide the IC, e.g., in some embodiments, the partitions are rectangular while the tessellated shapes are triangular. In other embodiments, the tessellated polygons and the partition polygons have the same shape (e.g., are rectangles) but the tessellated polygons are smaller so that numerous tessellated polygons are within each partition polygon.

After the topological routes have been defined for each net being routed by the NPD detailed router, the NPD detailed router performs a geometric routing operation to embed each defined topological route in the IC design as a geometric route, as further described below by reference to the operation 1025 of FIG. 10.

In some embodiments, the NPD detailed router defines NPD topological routes on multiple wiring layers simultaneously (e.g., on the first four wiring layers simultaneously). Hence, in these embodiments, the NPD topological routes that are defined at 1010 can traverse any of the first set of wiring layers. As further described below by reference to FIG. 12, the NPD detailed routing in other embodiments is performed on successive sets of wiring layers (e.g., first on the first wiring layer 102 and then on the second wiring layer 104, or first on the first two wiring layers and then on the next two wiring layers when four or more wiring layers are available for NPD wiring in the IC design). In these embodiments, the NPD topological routes that are defined in each iteration of a detailed routing through 1010 traverse the set of wiring layers that are being routed in that iteration of the detailed routing. In addition to these layers, the NPD router in some of these embodiments also has at its disposal in each of its iteration the lower wiring layers that were routed in the previous iterations of the NPD detailed routing operations.

When the net has nodes that fall in multiple partitions, the topological routing of the NPD detailed router that defines the topological routes for each partition in some embodiments will identify an NPD topological route that traverses to the partitions boundary so that this NPD route can later be connected (i.e., stitched) to one or more NPD routes that are defined in one or more other partitions to connect to the net's node(s) in the other partition(s). This stitching in some embodiments is performed (1) by the NPD detailed routing for the next set of NPD wiring layers when multiple rounds of NPD detailed routing are performed for multiple successive sets of NPD wiring layers, (2) by the PD global and/or detailed routing that is performed after the NPD detailed routing, and/or (3) by a post-processing operation of the NPD detailed router of some embodiments.

After 1010, the process determines (at 1015) whether it should repeat its detailed topological routing operations for the identified partitions in order to improve its identified NPD topological routes in each partition and/or to resolve inconsistent partition boundary crossings that were identified by two or more NPD router instances for two or more partitions that contains nodes of the same net. In some embodiments, the NPD topological routing for each partition is intended to connect the nodes of each net that falls within the partition as much as possible with the NPD topological routes that are defined by reference to edges that tessellate the NPD wiring layers being routed. In some embodiments, these edges include the partition edges that define the partitions (e.g., the nine partitions of FIG. 11) on the NPD wiring layers. These edges in some embodiments also include edges that tessellate the interior of each partition.

In some embodiments, the topological routes are also defined by reference to nodes defined in the tessellated polygons (called faces) that are defined by the edges in each tessellated partition, as these nodes are used to represent vias to other NPD wiring layers that are being concurrently routed by the NPD detailed routing process 1000. In some embodiments, the topological detailed routing defines each topological route in terms of its position to other topological routes along the tessellated edges and face nodes. In defining these routes, the topological router accounts for the available route capacity along each tessellated edge and via capacity along each tessellated face in order to ensure that too many topological routes are not defined to traverse any location on an NPD wiring layer or any via between two routed NPD wiring layers.

Due to congestion and other issues, it might not always be possible to connect the nodes in each partition with just NPD wire segments, or it might require multiple NPD topological routing iterations to identify NPD routes to connect all such nodes (e.g., after new constraints are defined after each iteration). Moreover, two or more NPD router instances for two or more partitions that contains nodes of the same net, initially define routes separately for the nodes that fall within their respective partitions. These topological routes might result in inconsistent boundary crossings for the same net. For instance, FIG. 11 illustrates two boundary crossings 1112 and 1114 for the same net that are defined by two different detailed router instances that define NPD routes for the two neighboring partitions 1105 and 1107. These two boundary crossings are problematic as they have several other topological routes (shown with dashed lines) of several other nets between them.

When such inconsistent NPD routes exist for multiple partitions that connect nodes of one net, or when other non-optimal NPD routes are defined, the process 1000 in some embodiments determines that it has to perform an additional iteration of its NPD topological routing. As the process performs more iterations of its NPD topological routing at 1010, the process 1000 become less likely to perform another iteration of its NPD detailed routing in some embodiments. For instance, in some embodiments, each inconsistent set of NPD detailed routes or non-optimal NPD detailed routes is allocated a penalty score, and all the penalty scores are aggregated at 1010 to produce an overall penalty score. As the number of iterations through 1010 increases, the process requires a higher aggregate penalty score to exist before it performs another iteration of its NPD detailed routing.

When the process 1000 determines (at 1015) that it has to perform another iteration of its NPD topological routing, the process 1000 defines (at 1020) one or more constraints for the next iteration of the NPD topological routing at 1010. Alternatively, for this next iteration of the NPD detailed routing at 1010, the process 1000 shares information (e.g., boundary crossing information) about the different route segments that the different routers identified for the same net among the different partitions, so that the next iteration of topological routing operations can account for these other routes in defining their next set of routes. After 1020, the process returns to 1010 to perform this next iteration of routing.

FIG. 12 illustrates an example of a constraint defined at 1020. To avoid the two inconsistent boundary crossing 1112 and 1114 of the two NPD routes that are defined for the common net in FIG. 11, the process 1000 in some embodiments defines a constraint that specifies that the NPD detailed router instances for partitions 1102 and 1104 need to identify their respective routes for this net to cross a smaller region 1205 at this boundary. This smaller region ensures that the two NPD detailed router instances would be less likely to identify other NPD routes for other nets in between the two boundary crossings that they identify for the common net.

Conjunctively or alternatively to defining the constraints at 1020, the process 1000 in some embodiments has each particular NPD topological router instance that routed each particular partition in the previous iteration of 1010 share information about the topological routes that it defined with (1) each other NPD topological router instance, or (2) each NPD topological router instance that defined the topological routes for the partitions that neighbor the particular partition (e.g., for the eight partitions that neighbor the partition 1105 in FIG. 11).

In some embodiments, the information provided by each particular NPD topological router instance to another NPD topological router instance includes the entire definition of each topological route defined by the particular router instance, while in other embodiments the information includes just the partition boundary crossings (if any) of each topological route that crosses a shared partition boundary. Each NPD topological router instance then uses the information provided by the other NPD topological router instances in its next iteration through 1010. The router instance uses this information to define how the topological routes that the router instance defines in its next topological routing iteration to more closely match the probable location of the related topological routes defined by the other instances (i.e., the probable location of the other topological routes in the other partitions that have to be stitched to the topological routes being defined by the router instance in its next iteration).

When the process 1000 determines (at 1015) that it does not have to perform another iteration of its NPD detailed routing, the NPD detailed routing process 1000 uses (at 1025) a geometric detailed router to embed each defined topological route in the IC design as a geometric route. For each topological route, this embedding defines one or more geometric route segments along one or more allowable wiring directions, which in some embodiments can include one or more Manhattan and diagonal wiring directions as well as curvilinear wiring directions that are allowed on an NPD wiring layer. In some embodiments, this geometrization snaps each topological route to one or more grid locations along one or more allowed rectilinear, diagonal and curvilinear directions. After 1025, the process ends.

FIG. 13 illustrates an example of another approach of some embodiments for using route crossing data specified by one detailed router instance of a neighboring partition. In this approach, the IC design partitions are divided into two groups, a grey group and a white group, that are arranged in a checkerboard fashion. Several detailed router instances perform NPD detailed routing for the grey partitions first. The partition boundary crossings that these routers identify are then passed to the NPD detailed router instances that detailed route the white partitions next, so that the NPD routes traversing the white partitions can respect the boundary crossings identified by the detailed routers of the grey partitions. When multiple iterations are performed for the white and grey partitions, the router instances for each set of colored partitions iteratively pass their boundary crossing information to the router instances of the next set of colored partitions until the routing iterations end.

Figure 14:
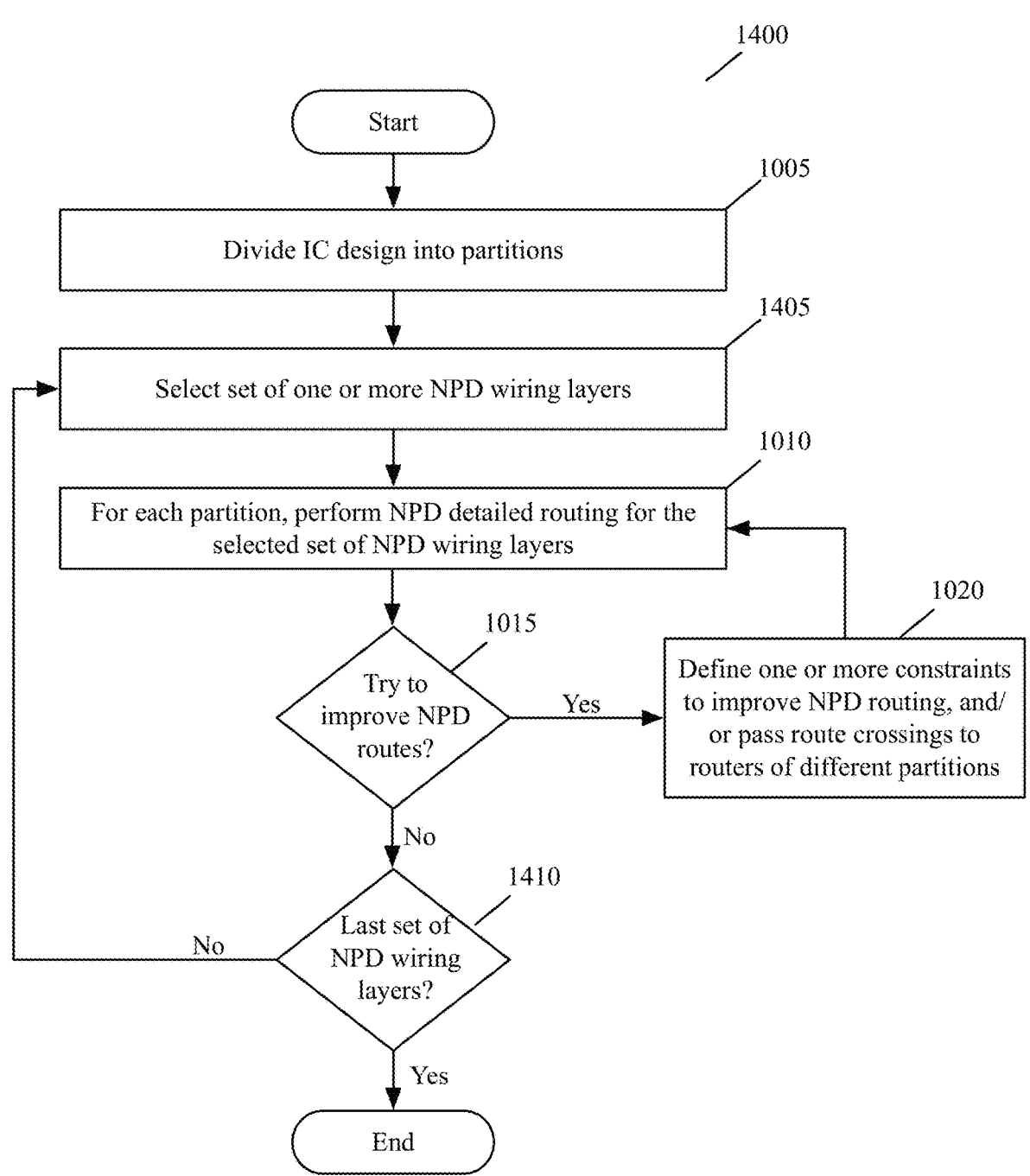
FIG. 14 illustrates another NPD detailed routing process of some embodiments.

FIG. 14 illustrates another NPD detailed routing process 1400 of some embodiments. This process 1400 is similar to the process 1000 except that it iteratively performed NPD detailed routing for different sets of one or more NPD wiring layers. To that end, the process 1400 has operations 1405 and 1410 to select successive sets of one or more NPD wiring layers for detailed routing. After selecting (at 1405) successive sets of NPD wiring layers, the process 1400 in some embodiments iteratively performs the operations 1010-1020 to identify NPD routes that traverse the selected sets of NPD wiring layers. When identifying NPD routes on the currently selected set of NPD wiring layers, the process 1400 in some embodiments also explores path search options in one or more lower wiring layers that are part of one or more previously selected set of NPD wiring layers. In other embodiments, the process 1400 does not explore previously explored lower wiring layers while identifying NPD routes on the currently selected set of NPD wiring layers.

At 1410, the process determines whether it has selected the last set of NPD wiring layers. If not, the process returns to 1405 to select the next set of NPD wiring layers and then repeats its operations until it determines in its last iteration through 1410 that it has selected the last set of NPD wiring layers. In some embodiments, the selected set of NPD wiring layers only includes one wiring layer at a time. In these embodiments, the process 1400 successively defines NPD routes for successive individual NPD wiring layers, e.g., first for the first NPD wiring layer, then for the second NPD wiring layer, then for the third NPD wiring layer, and so on. In other embodiments, the selected set of NPD wiring layers include two or more NPD wiring layers that are concurrently selected at 1405 for detailed routing.

Also, in some embodiments, the process 1400 first selects the third wiring layer as its first NPD wiring layer to route, and only explores the first and second wiring layers for connecting to pins on the substrate and for opportunistic path expansions when not finding better options on the third layer. In some of these embodiments, the process 1400 uses the first to third wiring layers for the same reasons while identifying NPD routes for the fourth NPD wiring layer.

When more than one NPD wiring layer is being routed concurrently with another NPD wiring layer, the NPD routes that are defined by the detailed router (that routes the multiple NPD wiring layers concurrently) can traverse the multiple NPD wiring layers. To traverse the different NPD wiring layers, an NPD route would use vias to connect different segments of the route on different NPD wiring layers.

Some embodiments use multibeam mask writing to enable curvilinear masks, which can then be used to produce curvilinear components on target wafers and dies. To take advantage of such mask writing and wafer production, some embodiments provide physical design EDA tools that produce curvilinear designs. One example of such physical design tools are the NPD detailed routers described above that produce curvilinear routes.

To facilitate the creation of their curvilinear designs (e.g., their curvilinear routes), the physical design EDA tools of some embodiments define their designs in the pixel domain rather than contour domain. Pixel based designs are also ideal for analyzing and producing curvilinear designs by using machine learning, because machine learning processes are often optimized to process pixel-based data sets. In fact, many machine learning applications do not process contour based descriptions of the data sets. Hence, by transforming the physical design (e.g., routing) to operate in the pixel domain instead of the contour domain, some embodiments make machine learning much more accessible for use by the physical design tools.

Similarly, to facilitate the creation of their masks, some embodiments use the pixel domain for performing the processing needed to generate their masks, because curvilinear masks manipulated in the pixel domain take the same amount of time as any Manhattan design. Also, this processing is often performed on GPUs in the pixel domain. The vast power of GPU processing power for this type of pixel manipulations is ideal because GPUs are single-instruction multiple-data (SIMD) machines that excel in the pixel domain, as a single instruction stream can be applied to a large number of pixels uniformly. The SIMD architecture can be relied upon to produce a much higher computing throughput for processing physical designs and masks with curvilinear shapes.

Contours (also called geometries) are usually expressed as piecewise linear polygons, but sometimes expressed with infinite-resolution curvilinear formats like splines. Manipulating contours is a mathematical dual of manipulating pixel based data, given a resolution limit. A mathematical dual means that, functionally, anything that can be done in one can be done in the other. However, when runtime performance or efficiency is taken into account, given a particular accuracy of result as the target, the computational behavior of one can be quite different from the other.

In general, manipulating shapes that are mostly large rectangles would be fast in contour domain (i.e., geometry domain), while manipulating shapes that are largely polygonal or curvilinear with higher vertex density would be faster in the pixel domain. In the pixel domain, pixel size is defined naturally from the resolution limit. Once pixel size is defined, it does not matter whether the shapes being processed are curvilinear or rectilinear. The computation either way is constant time. In contour based manipulation, this is not the case as computation time depends on number of edge count of the piecewise linear that are used to represent the contours. Also, given that much of the data processing these data is performed by high powered GPUs, pixel-based analysis is preferable to contour-based analysis as GPUs are SIMD machines that excel in the pixel domain.

To elaborate on these points further, a brief review of IC design and manufacturing would be helpful. In the past, EDA systems both for design and manufacturing have used Manhattan shapes, often augmented with 45 degree edges as the basic building blocks on which to compute. Manhattan shapes are shapes that have axis-parallel edges with 90 degree corners. The fundamental limit in manufacturing semiconductors with shapes other than Manhattan shapes had in the past been that all precision layers on the masks had their masks written with Variable Shaped Beam (VSB) mask writers that exposed rectangles of certain minimum (e.g., 1 nm-100 nm on a side) sizes and maximum sizes (e.g., 200-1000 nm on a side).

Since VSB writers expose the mask one rectangle at a time, the write time of a mask is approximately proportional to the number of rectangles that need to be written. Diagonals or curves can be approximated with a series of stair-stepping rectangles. But the number of rectangles would be prohibitively large, making the mask writing time prohibitively long in order to get the approximation to be accurate enough. Even including the effects of optical proximity correction (OPC) or the advanced form of OPC called inverse lithography technology (ILT), in order to target non-Manhattan shapes on wafer, non-Manhattan shapes on mask becomes necessary.

Since non-Manhattan shapes on mask, other than for very limited use, were unpractical for VSB writers, non-Manhattan shapes were unviable for semiconductor design shapes that are the wafer targets. Forty five degree triangles are an exception to the Manhattan restriction on VSB machines. This gave rise to the X-Architecture of Cadence, Inc. This architecture used 45-degree routing to reduce power consumption and to improve chip performance.

VSB data preparation techniques using overlapping shots and mask-wafer co-optimization are techniques that can be used to target effectively curvilinear shapes on mask using reasonable VSB shot counts. But such techniques are limited for practical use to 193i lithography. EUV (extreme ultraviolet) masks have larger numbers of smaller shapes that need to be written with more precision (because EUV can "see" better than 193i), so these techniques are not practically viable. Hence, with VSB mask writing, there is no general solution that enables curvilinear target designs on the wafer.

In the recent years, multibeam mask writers have become available for production use in leading mask shops around the world. Multibeam mask writers write the masks with an array of fixed sized pixels exposing the mask. Because the pixel sizes are fixed, the write time of the machine does not scale with design complexity or shapes like VSB machines do. This has enabled curvilinear masks to be practically written, just as well as Manhattan shapes. And this in turn has enabled curvilinear target design shapes on wafer.

Physical design of semiconductor chips are computer-aided either in interactive manipulation of geometries or in automatic placement and routing of designs. Either way, physical verification of designs against physical rules (such as spacing and minimum width or area rules), as well as connectivity extraction, and parasitic extraction of electrical parameters (such as resistances, capacitances and inductances) are performed on physical designs. An overwhelming majority of these capabilities today operate in the contour/geometry domain because it has been better to optimize for largely rectangular designs, in fact, largely Manhattan designs, because VSB mask writers could only reasonably write the masks to target those wafer shapes.

In contrast to these prior techniques, some embodiments of the invention use multibeam mask writing to enable curvilinear masks and therefore curvilinear design targets on wafer. To take advantage of such mask writing and wafer production, some embodiments provide physical design tools that produce curvilinear designs. Just as curvilinear designs take the same amount of time to write on multibeam machines, curvilinear masks manipulated in the pixel domain take the same amount of time as any Manhattan design.

Moreover, when the processing is performed on GPUs in the pixel domain, because of the vast power of GPU processing power for that type of pixel manipulations, where a single instruction stream can be applied to all pixels uniformly, the advantages of the SIMD architecture shines to produce a much higher computing throughput. Just as curvilinear designs would take a long time to write on VSB machines, curvilinear masks manipulated in the contour/geometry domain take much longer than a typical Manhattan design. This is because regardless of whether the contour is expressed as piecewise linear polygons of some reasonable vertex interval or as some version of a spline or a NURBS format, the required vertex count increases with increased curvature, and computational algorithms that are in the contour/geometry domain scale in their runtime based on the vertex count.

Given a particular resolution limit, there is no need to represent curvilinear shapes in the contour/geometry domain. In semiconductor manufacturing of curvilinear shapes, that resolution limit is provided by the fact that these mask are written with multibeam mask writers. Multibeam mask writers have a known pixel size that is used to print the mask. The resolution limit dictated by that pixel size is the resolution limit that can be used to determine the pixel size necessary to manipulate any semiconductor design in the pixel domain. This is the lower bound on the smallest pixel size that can possibly be required to drive the required precision achievable in the manufacturing process.

Other criteria, however, may further limit the possible resolution of the output shapes and therefore the design shapes. For example, ILT is computed with pixel doses. Some ILTs operate in the frequency domain (e.g., TrueMask ILT), but that is also representing the mask with pixel doses. Whether the resolution of the mask and therefore the wafer is limited by the mask writer's pixel size or by ILT's pixel size, or some other pixel size, it is clear that there is a physical limit to the achievable resolution of any semiconductor device. This determines the pixel size at which contour/geometry manipulation is a mathematical dual. However, runtimes of algorithms operating in pixel domain are constant regardless of shape, regardless of the amount of curvilinear content. Moreover, given GPU acceleration, pixel domain computations are massively parallelizable, which in turn reduces the overall runtime significantly.

Figure 15:
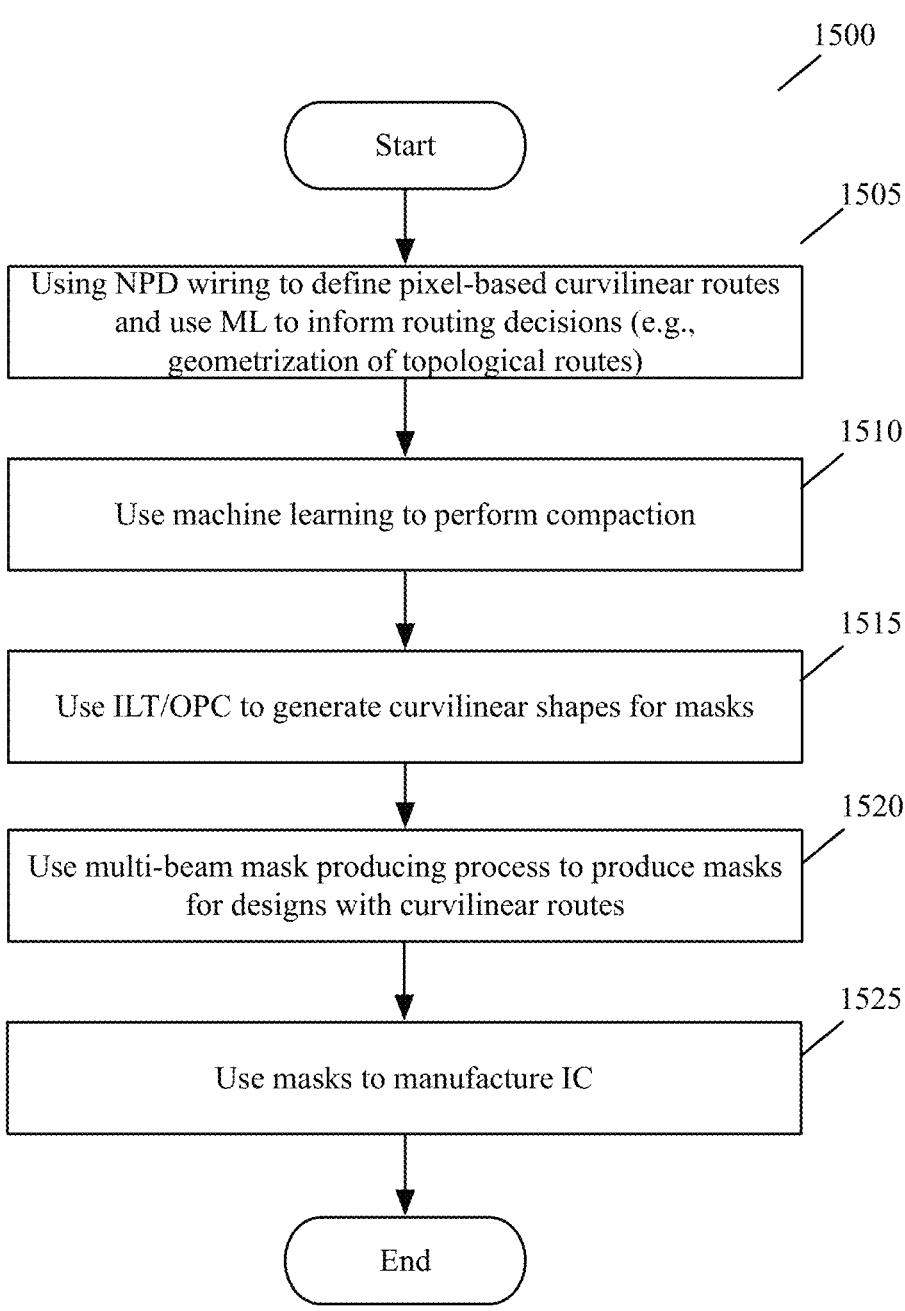
FIG. 15 illustrates a process for manufacturing ICs with curvilinear routes according to some embodiments.

FIG. 15 illustrates a process 1500 for manufacturing ICs with curvilinear routes according to some embodiments of the invention. As shown, the process starts by defining (at 1505) routes in an IC design that are defined in a pixel domain, or that are converted to the pixel domain after a routing stage. When defined in the pixel domain, each route is expressed in terms of a set of pixels occupied by the route in a three-dimensional space in which the IC design is defined. The IC design has one or more NPD wiring layers and one or more PD wiring layers in some embodiments, while the IC design only has NPD wiring layers in other embodiments. One or more routes on each NPD wiring layer can be curvilinear routes, with a curvilinear route being a route that has one or more curvilinear segments. On each NPD wiring layer, the routes can also traverse in more than eight rectilinear directions in some embodiments.

During routing (at 1505), the process 1500 in some embodiments uses machine learning to perform its routing operations. For instance, when geometrizing topological routes at 1025, the process 1000 in some embodiments uses machine learning to identify different probable manufactured wires that will be produced on the IC or the IC mask for the different possible geometrizations of the same topological route of a net, in order to evaluate the different geometrizations and select one of them as the geometric route for the net.

In some embodiments, the pixel-based definition of each possible geometric route for a net is fed to a machine trained network (e.g., neural network), which then produces the probable manufactured wires that are likely to be produced for the geometric route on an IC or the IC mask used to manufacture the IC. The different probable manufactured wires for the same net are then compared to one or more criteria (e.g., to design rule checks or capacitance extraction criteria/modeling) to determine which of the geometric routes results in the probable manufactured wire that best matches the criteria or does not violate any of the criteria.

After defining the routes, the process 1500 then performs (at 1510) a compaction operation that uses machine learning to find an optimal compaction of the routes. Several examples of such compaction operations are described in U.S. patent application Ser. No. 17/992,876, now published as U.S. Patent Publication 2023/0169246, which is incorporated herein by reference. Next, at 1515, the process 1500 uses OPC and ILT to generate curvilinear shapes for the masks. At 1520, the process then uses a multi-beam mask producing process to produce the masks for manufacturing the IC. At 1525, the process uses the masks to manufacture an IC. After 1525, the process ends.

In some embodiments, the process 1500 iterates between its operations 1505-1515 several times in order to produce an IC design with an optimal set of routes for producing acceptable masks and/or manufacturing ICs that meet desired performance characteristics. These iterations are not shown in FIG. 15 in order not to obscure the description of the process 1500 with unnecessary detail. U.S. patent application Ser. No. 16/949,270 describes iteratively performing physical design and mask manufacturing operations until an IC design with desired characteristics is identified. U.S. patent application Ser. No. 16/949,270, now issued as U.S. Pat. No. 12,372,864, is incorporated herein by reference.

As mentioned above, curvilinear wire segments can be inadvertently created on ICs that are designed to have only Manhattan or 45 degree wiring. This is because Manhattan and diagonal jogs on PD wiring layers can result in curvilinear jogs on these layers because of manufacturing limitations, i.e., because manufacturing limitations make it hard to produce 45 or 90 degree junctions.

Figures 16, 17:
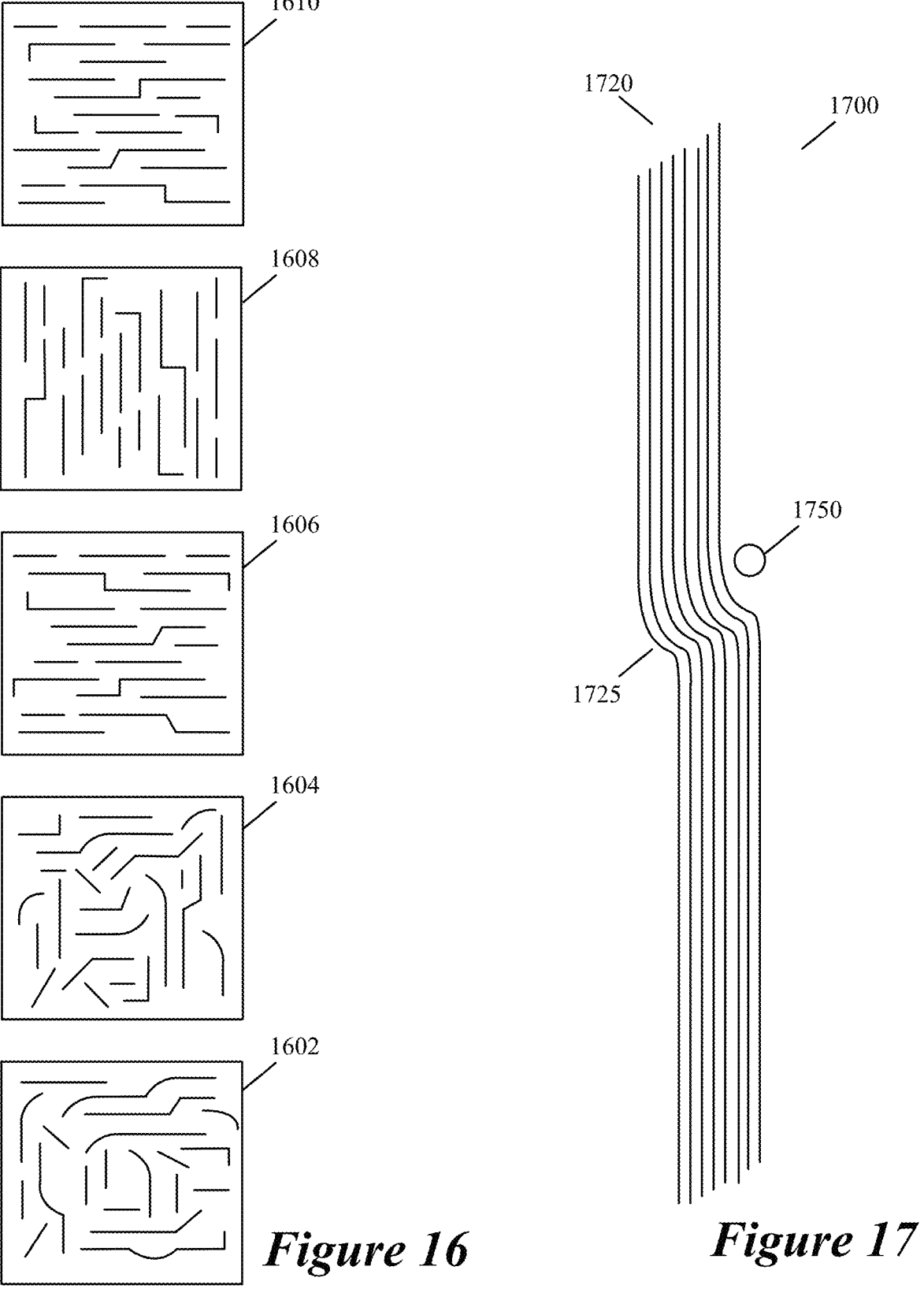
FIG. 16 illustrates an example of the five wiring layers of an IC design produced by one or more physical design tools of some embodiments.
FIG. 17 illustrates another example of a metal layer of an IC design that is defined to have curvilinear route segments.

However, the existing EDA tools today do not produce IC designs with curvilinear wiring or NPD all-angle rectilinear wiring on the wiring layers of the designs. This is because the EDA tools do not produce IC designs that are to be manufactured with manufacturing processes (e.g., mask making processes) that are created to produce curvilinear wires and NPD all-angle rectilinear wiring. FIG. 16 illustrates an example of the five wiring layers 1602-1610 of an IC design produced by one or more physical design tools (e.g., one or more routers and/or compactors) of some embodiments. The first and second wiring layers 1602 and 1604 are NPD curvilinear layers with Manhattan, diagonal and curvilinear route segments, while the third, fourth and fifth layers 1606, 1608 and 1610 are PD layers with alternating Manhattan PD layers.

The five wiring layers 1602-1610 of the IC design in some embodiments are then used to define the masks that produce the five wiring layers of the IC 100 of FIG. 2. Like the metal layers illustrated in FIG. 16, the physical design tools of some embodiments define similar sets of metal layers for the IC designs of the other ICs illustrated in the other figures (e.g., FIGS. 1-7) described above. Like their corresponding ICs, the wiring layers in the IC designs of some embodiments have routes on NPD wiring layers with rectilinear (e.g., Manhattan or diagonal direction) and curvilinear segments. The routes on these wiring layers are then used to produce masks that can then be used to produce ICs with NPD rectilinear and curvilinear wiring.

Even though the first two wiring layers 1602 and 1604 are shown to be NPD curvilinear layers, the IC designs in other embodiments have other NPD wiring layer architectures as described above. For instance, in some embodiments, the third and fourth wiring layers of the IC design are NPD wiring layers, while the first and second wiring layers have blocks of PD wiring with regions in between that are free for NPD rectilinear and curvilinear routing.

FIG. 17 illustrates another example of a metal layer 1700 of an IC design that is defined to have curvilinear route segments. This metal layer is the fourth metal layer of the IC design. As shown, the fourth metal layer 1700 has a preferred vertical wiring direction. This layer also has a bus 1720 with a set of curvilinear jogs 1725, which allow the bus to be re-positioned on the metal layer to avoid an obstacle 1750 on this layer. The curvilinear jogs 1725 allow the bus to move to the left as the bus moves from the bottom side of this layer to its top side.

Curvilinear jogs in the IC design are much more preferable to Manhattan or diagonal jogs in the IC design, as curvilinear jogs will be much closer to what will be manufactured on the IC and hence are more useful design constructs to analyze for modeling of the IC components in the design (e.g., for capacitance extraction modeling). Curvilinear jogs are also more preferable as they can be manufactured to take up the less space than horizontal or diagonal jogs that are defined in the IC design (i.e., curvilinear jogs can be produced more compactly than Manhattan or diagonal jogs).

Also, curvilinear wiring in IC designs and ICs has certain advantages to rectilinear wiring. For instance, curvilinear wire jogs have less resistance than Manhattan wire jogs as they offer a smoother path for the electrical flow. Also, as mentioned above, curvilinear jogs are more accurately modeled in the IC designs as they are closer to what will end up being produced in the ICs. Moreover, curvilinear jogs are also more reliably manufacturable than Manhattan or diagonal jogs as they are closer to what will be manufactured than the Manhattan or diagonal jogs.

Figure 19:
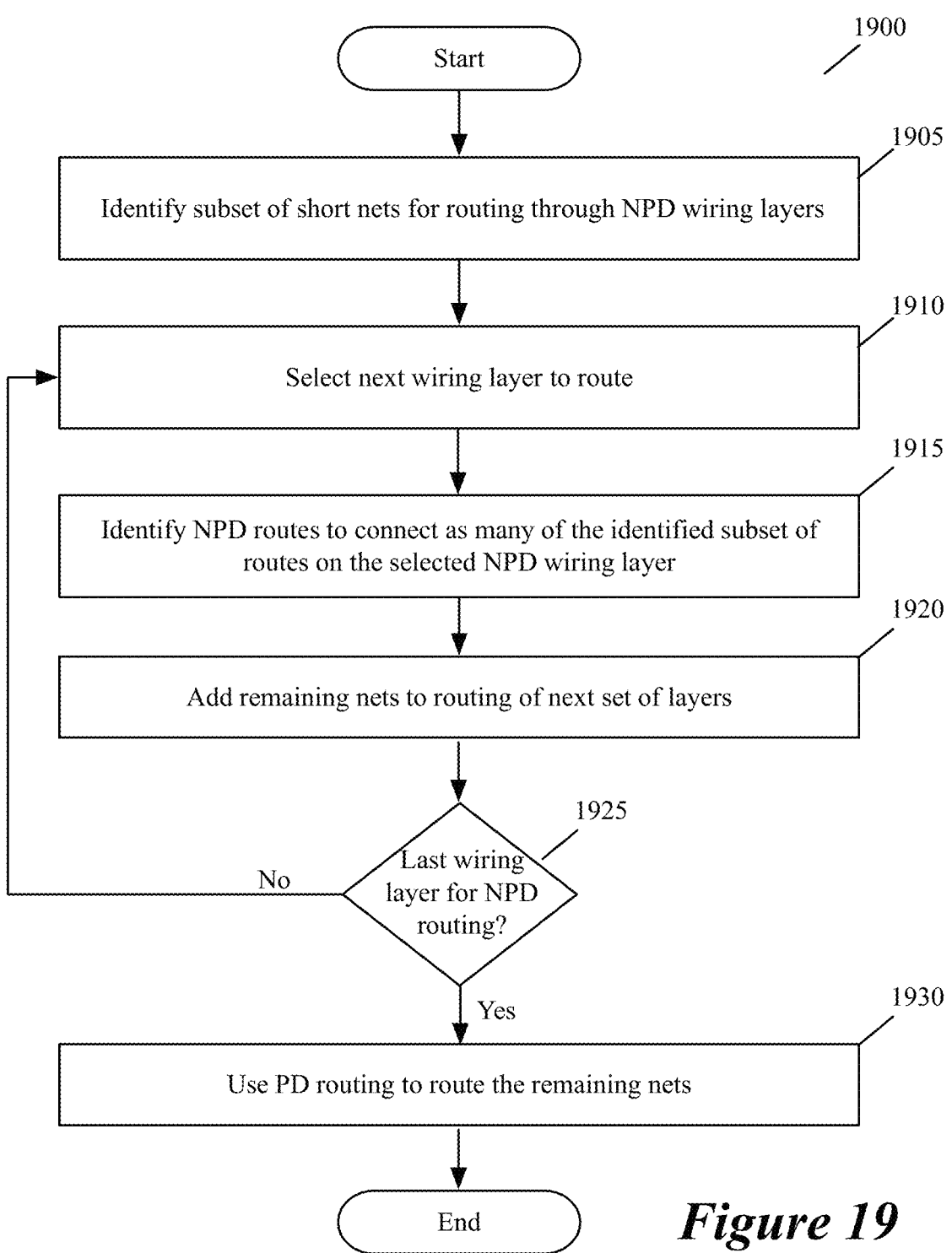

Vias can be a source of manufacturing reliability issues for ICs. As such, some embodiments use curvilinear, NPD routers that are designed to reduce the number of vias. In some embodiments, this reduction at times comes at the expense of having longer curvilinear, NPD routes on individual NPD wiring layers, but this expense is acceptable due to the reliability cost of vias and the relatively small cost of slightly longer short-net connections. FIGS. 18 and 19 illustrate examples of two routing processes 1800 and 1900 that define curvilinear, NPD routers in a way that reduces the number of vias. FIG. 19 accomplishes this by routing one NPD wiring layer at a time, while FIG. 18 does this by costing vias much more expensively than wire length.

As shown, the process 1800 of FIG. 18 initially identifies (at 1805) a subset of short nets to try to route on the NPD wiring layers of an IC design that is being routed. In some embodiments, the IC design is the design of an entire IC or a portion of the IC. Some embodiments identify "short" nets by using a heuristic to compute an estimated wire length for each net, sorting the nets based on the computed estimates, and then selecting a subset of the nets based on the sorted order. Examples of heuristics for each net in some embodiments includes the size bounding box for the net (e.g., the area of a rectangle that includes all the pins of the net), length of a Steiner tree that connects the pins of the net, etc.

Also, based on the sorted order, the process 1800 in some embodiments selects a particular percentage (e.g., 40% or 50%) of the nets for NPD, curvilinear routing (i.e., selects the particular percentage of nets that have the shortest estimated wirelength based on the sorted order), while in other embodiments, the process 1800 makes this selection based on another criteria (e.g., by selecting all the nets that have computed, estimated wirelengths smaller than a threshold estimated wirelength).

At 1810, the process 1800 selects a set of two or more wiring layers to route. In its first iteration through 1810, the process 1800 in some embodiments selects the first and second wiring layers. In some embodiments, the first and second wiring layers have regions with predefined PD wiring for connecting the electronic components and circuits of a predefined circuit block (such as an IP block). In such embodiments, the NPD router identifies NPD rectilinear and curvilinear routes in the unused spaces between the regions with PD wiring on these layers. In performing the path searches to identify such routes on the first and second wiring layers in these embodiments, the NPD router does not penalize any routing directions. After the NPD routing on one of the first two layers, more than a threshold amount (e.g., 90%) of the wires might still be along a preferred direction, such that the layer still appears as a PD wiring layer once routing is completed.

At 1815, the process 1800 performs its NPD routing operation to identify NPD routes that traverse on the NDP wiring layers selected at 1810 for as many of short nets identified at 1805 for which a route has not yet be defined. The routing operation at 1815 is biased against using vias but as mentioned above does not penalize any routing directions in order to bias the routing against any direction.

To bias against vias, the routing process 1800 in some embodiments uses a much higher cost for vias between the NPD wiring layers of the current set of layers being routed (i.e., last selected at 1810) than the wirelength cost that expresses the cost associated with the length of routes on any one of the NPD wiring layer of the current set of layers being routed. Also, the via cost between NPD wiring layers in some embodiments is higher than the via costs that are subsequently used during the PD routing at 1830 for vias between PD wiring layers or between a NPD wiring layer and a PD wiring layer.

Also, in some embodiments, the cost for vias from between two layers is a multiple of the wirelength cost for planar connections on one or both of these layers. In some of these embodiments, the cost for vias from between two NPD layers is a larger multiple of the wirelength cost for planar connections on one or both of these layers than the via cost between two PD layers or an NPD layer and a PD layer. For instance, in some of these embodiments, the via cost between two NPD wiring layers that is assessed by the NPD routing operations at 1815 is M times the wirelength cost for planar connections on one or both of the two NPD wiring layers, while the via cost between two PD wiring layers, or between an NPD wiring layer and a PD wiring layer, that is assessed by the PD routing operations at 1830 is N times the wirelength cost for planar connections on one or both of the two NPD wiring layers, where M is greater than N. In some embodiments, M is multiple times larger than N, e.g., two or three times larger or more.

This biasing against vias reduces the number of vias that the routing operation at 1815 will define between the NPD wiring layers of the current set of layers being routed. As mentioned above, this reduction in some embodiments can come at the expense of longer curvilinear, NPD routes on individual NPD wiring layers, but this expense is acceptable due to the high reliability cost of vias and the relatively small cost of slightly longer short-net connections.

Each route that is identified for each net connects the pins of the net in some embodiments. Each identified route can also be a curvilinear route that has one or more curvilinear edges, or can be a rectilinear route that only has rectilinear edges. In some embodiments, the routing operation at 1815 typically includes multiple iterations, with each iteration conjunctively routing on multiple processing nodes (e.g., processing cores of one or more multi-core processors of a computer performing the routing) for several or all partitioned regions of the IC design. When one or more short nets span multiple partitions, partition crossing locations for each such short net might have to be identified through successive iterations of the routing operation at 1815 for the same NPD wiring layer set, in order to determine where and how to stitch together route segments defined in different partitions for one.

Examples for connecting different route segments defined for one net in different partitions were provided above by reference to FIGS. 11-14. Also, as described by reference to these figures, some embodiments perform the NPD routing at 1815 by first identifying topological routes for the routed, short nets, and then geometrizing the topological routes identified for these nets. In other embodiments, the NPD routing at 1815 is purely a topological routing operation that identifies topological routes for each net, and that after the completion of the NPD routes for all the short nets (e.g., after 1825), is subsequently followed by a geometrization operation that identifies geometric routes for the identified topological routes.

After performing the routing operation at 1815 for the currently selected set of wiring layers, there may be one or more identified "short" nets for which the process 1800 has not yet identified a route. Hence, at 1820, the process 1800 adds these short nets to the list of short nets that need to be routed in the next NPD routing iteration through 1815 or in the PD routing operation of 1830. In some embodiments, the process 1800 does not need to add the unrouted short nets to the unrouted list for the NPD routing, as the process maintains only one "Nets to Be Routed" list for all of its iterations through the NPD routing operation 1815.

At 1825, the process 1800 determines whether it has selected all the available wiring layers that are available for NPD routing. If not, the process returns to 1810 to select another wiring layer set for NPD routing, and then identifies NPD routes on the newly selected wiring layer set for the remaining unrouted short nets. In some embodiment, the wiring layers that are available for NPD routing are only a subset of the wiring layers, e.g., are only layers 1-4 in some embodiments, and do not include all of the wiring layers, e.g., do not include wiring layers 5-7.

In some embodiments, the wiring layer sets selected in successive iterations for NPD routing through 1810 are not overlapping, while in other embodiments they are different sets but can overlap with one or more wiring layers in common between two sets selected in two iterations through 1810. Irrespective of whether successive selected sets of wiring layers overlap, a subsequently selected wiring layer set will include at least one higher wiring layer that was not in the earlier selected wiring layer set(s).

In some embodiments, when the process 1800 routes all or most of the short nets on a previously selected wiring layer set, the process 1800 adds to the list of "Nets to be Routed" one or more "medium" or longer length nets to be routed on the subsequently selected wiring layer set (i.e., the wiring layer set selected at 1810 after last iteration through 1825). This approach ensures that NPD routing is used as much as possible for as many nets as possible. In some embodiments, the process 1800 adds the longer nets to the "Nets to be Routed" list based on their estimated wirelengths (as computed by one of the above-described heuristics) with the nets with smaller estimated wirelengths added before the nets with the larger estimates.

When the process determines (at 1825) that it selected all the wiring layer sets that are available for NPD routing, the process then calls (at 1830) a PD router to route the remaining unrouted nets. In some of the embodiments in which the routing operation at 1815 is purely a topological routing operation, the process 1800 uses a geometric router to generate geometric routes for the topological routes defined for one or more sets of NPD wiring layers at 1815, before calling the PD router to route the remaining unrouted nets. The PD router in some embodiments treats the NPD routes defined by the process 1800 as obstacles in the routing graph, but otherwise proceeds with the routing of the unrouted nets with PD routes defined on all the wiring layers, including the NPD wiring layers routed by the NPD routing process 1800. After 1830, the process ends.

In some embodiments, the NPD routing operations 1805-1825 of the process 1800 are performed by an NPD router, while the PD routing operation 1830 is performed by a separate PD router. In other embodiments, both the NPD routing operations and the PD routing operations are performed by one router that performs NPD routing on a first set of wiring layers (e.g., layers one through four), while performing PD routing on a second set of wiring layers (e.g., layers five and above). To ensure that the NPD routing is only used for shorter nets, the routing process 1800 in some embodiments penalize NPD routes that are longer than a threshold distance or place constraints that prevents these routes from being longer than a threshold distance.

FIG. 19 illustrates an NPD routing process that reduces the number of vias between the NPD wiring layers by routing one NPD wiring layer at a time. This reduction can come at the expense of longer curvilinear, NPD routes on individual wiring layers, but this expense is acceptable due to the reliability cost of vias and the relatively small cost of longer short-net connections.

As shown, the process 1900 initially identifies (at 1905) a subset of short nets to try to NPD route on the wiring layers of an IC design that is being routed. In some embodiments, the IC design is the design of an entire IC or a portion of the IC. Some embodiments identify "short" nets by using a heuristic to compute an estimated wire length for each net, sorting the nets based on the computed estimates, and then selecting a subset of the nets based on the sorted order. Examples of such heuristics were provided above by reference to FIG. 18.

At 1910, the process 1900 selects a particular wiring layer (also called routing layer) that is the next lowest wiring layer that is available for NPD routing and that the process has not yet selected for NPD routing. In some embodiments, the process 1900 initially selects (at 1910) the first wiring layer, and in its subsequent iterations through 1910 steps through the remaining wiring layers that are available for NPD routing, e.g., steps through layers 2-4. In other embodiments, the process 1900 initially selects (at 1910) the third wiring layer, and in its subsequent iterations through 1910 steps through the remaining wiring layers that are available for NPD routing, e.g., steps through layer 4. In some embodiments, the wiring layers that are available for NPD routing are only a subset of the wiring layers, e.g., are only layers 1-4 in some embodiments, and do not include all of the wiring layers, e.g., do not include wiring layers 5-7.

Next, at 1915, the process 1900 identifies NPD routes that traverses on the wiring layer selected last at 1910 for as many of short nets identified at 1905 for which a route has not yet be defined. Each NPD route that is identified for each net connects two or more nodes (e.g., two or more pins) of the net in some embodiments. Each identified NPD route can be a curvilinear route that has one or more curvilinear edges (along with zero or more rectilinear edges), or can be a rectilinear route that only has rectilinear edges.

To identify each NPD route for each net during each iteration through 1915 that is performed for a selected particular wiring layer, the process 1900 performs a path search that identifies a path between the two or more nodes of the net that are to be connected, and then embeds the identified path as a route between the two or more nodes. This path search in some embodiments does not explore path expansions to any wiring layer above the particular NPD wiring layer in order to identify a path that traverses to a higher wiring layer and then traverses back to the particular NPD wiring layer or a lower layer. In some embodiments, this path search explores path expansions on the selected particular wiring layer and any wiring layers below the selected particular wiring layer. In other embodiments, this path search explores path expansions only on the selected particular wiring layer. In some of these embodiments, the path search for a net can identify incomplete routes for a net that terminate on via locations to higher layers. Subsequent iterations of the NPD or PD routing that are performed for the higher layers then perform path searches starting from these via locations to complete the routes for these nets in some embodiments.

These differing path search approaches of different embodiments result in different routes being defined during the routing operation at 1915 for each particular wiring layer selected at 1910. In some embodiments, the routing operation at 1915 for the selected particular wiring layer does not use vias to any higher wiring layers that it has not yet selected in any iteration through 1910, in order to identify a route that traverses to the higher layer and then traverses back down to the selected particular wiring layer or a lower layer. Also, this routing operation in some embodiments only uses vias to connect the selected particular wiring layer to the lower layers (1) on which the pins of the nets (being routed) are defined or (2) on which route segments for these nets were previously identified in previous iteration(s) through 1910 (iterations before the current iteration through 1910).

Other embodiments implement the "No Via" constraint differently. For instance, to reduce or eliminate vias to the lower wiring layers during the routing of any one particular wiring layer, the routing operations for a lower wiring layer that is below the particular wiring layer identifies via locations for traversing from the lower wiring layer to the particular wiring layer, as mentioned above. Conjunctively, or alternatively, in some embodiments, the NPD routing process 1900 at the start of the NPD routing for any one wiring layer (selected at 1910) defines expected contact locations on the selected wiring layer for connecting to lower layer pins or pin contacts. For any given pin, such an expected contact location on the selected wiring layer is directly above the pin or pin contact when there is no obstacle to the lower pin or pin contact, or is at an offset location over the lower pin or pin contact, where the offset location is connected to the pin or pin contact through wiring defined on the lower substrate and wiring layers through route segments defined by the NPD routing process 1900 before starting the NPD routing of the selected wiring layer.

In some embodiments, the routing operation at 1915 typically includes multiple iterations, with each iteration conjunctively routing on multiple processing nodes (e.g., processing cores of one or more multi-core processors of a computer performing the routing) all partitions of the IC design that is being routed by the process 1900. When one or more short nets span multiple partitions that are used to divide the routing region, partition crossing locations are identified according to one of the manners described above by reference to FIGS. 11-14 and 18.

Also, as described by reference to these figures, some embodiments perform the NPD routing at 1915 by first identifying topological routes for the routed, short nets, and then geometrizing these nets. In other embodiments, the NPD routing at 1915 is purely a topological routing operation that identifies topological routes for each net, and that after the completion of the NPD routes for all the short nets (e.g., after 1925) is followed by a geometrization operation that identifies geometric routes for the topologically identified routes.

After performing 1915 for the currently selected wiring layer (i.e., the wiring layer last selected at 1910), there may be one or more identified "short" nets for which the process 1900 has not yet identified a route. Hence, at 1920, the process 1900 adds these short nets to the list of short nets that need to be routed in the next NPD routing iteration through 1915 or in the PD routing operation of 1930. In some embodiments, the process 1900 does not need to add the unrouted short nets to the unrouted list for the NPD routing, as the process maintains only one "Nets to Be Routed" list for all of its iterations through the NPD routing operation 1915.

At 1925, the process 1900 determines whether it has selected all the wiring layers that are available for NPD routing. If not, the process returns to 1910 to select the next higher level wiring layer that is available for NPD routing, and then identifies NPD routes on the newly selected wiring layer for the remaining unrouted short nets.

In some embodiments, when the process 1900 routes all or most of the short nets on the previously selected NPD wiring layer(s), the process 1900 adds to the list of "Nets to be Routed" one or more "medium" or longer length nets to be routed on the currently selected NPD wiring layer (i.e., the NPD wiring layer selected at 1910 after last iteration through 1925). This approach ensures that NPD routing is used as much as possible for as many nets as possible. In some embodiments, the process 1900 adds the longer nets to the "Nets to be Routed" list based on their estimated wirelengths (as computed by one of the above-described heuristics) with the nets with smaller estimated wirelengths added before the nets with the larger estimates.

When the process determines (at 1925) that it selected all the wiring layers that are available for NPD routing, the process then calls (at 1930) a PD router to route the remaining unrouted nets. In some embodiments in which the routes defined at 1915 are topological routes, the process 1900 performs a geometrization operation after 1925 to define geometric routes for the topological routes, before calling the PD router to route the remaining unrouted nets. The PD router in some embodiments treats the NPD routes defined by the process 1900 as obstacles in the routing graph, but otherwise proceeds with the routing of the unrouted nets with PD routes defined on all the wiring layers, including the wiring layers that were used by the NPD router to define NPD routes. After 1930, the process ends.

In some embodiments, the NPD routing operations 1905-1925 of the process 1900 are performed by an NPD router, while the PD routing operation 1930 is performed by a separate PD router. In other embodiments, both the NPD routing operations and the PD routing operations are performed by one router that performs NPD routing on a first set of wiring layers (e.g., layers one through four), while performing PD routing on a second set of wiring layers (e.g., layers five and above). To ensure that the NPD routing is only used for shorter nets, the routing process 1900 in some embodiments penalize NPD routes that are longer than a threshold distance or place constraints that prevents these routes from being longer than a threshold distance.

By not exploring via path expansions, or limiting via path expansions to reach an unrouted net's pin or pin contact, the NPD routing process 1900 drastically reduces the number of vias that it define. This reduction in some embodiments can come at the expense of longer curvilinear, NPD routes on individual NPD wiring layers, but this expense is acceptable due to the high reliability cost of vias versus the relatively small cost of longer short-net connections.

Figure 20:
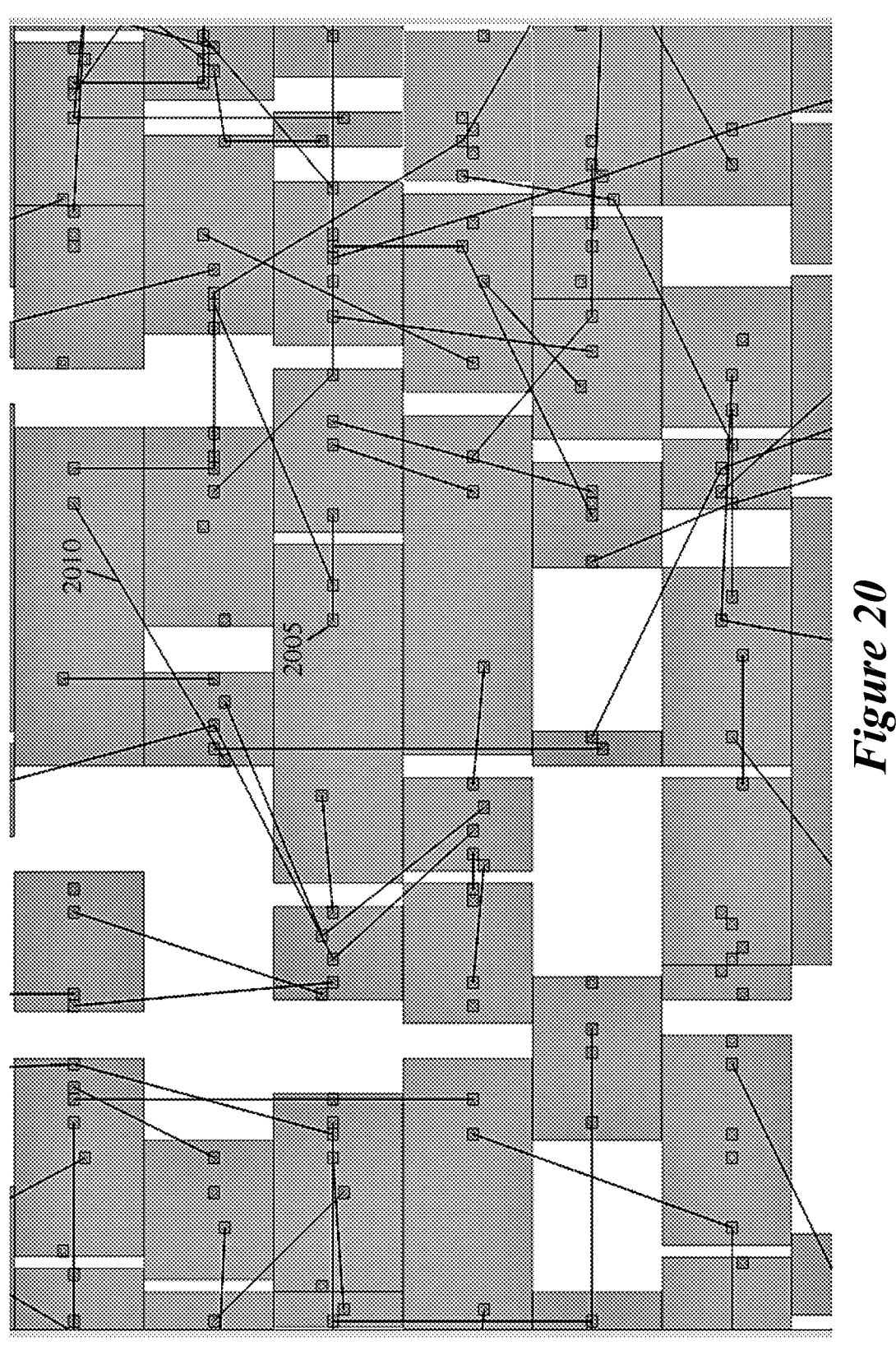
FIG. 20 illustrates an example of a set of nets that need to be connected through routes.
Figure 21:
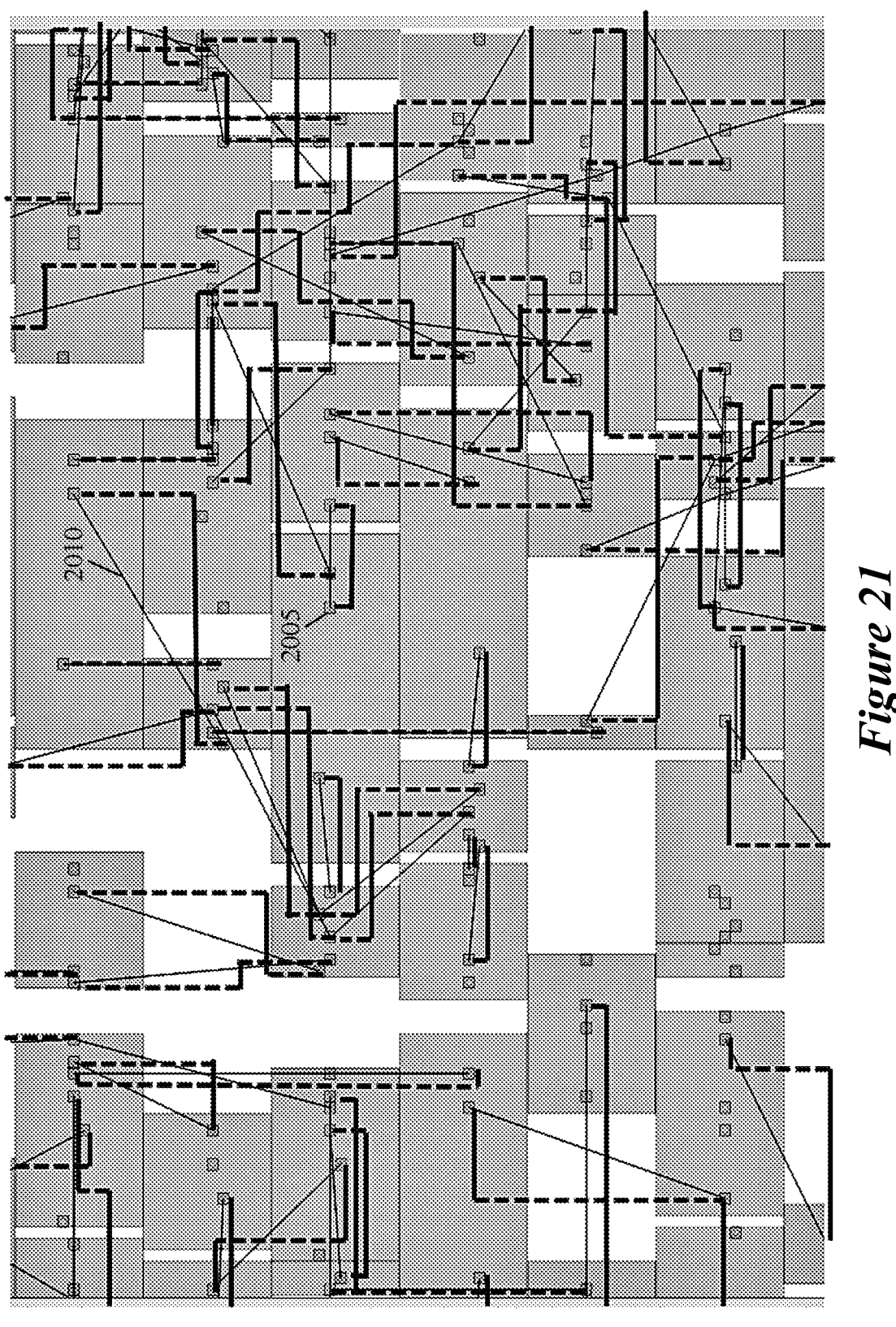
FIG. 21 illustrates an example of traditional Manhattan routes on metal layers 3 and 4 that connect the pins of each of several nets illustrated in FIG. 20.
Figure 22:
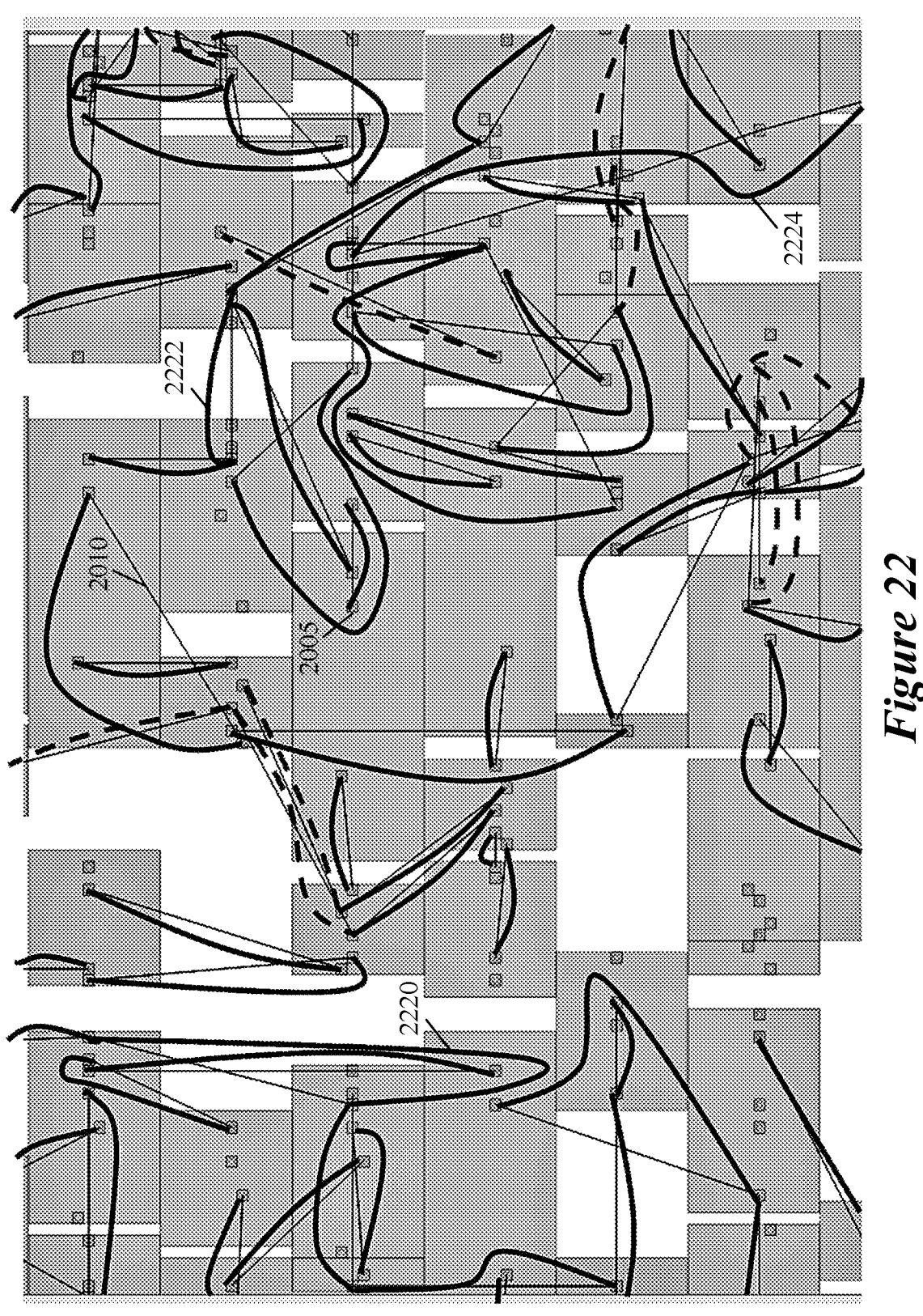
FIG. 22 illustrates an example of curvilinear, NPD routes on metal layers 3 and 4 that connect the pins of each of several nets illustrated in FIG. 20.

FIGS. 20-22 present an example that illustrates the dramatic decrease in the number of vias that is gained by using the NPD routing process 1900 of FIG. 19. FIG. 20 illustrates a set of nets that need to be connected through routes. In this figure, the pins 2005 of each net that need to be connected are linked through one or more rectilinear lines 2010. Each connected set of lines and pins effectively represents a net that needs to be connected. As mentioned above, a net in some embodiments is a collection of pins that need to be connected.

FIG. 21 illustrates traditional Manhattan routes on metal layers 3 and 4 that connect the pins of each of several nets illustrated in FIG. 20. In FIG. 21, the solid lines are on metal layer 3 with preferred horizontal direction wiring, while the dashed lines are on metal layer 4 with preferred vertical direction wiring. Each route in several of the displayed routes has one or more horizontal route segments that are defined on horizontal PD metal layer 3 and that are connected to one or more vertical route segments defined on vertical PD metal layer 4. In each such route, each pair of connected horizontal and vertical segment pairs is connected through a vias, which results a very large number (e.g., 176) of vias in FIG. 21.

FIG. 22 illustrates the curvilinear, NPD routes on metal layers 3 and 4 that connect the pins of each of several nets illustrated in FIG. 20. In FIG. 22, the solid lines are on metal layer 3 with NPD direction wiring, while the dashed lines are on metal layer 4 with NPD direction wiring. Each NPD route has one or more curvilinear route segments that are defined on one or two curvilinear NPD wiring layers. In each such route, the NPD route only uses vias to get to the NPD wiring layer on which the route is defined from the pins connected to the route, and does not use a via to connect a solid route segment on layer 3 with a dashed route segment on layer 4. This approach results in a dramatically smaller number (e.g., 20) of vias in FIG. 22. This approach comes at the expense of some of the NPD routes on a given NPD layer having slightly longer lengths, especially when going around obstacles on an NPD layer. Examples of such longer length NPD routes (that are longer to go around obstacles) include NPD routes 2220, 2222, and 2224.

Also, in the example of FIG. 22, most of the NPD routes are defined on the third metal layer (i.e., most of the routes are in displayed with solid lines). This is because tolerating longer curvilinear wires on one NPD wiring layer while avoiding vias to the other NPD wiring layer, allows most of the routes to be defined on just one NPD wiring layer. The longer length of the curvilinear routes on metal layer 3 can be tolerated as these routes are still relatively short (i.e., do not require buffering) and avoid vias, which are sub-optimal from a manufacturing point of view. This approach also consumes less area on metal layer 4, which now can be used to define NPD wiring for some of the medium sized nets.

Figure 23:
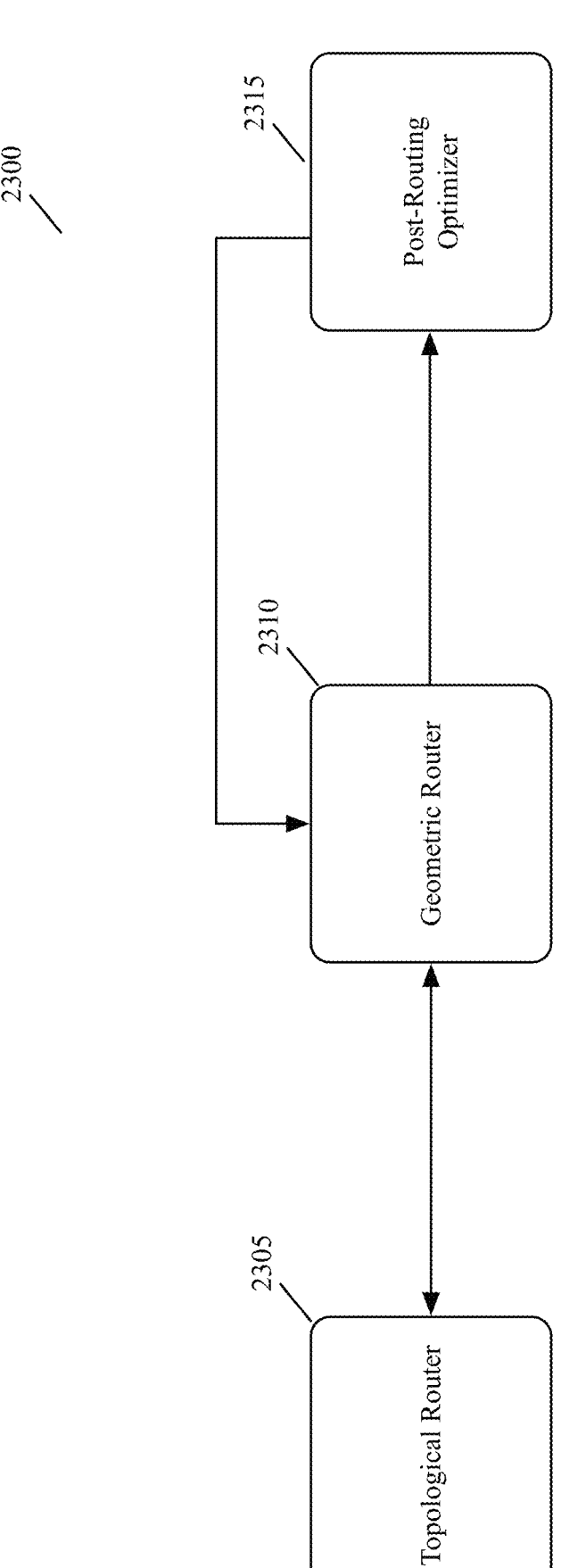
FIG. 23 illustrates an example of an NPD router of some embodiments.

FIG. 23 illustrates an NPD router 2300 of some embodiments. As shown, the NPD router 2300 includes a topological router 2305, a geometric router 2310 and a post-routing optimizer 2315. The topological router 2305 in some embodiments tessellates each NPD wiring layer or a partition of each such layer of the IC design into several polygons (also called faces), and then defines topological routes (to connect nets) by reference to the edges of the tessellated layers.

A particular topological route has its position defined in terms of its relative position with respect to other topological routes along the edges crossed by the particular topological route. Some embodiments also use nodes associated with faces of the polygons to model vias between NPD wiring layers traversed by topological routes. In these embodiments, the topological routes are defined by not only the edge but also the face nodes and their relative position with respect to each other by reference to these edges and face nodes. In some embodiments, each particular topological route is also defined by the coordinates of a pair of nodes (of the netlist) connected by the topological route, or just by reference to the pair of nodes as the starting and ending point of the topological route.

The geometric router 2310 in some embodiments defines a geometric realization for each topological route defined by the topological router 2305. In some embodiments, the geometric router snaps each topological route to a grid (imposed on the wiring layers) along the allowed wiring directions for the layer. In the embodiments that allow curvilinear segments, this snapping allows for wire segments to be curvilinear. To generate the geometric realization of a topological route, the geometric router 2310 in some embodiments explores rectilinear and curvilinear realization of edges in the topological route and thereby produces rectilinear and curvilinear edges.

In some embodiments, the geometric router 2310 specifies specific spacing between the routes as it defines specific geometric coordinates for the geometric routes that it defines, while the topological router 2305 does not specify specific geometric coordinates for the topological routes that it defines. However, in some embodiments, the topological router accounts for expected wire thickness of the topological routes in order to keep track of congestion along the tessellated edges.

The post-routing optimizer 2315 tries to improve the geometric routes produced by the geometric router 2310 based on one or more optimization criteria. In improving a geometric route, the post-routing optimizer in some embodiments can move one or more edges of the geometric route, and/or further define the geometric route by providing additional edges in the geometric route or combining some edges in the geometric route.

In some embodiments, the optimizer 2315 is a compactor that defines a more tight compaction of the geometric route. The optimization criteria in this instance reducing the size of the IC design. In other embodiments, the optimization criteria includes timing criteria or spacing criteria that directs the optimizer 2315 to more evenly space the geometric routes produced by the geometric router 2310 to improve the timing performance of the signals traversing interconnect that is produced based on these routes.

A more even distribution of the geometric routes will lead to a reduction in parasitic capacitance due to proximity of interconnect lines that are produced based on the geometric routes. In other words, more evenly spacing the routes reduce the parasitic capacitive load on the wires, which in turn, reduces signal delay due to parasitic capacitance. In still other embodiments, the post-routing optimizer 2315 tries to modify the geometric routes based on other criterion and/or based on multiple criteria.

As shown, the NPD router 2300 has a feedback loop from the post-routing optimizer 2315 to the geometric router 2310. The optimizer 2315 uses this feedback loop when it directs the geometric router 2310 to identify a better set of one or more geometric routers for one or more nets in the IC design or partition being routed when the optimizer determines that this set of routes has sub-optimal performance (e.g., has too much capacitive load, or is too long to meet timing constraints). The post-routing optimizer 2315 in some embodiments can direct the geometric router 2310 to identify better sets of routes in multiple iterations until the optimal set of geometric routes are identified for a set of nets.

In some embodiments, the geometric router 2310 only defines an initial geometric route for each topological route, and leaves the final definition of the geometric route for post-routing optimizer 2315, which then defines the specific geometric routes based on one or more criteria, such as compacting the design to reduce the overall die size, or spreading the routes to reduce the capacitive coupling between nearby wires. For instance, in some embodiments, a topological route does not have any width or specific coordinates for its segments, other than the coordinates of the two nodes (e.g., two pins) connected by the topological route.

Instead of snapping each topological route to a grid, the geometric router in some embodiments defines a width for each topological route, and then leaves it to a subsequent compactor to geometrize fully the route (e.g., to produce a full geometric definition of the route). In some such embodiments, the geometric router defines for each topological route some intermediate coordinates for the route so that the geometric route that it produces for the topological route not only has some width but also has one or more intermediate coordinates that define two or more route segments. Based on a set of one or more criteria, the post-routing optimizer 2315 then defines the specific geometric routes. In some embodiments, the post-routing optimizer 2315 comprises a compactor that uses a machine-trained network to improve geometric routes produced by the geometric router. The above-incorporated U.S. patent application Ser. No. 17/992, 876 describes several examples of compactors that use machine-trained network to improve routes in IC designs.

Figure 24:
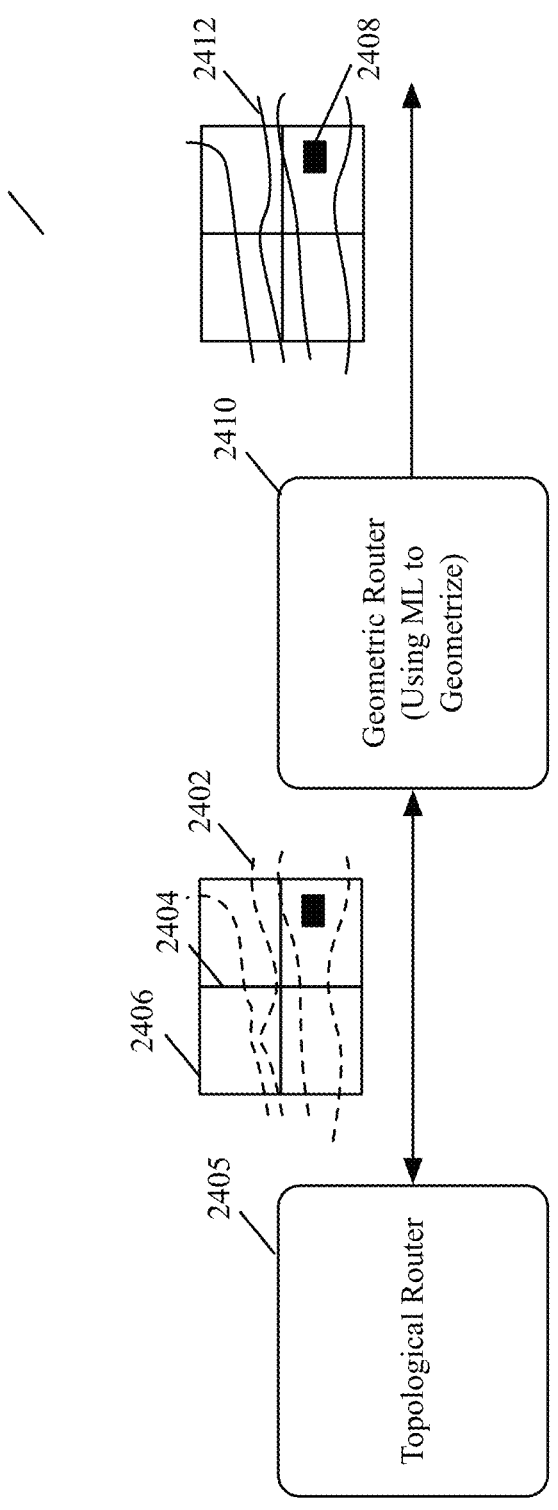
FIG. 24 illustrates an example of a geometric router in some embodiments that uses a machine learning engine to identify geometric routes for a set of nets for which a topological router identifies topological routes.

FIG. 24 illustrates an NPD router 2400 of some embodiments that has a geometric router 2410 with a machine learning engine (e.g., a machine-trained neural network) that identifies geometric routes for a set of nets for which a topological router 2405 of the NPD router 2400 identifies topological routes. This figure shows the topological router 2405 providing a set of topological routes 2402 that it identifies for a set of nets on an NPD wiring layer. Each topological route is defined by reference to edges 2404 of rectangular grid cells 2406 that tessellate a partition of an NPD wiring layer. In this example, four grid cells 2406 are shown that include four topological routes 2402 two of which go around an obstacle 2408 in one of the cells. When more than one topological route crosses an edge, each topological route's crossing of that edge is defined with respect to where any other topological route crosses that same edge, e.g., one route's edge crossing is identified as being between one vertex of the edge and another route's edge crossing.

FIG. 24 also shows the geometric router 2410 produces four geometric routes 2412 for the four topological routes 2402. In some embodiments, each geometric route is defined by specific geometric coordinates associated with the pixels that define each geometric route. In some embodiments, the geometric router 2410 uses a machine-trained neural network that as input takes the topological routes (e.g., the edge crossings of each topological route) and produces as output the geometric routes corresponding to the input topological routes. Also, in some embodiments, the geometric routes produced by the geometric router are routes that mimic the expected manufactured shapes of the routes.

In some embodiments, the neurons of the neural network are trained by using numerous previously computed training sets with each set including a pair of input topological routes and their corresponding output geometric routes that were computed by a geometric router that used one of the known EDA techniques to geometrize the topological routes (e.g., by snapping the topological routes to a grid). The output geometric routes in some embodiments are the manufactured shapes of the geometric routes, which in some embodiments are produced by examining actual interconnect shapes after the manufacturing, while in other embodiments are produced by passing each training set geometric route through a machine-trained network that produces expected manufactured shape of the geometric route. Several of the training sets also include obstacles that are defined in the region traversed by the topological and geometric routes.

During training, the topological route of each training pair is fed through the neural network to produce an output geometric route, which is then compared to the training pair's geometric route to produce a difference value. The difference values for several training pairs are then used to compute a loss function value, which is then back propagated through the neural network to re-configure the trainable parameters of the neural network.

In some embodiments, multiple instances of the NPD router concurrently define routes for multiple partitions of one NPD wiring layer of an IC design. For instance, in some of these embodiments, each instance of the topological router (that defines topological routes for one partition) of the NPD router tessellates its partition into several (e.g., 16, 32, 50, 100, 128, 256) rectangular cells, and then defines its topological routes by reference to the edges of these cells that are crossed by the topological routes. To geometrize each of the topological routes identified by its topological router instance, the geometric router instance in some of these embodiments iteratively (1) selects different sets of neighboring rectangular cells and (2) uses its machine-trained neural network to geometrize the portion of the topological routes that pass through the selected sets of neighboring rectangular cells.

Figure 25:
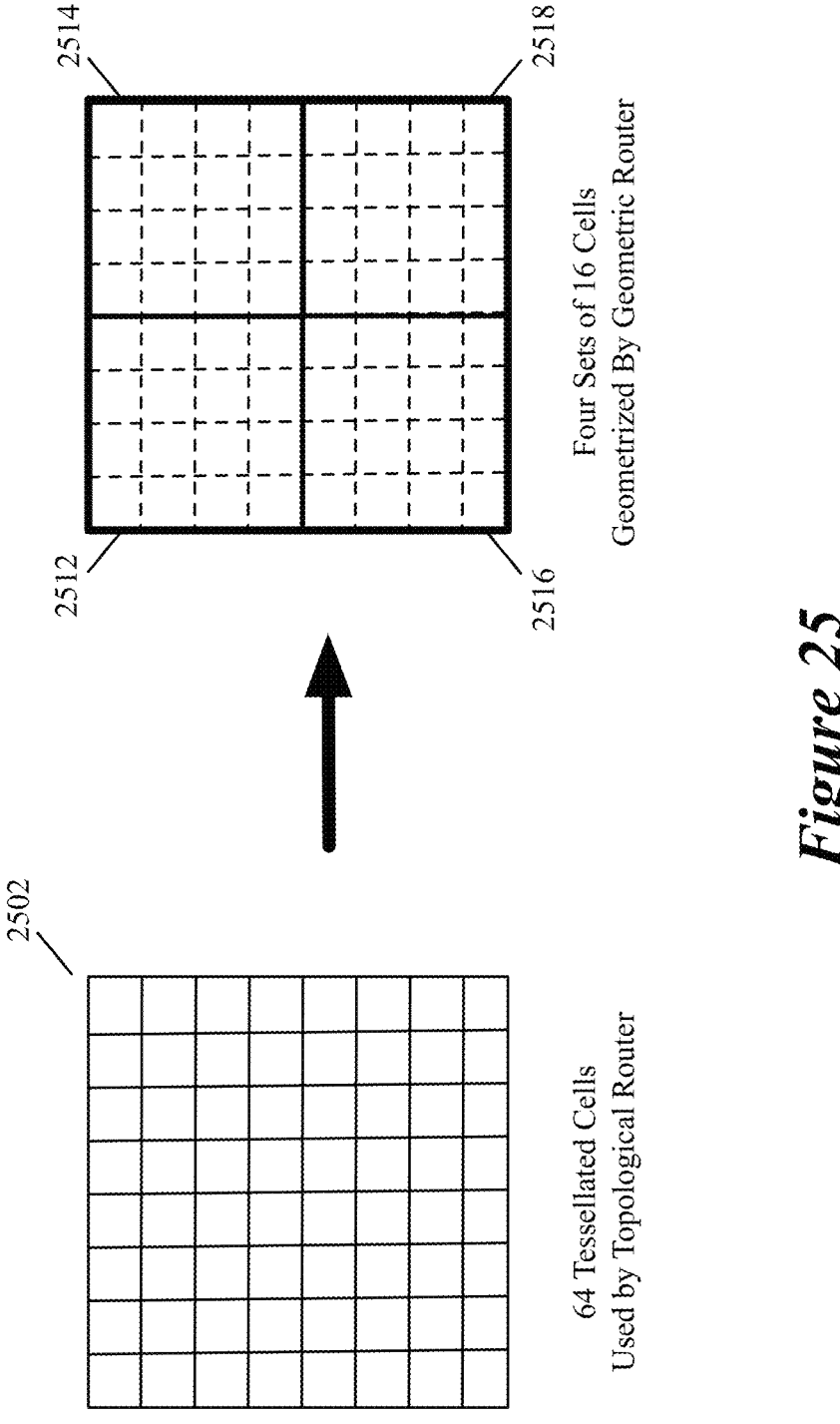
FIG. 25 illustrates an example of a topological router that tessellates a partition into 64 rectangular cells, which it then uses to define topological routes.

For instance, FIG. 25 illustrates an example when the topological router 2405 tessellates a partition into 64 rectangular cells 2502, which it then uses to define topological routes. This figure also shows the geometric router 2410 in some embodiments using its machine-trained neural network four times to geometrize the topological routes passing first through the top-left sixteen cells 2512, the top-right sixteen cells 2514, the bottom-left sixteen cells 2516 and the bottom-right sixteen cells 2518. In some embodiments, the topological router 2405 tessellates the partition that it is routing into many more cells than 64.

Some embodiments concurrently execute multiple instances of the NPD router on multiple processing cores of a computer, in order to define routes for multiple partitions of one NPD wiring layer or a set of two or more NPD wiring layers of an IC design. This approach allows the data computed for each partition by each NPD router instance to be shared with another NPD router instance, which needs access to this data when performing multiple iterations of its routing operations that rely upon data computed by other NPD router instances. The NPD router instances can share data through messaging or through a common memory that they share.

For instance, for an Nth iteration of its routing operation, a first NPD router instance that defines the topological routes for a first cell needs to know about the topological routes computed by a second NPD router instances that defines the topological routes for a second cell that neighbors the first cell, when the first and second NPD router instances respectively compute first and second route segments of at least one net's topological route that traverses the first and second cells.

In such a case, the first NPD router instance would need to know about where the second topological route segment (computed for a particular net by the second NPD router instance) crosses a shared edge between the first and second cells. This knowledge allows the first NPD router instance to ensure that it does not define a conflicting edge-crossing location for the first topological route segment that it computes across the same edge for the particular net. It should be noted that typically short nets will fall in one or two neighboring partitions, which results in their routes traversing only one to three partitions, with the case of three partitions typically involving a net that has pins in two diagonally adjacent partitions for which the route would need to traverse to another horizontally/vertically adjacent partition to reach the neighboring diagonal partition.

Figure 26:
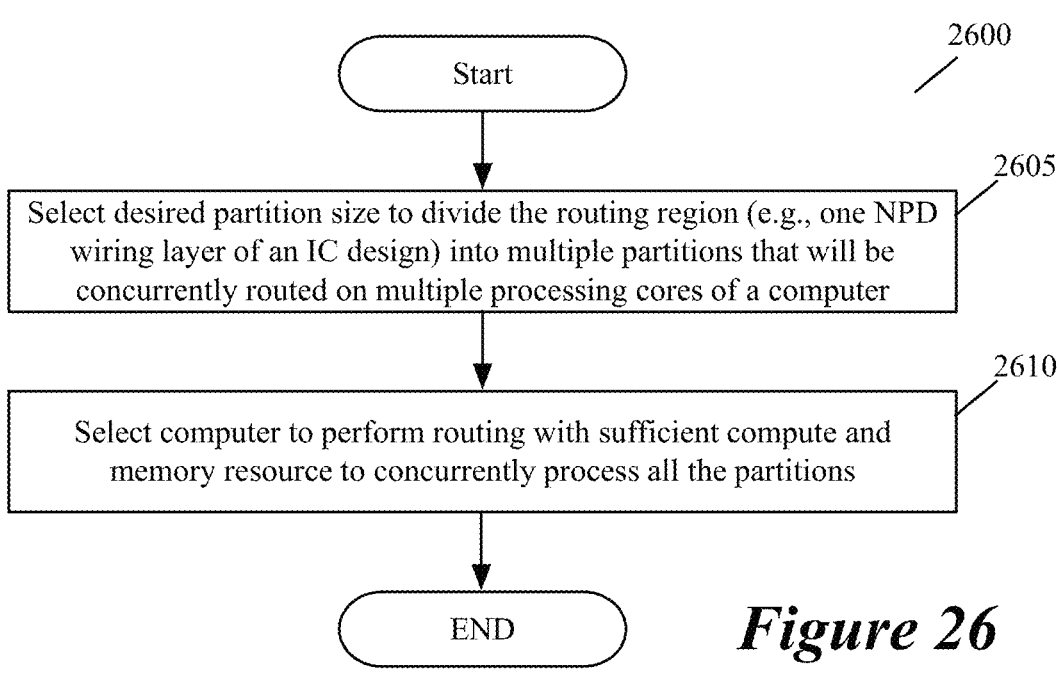
FIGS. 26 and 27 illustrate two alternative processes for defining a partition size that is related to the amount of compute and memory resources of a computer.
Figure 27:
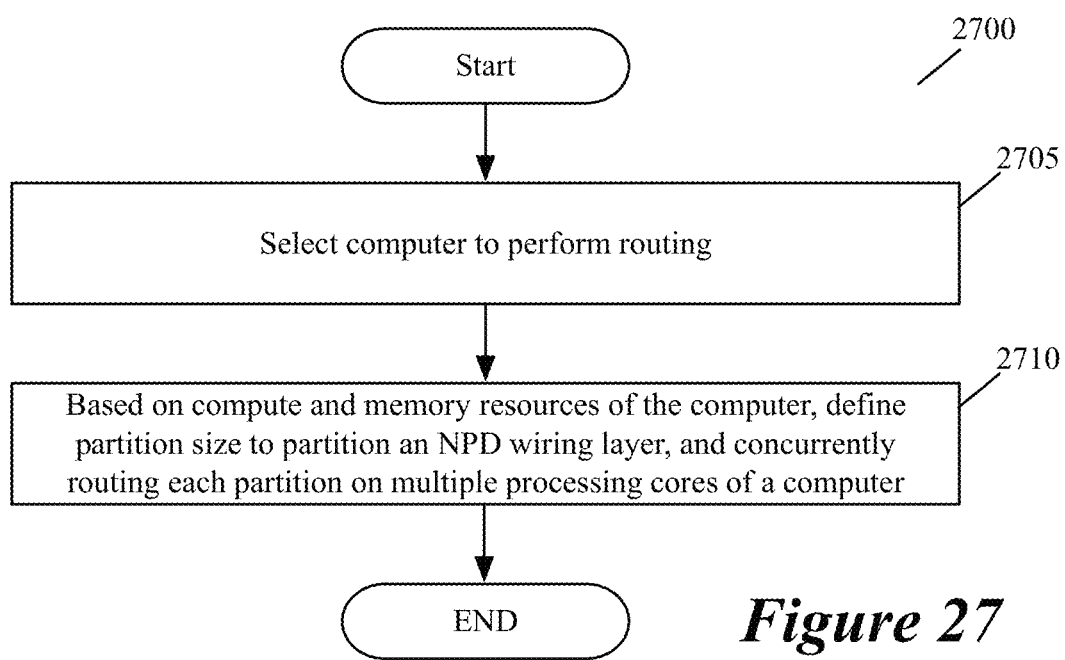

In some embodiments, the size of the partitions used to divide an NPD wiring layer or a set of two or more NPD wiring layers that are concurrently routed by an NPD router, is related to the amount of compute and memory resources of a computer that is used to perform concurrent NPD routing of some or all of the partitions. FIGS. 26 and 27 illustrate two alternative processes 2600 and 2700 for defining a partition size that is related to the amount of compute and memory resources of a computer. In these examples, multiple NPD routers concurrently define NPD routes (e.g., topological NPD routes) for some or all of the partitions that are used to divide one NPD wiring layer, or a set of two or more NPD wiring layers, that is being routed.

The process 2600 of FIG. 26 first selects (at 2605) the desired partition size to divide the routing region (e.g., an NPD wiring layer of an IC design) into multiple partitions that will be concurrently routed on multiple processing cores of a computer. The process 2600 then selects a computer that has sufficient amount of compute and memory resources (e.g., the number of cores and the amount of cache or RAM memory) to concurrently process the NPD routing (e.g., the topological routing) of all the partitions on the multiple NPD router instances that concurrently run and share their data in a common memory.

In some embodiments, the NPD router instances do not share memory but communicate data regarding their respective routing of neighboring partitions through messaging or some other mechanism. Also, in some embodiments, each NPD router instance is allocated enough memory to allow the data that the router instance computes in each iteration of its routing for a partition to remain in memory (as opposed to moving the data first to disk and then back to memory) for the router instance to use in its next iteration of its routing operation.

The process 270 of FIG. 27, on the other hand, first selects (at 2705) the computer that will execute the multiple NPD router instances that concurrently execute to route some or all of the partitions of the routing region (e.g., an NPD wiring layer of an IC design). This computer has a particular amount of compute and memory resources (e.g., a particular number of cores and amount of cache or RAM memory), based on which the process 2700 then specifies the desired partition size to divide the routing region into several partitions that will be concurrently routed on the multiple processing cores of the computer.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wire connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 28:
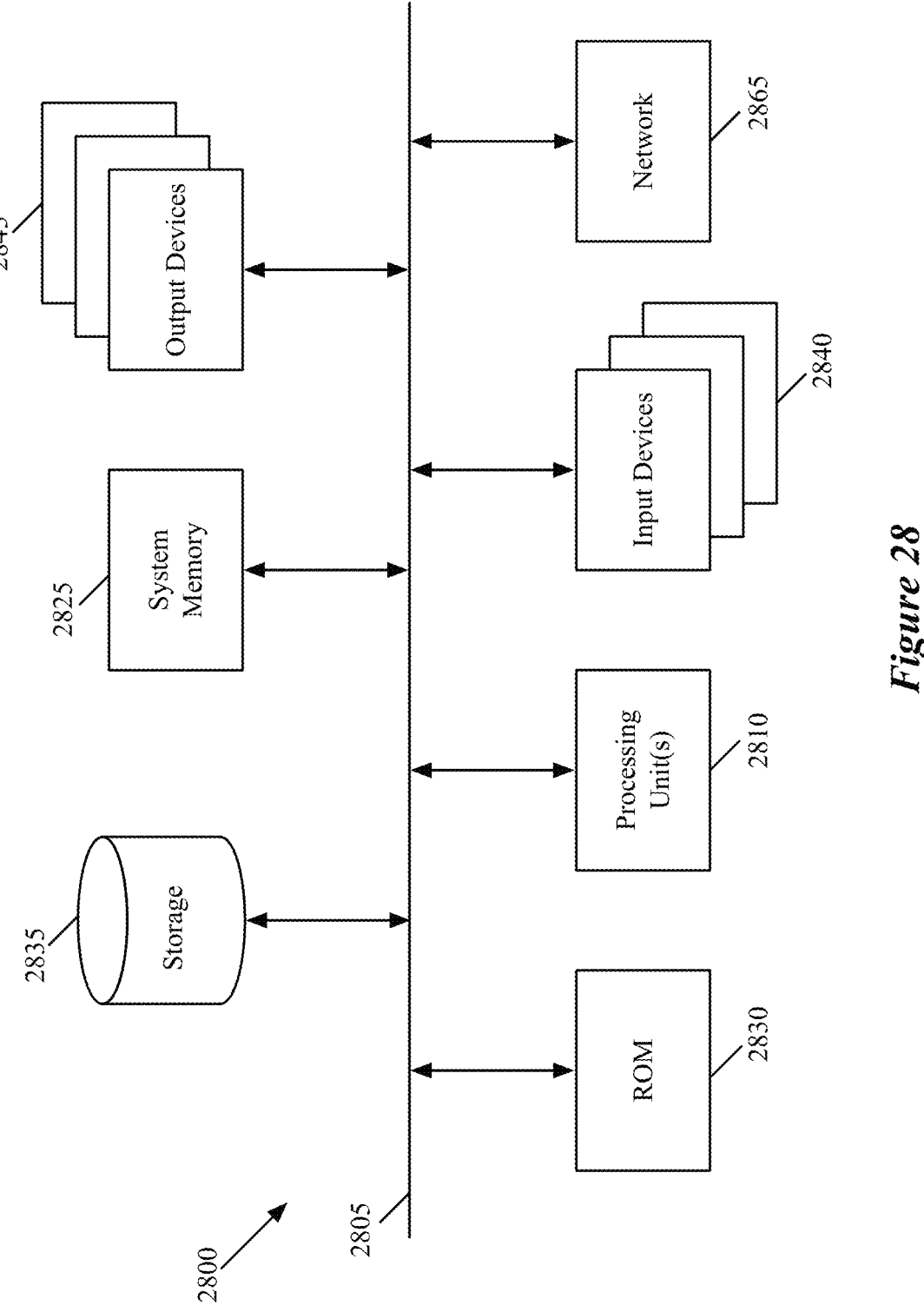
FIG. 28 conceptually illustrates an electronic system with which some embodiments of the invention are implemented.

FIG. 28 conceptually illustrates an electronic system 2800 with which some embodiments of the invention are implemented. The electronic system 2800 may be a computer (e.g., a desktop computer, personal computer, tablet computer, server computer, mainframe, a blade computer etc.), or any other sort of electronic device. As shown, the electronic system includes various types of computer readable media and interfaces for various other types of computer readable media. Specifically, the electronic system 2800 includes a bus 2805, processing unit(s) 2810, a system memory 2825, a read-only memory 2830, a permanent storage device 2835, input devices 2840, and output devices 2845.

The bus 2805 collectively represents all system, peripheral, and chipset buses that communicatively connect the numerous internal devices of the electronic system 2800. For instance, the bus 2805 communicatively connects the processing unit(s) 2810 with the read-only memory (ROM) 2830, the system memory 2825, and the permanent storage device 2835. From these various memory units, the processing unit(s) 2810 retrieve instructions to execute and data to process in order to execute the processes of the invention. The processing unit(s) may be a single processor or a multi-core processor in different embodiments.

The ROM 2830 stores static data and instructions that are needed by the processing unit(s) 2810 and other modules of the electronic system. The permanent storage device 2835, on the other hand, is a read-and-write memory device. This device is a non-volatile memory unit that stores instructions and data even when the electronic system 2800 is off. Some embodiments of the invention use a mass-storage device (such as a magnetic or optical disk and its corresponding disk drive) as the permanent storage device 2835.

Other embodiments use a removable storage device (such as a floppy disk, flash drive, etc.) as the permanent storage device. Like the permanent storage device 2835, the system memory 2825 is a read-and-write memory device. However, unlike storage device 2835, the system memory is a volatile read-and-write memory, such a random access memory. The system memory stores some of the instructions and data that the processor needs at runtime. In some embodiments, the invention's processes are stored in the system memory 2825, the permanent storage device 2835, and/or the read-only memory 2830. From these various memory units, the processing unit(s) 2810 retrieve instructions to execute and data to process in order to execute the processes of some embodiments.

The bus 2805 also connects to the input and output devices 2840 and 2845. The input devices enable the user to communicate information and select commands to the electronic system. The input devices 2840 include alphanumeric keyboards and pointing devices (also called "cursor control devices"). The output devices 2845 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 28, bus 2805 also couples electronic system 2800 to a network 2865 through a network adapter (not shown). In this manner, the computer can be a part of a network of computers (such as a local area network ("LAN"), a wide area network ("WAN"), or an Intranet, or a network of networks, such as the Internet. Any or all components of electronic system 2800 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. For instance, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Therefore, one of ordinary skill in the art would understand that the invention is not to be limited by the foregoing illustrative details, but rather is to be defined by the appended claims.

The invention claimed is:

1. A method of designing an integrated circuit (IC), the method comprising:
   using a first router to define a first plurality of curvilinear routes each of which traverses one or more routing layers in a first plurality of routing layers of the IC to connect at least two nodes of the IC, wherein in defining each curvilinear route the first router ensures that each curvilinear route that the first router defines is not longer than a threshold distance; and
   using a second router to define a second plurality of preferred direction, rectilinear routes each of which traverses one or more routing layers in a second plurality of routing layers to connect at least two nodes of the IC.

2. The method of claim 1, wherein the second plurality of routing layers has at least first and second routing layers with first and second preferred routing directions respectively.

3. The method of claim 2, wherein each preferred routing direction is a horizontal direction or a vertical direction, and the preferred routing directions of different adjacent layers in the second plurality of layers alternate between horizontal and vertical directions.

4. The method of claim 2, wherein each preferred routing direction is a horizontal direction, a vertical direction, or a diagonal direction, and the preferred routing directions of different adjacent layers in the second plurality of layers alternate between horizontal, vertical and diagonal directions.

5. The method of claim 2, wherein a preferred routing direction on each layer in the second plurality of layers is the direction that includes at least a threshold percentage of the route segments on that layer.

6. The method of claim 5, wherein the threshold percentage is 90% or larger.

7. The method of claim 1, wherein:
   the second plurality of rectilinear routes are for a first set of nets and each rectilinear route in the second plurality of rectilinear routes is longer than the threshold distance;
   the method further comprises using the second router to define a third plurality of preferred direction, rectilinear routes for a second set of nets that comprise a plurality of nets each of which the first router could not connect through a route traversing the first plurality of routing layers; and
   each of rectilinear route in the third plurality of rectilinear routes traverses one or more routing layers in the second plurality of routing layers to connect at least two nodes of the IC and is shorter than the threshold distance.

8. The method of claim 1, wherein the first router penalizes routes that are longer than the threshold distance to bias against defining routes longer than the threshold distance.

9. The method of claim 1, wherein the first router uses a constraint that prevents the routes defined by the first router from being longer than the threshold distance.

10. The method of claim 1 further comprising using the first router to define a third plurality of rectilinear routes traversing the first plurality of routing layers to connect a third plurality of nodes of the IC.

11. The method of claim 10, wherein each rectilinear route traversing the first plurality of routing layers is not longer than the threshold distance.

12. The method of claim 11, wherein no route produced by the second router is a curvilinear route with at least one curvilinear segment.

13. The method of claim 11, wherein the nodes connected by each route include nodes on a substrate of the IC.

14. The method of claim 1, wherein the nodes connected by each route include at least one node on a routing layer of the IC.

15. The method of claim 1, wherein the first plurality of routing layers includes routing layers 3 and 4, and the second plurality of routing layers includes routing layers 5 and 6.

16. The method of claim 1, wherein the second plurality of routing layers includes routing layers 1 and 2.

17. The method of claim 1, wherein the first plurality of routing layers includes routing layers 1 and 2.

18. The method of claim 17, wherein the routing layers 1 and 2 each has a plurality of regions with preferred direction rectilinear routes for pre-defined IP (intellectual property) circuit blocks, and using the first router comprises using the first router to define a plurality of curvilinear route segments on the routing layers 1 and 2 between the regions with the preferred direction rectilinear routes for the IP circuit blocks.

19. A non-transitory machine readable medium storing a program that when executed by at least one processing unit designs an integrated circuit (IC), the program comprising sets of instructions for:

using a first router to define a first plurality of curvilinear routes each of which traverses one or more routing layers in a first plurality of routing layers of the IC to connect at least two nodes of the IC, wherein in defining each curvilinear route the first router ensures that each curvilinear route that the first router defines is not longer than a threshold distance; and using a second router to define a second plurality of preferred direction, rectilinear routes each of which traverses one or more routing layers in a second plurality of routing layers to connect at least two nodes of the IC.

* * * * *